(12) United States Patent
Ho et al.

(10) Patent No.: US 11,735,854 B2
(45) Date of Patent: Aug. 22, 2023

(54) ELECTRICAL CONNECTOR

(71) Applicant: LOTES CO., LTD, Keelung (TW)

(72) Inventors: Chien Chih Ho, Keelung (TW); Wen Chang Chang, Keelung (TW); Zuo Feng Jin, Keelung (TW); Chang Wei Huang, Keelung (TW)

(73) Assignee: LOTES CO., LTD, Keelung (TW)

( * ) Notice: Subject to any disclaimer, the term of this patent is extended or adjusted under 35 U.S.C. 154(b) by 33 days.

(21) Appl. No.: 17/552,447

(22) Filed: Dec. 16, 2021

(65) Prior Publication Data

US 2022/0200184 A1 Jun. 23, 2022

(30) Foreign Application Priority Data

| Dec. 18, 2020 | (CN) | ............................. | 202011506261 |
| Jan. 25, 2021 | (CN) | ............................. | 202110097118 |
| Jul. 21, 2021 | (CN) | ............................. | 202110824776 |
| Nov. 30, 2021 | (CN) | ............................. | 202111439928 |

(51) Int. Cl.
  *H01R 13/24* (2006.01)
  *H01R 13/422* (2006.01)

(52) U.S. Cl.
  CPC ......... *H01R 13/245* (2013.01); *H01R 13/422* (2013.01)

(58) Field of Classification Search
  None
  See application file for complete search history.

(56) References Cited

FOREIGN PATENT DOCUMENTS

| CN | 2409632 Y | 12/2000 |
| CN | 1082265 C | 4/2002 |

*Primary Examiner* — Ross N Gushi
(74) *Attorney, Agent, or Firm* — Locke Lord LLP; Tim Tingkang Xia, Esq.

(57) ABSTRACT

An electrical connector includes multiple terminals formed by cutting from a metal plate and bending. The portion of the metal plate with the terminals being removed is defined as a base plate. Each terminal has a base portion and an elastic arm connected thereto. The base portion is at least partially horizontally provided to be coplanar to the base plate. A cutting slot is formed between the base plate and the base portion. A through slot is formed between the base plate and the elastic arm. An insulating body is provided with through holes running vertically therethrough. A portion of the cutting slot and the through slot are exposed in a corresponding through hole. The terminals include signal terminals and ground terminals. The base plate forms a connecting portion between the through slot and the cutting slot of each ground terminal to be connected to the ground terminal.

24 Claims, 39 Drawing Sheets

B-B

C-C

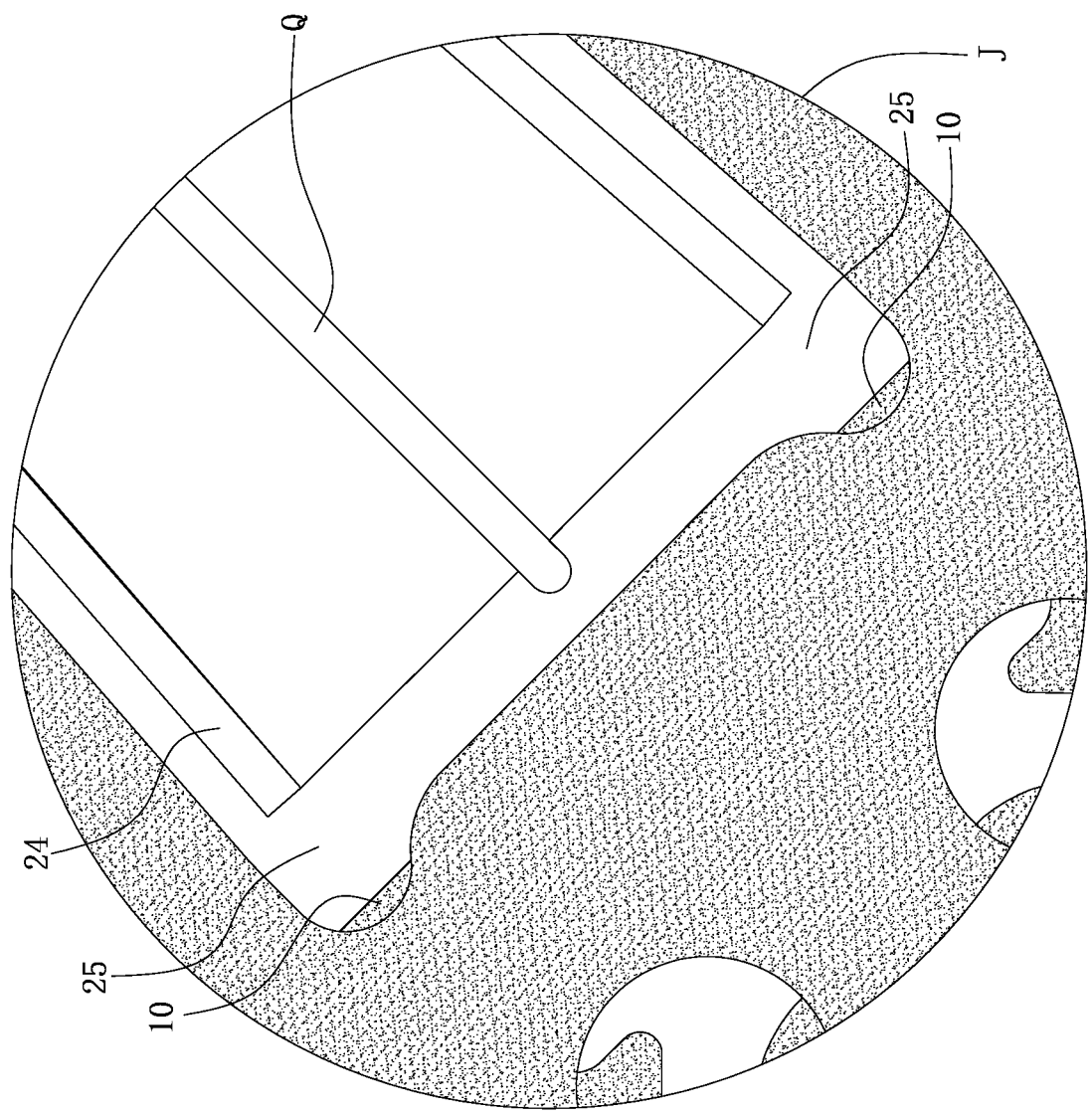

ELECTRICAL CONNECTOR

CROSS-REFERENCE TO RELATED PATENT APPLICATION

This non-provisional application claims priority to and the benefit of, pursuant to 35 U.S.C. § 119(a), patent application Serial No. CN202011506261.2 filed in China on Dec. 18, 2020, patent application Serial No. CN202110097118.0 filed in China on Jan. 25, 2021, patent application Serial No. CN202110824776.5 filed in China on Jul. 21, 2021, and patent application Serial No. CN202111439928.6 filed in China on Nov. 30, 2021. The disclosure of each of the above applications is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is prior art to the disclosure described herein. All references cited and discussed in this specification are incorporated herein by reference in their entireties and to the same extent as if each reference were individually incorporated by reference.

FIELD

The present invention relates to an electrical connector, and particularly to an electrical connector which the terminals are arranged densely therein and may prevent the signal terminals from short-circuiting.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

The Chinese Patent Application No. 99119994.4 discloses an electrical connector, which includes an insulating body and a metal strip and a plurality of terminals insert-molded with the insulating body. The insulating body is provided with a plurality of first openings and a plurality of second openings. Each terminal is provided with a main body portion, and a pair of wing portions provided to extend laterally along opposite directions from the main body portion. Two opposite sides of the main body portion protrude out of the wing portions along a longitudinal direction. The wings are exposed in the first openings. Each terminal is connected to the metal strip through a connecting portion, and the connecting portion is exposed in a corresponding second opening.

However, the connecting portion and the wing portions are located in the first openings and the second opening which are separated from each other, and is thus not conducive to the dense arrangement of the terminals. Further, during the insert-molding, the mold needs to provide a pair of first engaging members covering the upper and lower surfaces of the wing portions and a pair of second engaging members covering the upper and lower surfaces of the connecting portion, such that the forming of the electrical connector becomes complicated. Moreover, when cutting the connecting portion, there is no guarantee that the connecting portion may be completely cut, which may result in the terminals being connected together and short-circuiting, such that the electrical connector has safety concerns.

Therefore, a heretofore unaddressed need to design a new electrical connector exists in the art to address the aforementioned deficiencies and inadequacies.

SUMMARY

In view of the deficiency of the background, the present invention is directed to an electrical connector, which allows the terminals to be arranged denser, and effectively prevents the terminals from short-circuiting.

To achieve the foregoing objective, the present invention adopts the following technical solutions.

An electrical connector includes: an insulating body, provided with a plurality of through holes running vertically through the insulating body, wherein two protruding portions protrude toward each of the through holes from a side surface of each of the through holes; and a plurality of terminals and a conductive plate, altogether formed by cutting from a metal plate, wherein the terminals are configured to electrically connect a first mating component located above the insulating body and a second mating component located below the insulating body, the insulating body, the terminals and the conductive plate are insert-molded, and the conductive plate is horizontally accommodated in the insulating body; wherein each of the terminals has a base portion and an elastic arm integrally connected to the base portion, the elastic arm bends upward and is configured to be in contact with the first mating component, the two protruding portions are located at two opposite sides of the base portion, top surfaces of the two protruding portions and a top surface of the conductive plate are flush, and the base portion is at least partially horizontally provided to be coplanar to the conductive plate; wherein at least one cutting slot is formed between the conductive plate and the base portion of each of the terminals by cutting the base portion of each of the terminals, and a through slot is formed between the conductive plate and the elastic arm of each of the terminals by cutting the elastic arm of each of the terminals; wherein the elastic arm and the through slot are exposed in a corresponding one of the through holes, the insulating body covers a portion of the base portion, the cutting slot receives a part of the insulating body and the through slot is not filled by the insulating body, a portion of the cutting slot is exposed in the corresponding one of the through holes, and the portion of the cutting slot being exposed in the corresponding one of the through holes receives at least one of the protruding portions; wherein the terminals comprise a plurality of signal terminals, and the through slot and the cutting slot corresponding to each of the signal terminals are in communication to each other.

In certain embodiments, two opposite side edges of the base portion along a width direction thereof are defined as first side edges, two opposite side edges of the elastic arm along a width direction thereof are defined as second side edges, a side edge of the cutting slot opposite to one of the first side edges is defined as a third side edge, a side edge of the through slot opposite to one of the second side edges is defined as a fourth side edge, and a distance between the one of the first side edges and the third side edge is greater than a distance between the one of the second side edges and the fourth side edge.

In certain embodiments, the elastic arm comprises a wide portion integrally connected to the base portion and a narrow portion integrally connected to the wide portion, the narrow portion is configured to be in upward contact with the first mating component, a width of the wide portion is greater than a width of the narrow portion, a width of the base portion is less than the width of the wide portion, and viewing downward from a top thereof, the third side edge passes outward beyond the fourth side edge along the width direction of the base portion, and the base portion is arranged side by side with the narrow portion of an adjacent terminal of the terminals and is staggered from the wide portion of the adjacent terminal.

In certain embodiments, each of the terminals comprises a conductive portion having elasticity, the conductive portion and the elastic arm are both formed by extending forward from a front end of the base portion, the conductive portion bends downward to be elastically in contact with the second mating component, a gap is formed between the elastic arm and the conductive portion of each of the terminals, a separation slot is formed between the conductive portion of each of the terminals and the conductive plate, and viewing downward from a top thereof, the elastic arm and the conductive portion are provided side by side, the gap is located in front of the protruding portions, and the two protruding portion is located at two opposite sides of the conductive portion and the elastic arm.

In certain embodiments, the cutting slot extends backward and passes beyond the through slot located therebehind.

In certain embodiments, the terminals further comprise a plurality of ground terminals, two cutting slots are formed between the conductive plate and the base portion of each of the ground terminals by cutting the base portion of each of the ground terminals, the metal plate is provided with a connecting portion, a first bridging portion, a second bridging portion and a third bridging portion corresponding to each of the ground terminals, the ground terminals include two adjacent ground terminals in a front-rear direction, the two adjacent ground terminals include a front ground terminal and a rear ground terminal, the connecting portion corresponding to the front ground terminal is formed between the through slot corresponding to the front ground terminal and one of the two cutting slots corresponding to the front ground terminal, the first bridging portion corresponding to the front ground terminal is connected to the conductive portion of the front ground terminal and is located between the separation slot corresponding to the front ground terminal and the other one of the two cutting slots corresponding to the front ground terminal, the second bridging portion corresponding to the front ground terminal is connected to a rear end of the base portion of the front ground terminal and is formed between the other one of the two cutting slots corresponding to the front ground terminal and the separation slot corresponding to the rear ground terminal, the third bridging portion corresponding to the front ground terminal is connected to the rear end of the base portion of the front ground terminal and is formed between the one of the two cutting slots corresponding to the front ground terminal and the through slot corresponding to the rear ground terminal, and for a same one of the ground terminals, the connecting portion and the third bridging portion are exposed in different ones of the through holes, and the first bridging portion and the second bridging portion are exposed in different ones of the through holes.

In certain embodiments, the terminals further comprise a plurality of ground terminals, the metal plate forms two connecting portions between the through slot and the at least one cutting slot corresponding to each of the ground terminals, such that the through slot and the cutting slot corresponding to each of the ground terminals are not in communication, the two connecting portions are integrally connected to a corresponding one of the ground terminals, and an edge of each of the through holes is separated from the through slot.

In certain embodiments, the through slot and the cutting slot are U-shaped and are provided opposite to each other.

In certain embodiments, the electrical connector further includes a metal sheet and a plurality of lower terminals, wherein the metal sheet is horizontally provided, the metal sheet is located below the conductive plate and is in contact with the conductive plate, each of the lower terminals has a main body portion and a conductive portion integrally connected to the main body portion, the conductive portion is downward exposed to the insulating body and is configured to abut or be soldered to the second mating component, the main body portion is at least partially horizontally provided to be coplanar with the metal sheet, the main body portion is located below the base portion and is in contact with the base portion, the conductive plate has a plurality of upper bonding holes, the metal sheet has a plurality of lower bonding holes, the upper bonding holes and the lower bonding holes align vertically, the insulating body, the metal sheet and the lower terminals are insert-molded, and the insulating body is filled in the upper bonding holes and the lower bonding holes.

The present invention further adopts the following technical solutions.

An electrical connector includes: an insulating body, provided with a plurality of through holes running vertically through the insulating body; and a plurality of terminals and a conductive plate, altogether formed by cutting from a metal plate, wherein the terminals are configured to electrically connect a first mating component located above the insulating body and a second mating component located below the insulating body, the terminals comprise a plurality of signal terminals and a plurality of ground terminals, the insulating body, the terminals and the conductive plate are insert-molded, and the conductive plate is horizontally accommodated in the insulating body; wherein each of the terminals has a base portion and an elastic arm integrally connected to the base portion, the elastic arm bends upward and is configured to be in contact with the first mating component, and the base portion is at least partially horizontally provided to be coplanar to the conductive plate; wherein at least one cutting slot is formed between the conductive plate and the base portion of each of the terminals by cutting the base portion of each of the terminals, and a through slot is formed between the conductive plate and the elastic arm of each of the terminals by cutting the elastic arm of each of the terminals; wherein the elastic arm and the through slot are exposed in a corresponding one of the through holes, the insulating body covers a portion of the base portion, the cutting slot receives a part of the insulating body and the through slot is not filled by the insulating body, and a portion of the cutting slot is exposed in the corresponding one of the through holes; wherein the through slot and the at least one cutting slot corresponding to each of the signal terminals are in communication to each other, the metal plate forms at least one connecting portion between the through slot and the at least one cutting slot corresponding to each of the ground terminals, such that the through slot and the cutting slot corresponding to each of the ground terminals are not in communication, the at least one connecting portion is integrally connected to a corresponding one of the ground terminals, and the at least one connecting portion is exposed in the corresponding one of the through holes.

In certain embodiments, each of the connecting portions has a first cutting edge and a second cutting edge opposite to each other, the first cutting edge is connected to the cutting slot, the second cutting edge is connected to the through slot, and a width of the first cutting edge is less than a width of the second cutting edge.

In certain embodiments, the elastic arm comprises a wide portion integrally connected to the base portion and a narrow portion integrally connected to the wide portion, a width of the wide portion is greater than a width of the narrow portion, and viewing downward from a top thereof, along a width direction of the base portion, the connecting portions are arranged side by side with the narrow portion of an adjacent terminal of the terminals.

In certain embodiments, the electrical connector further includes a metal sheet and a plurality of lower terminals, wherein the metal sheet is located below the conductive plate and is in contact with the conductive plate, each of the lower terminals has a main body portion and a conductive portion integrally connected to the main body portion, the conductive portion is downward exposed to the insulating body and is configured to abut or be soldered to the second mating component, the main body portion is located below the base portion and is in contact with the base portion, the conductive plate has a plurality of upper bonding holes, the metal sheet has a plurality of lower bonding holes, the upper bonding holes and the lower bonding holes align vertically, the insulating body, the metal sheet and the lower terminals are insert-molded, the insulating body is filled in the upper bonding holes and the lower bonding holes, the lower terminals comprise a plurality of lower signal terminals and a plurality of lower ground terminals, and the metal sheet is integrally connected to the lower ground terminals and is separated from the lower signal terminals.

In certain embodiments, each of the terminals comprises a conductive portion having elasticity, the conductive portion and the elastic arm are both formed by extending forward from a front end of the base portion, the conductive portion bends downward to be elastically in contact with the second mating component, a gap is formed between the elastic arm and the conductive portion of each of the terminals, a separation slot is formed between the conductive portion of each of the terminals and the conductive plate, and viewing downward from a top thereof, the elastic arm and the conductive portion are provided side by side, and the gap is located in front of the portion of the cutting slot being exposed in the corresponding one of the through holes.

In certain embodiments, two cutting slots are formed between the conductive plate and the base portion of each of the ground terminals by cutting the base portion of each of the ground terminals, the metal plate is provided with a first bridging portion, a second bridging portion and a third bridging portion corresponding to each of the ground terminals, the ground terminals include two adjacent ground terminals in a front-rear direction, the two adjacent ground terminals include a front ground terminal and a rear ground terminal, the first bridging portion corresponding to the front ground terminal is connected to the front ground terminal and is located between the separation slot corresponding to the front ground terminal and one of the two cutting slots corresponding to the front ground terminal, the second bridging portion corresponding to the front ground terminal is connected to a rear end of the base portion of the front ground terminal and is formed between the one of the two cutting slots corresponding to the front ground terminal and the separation slot corresponding to the rear ground terminal, the third bridging portion corresponding to the front ground terminal is connected to the rear end of the base portion of the front ground terminal and is formed between the other one of the two cutting slots corresponding to the front ground terminal and the through slot corresponding to the rear ground terminal, the connecting portion corresponding to the front ground terminal is formed between the other one of the two cutting slots corresponding to the front ground terminal and the through slot corresponding to the front ground terminal, and for a same one of the ground terminals, the connecting portion and the third bridging portion are exposed in different ones of the through holes, and the first bridging portion and the second bridging portion are exposed in different ones of the through holes.

In certain embodiments, the ground terminals include two adjacent ground terminals in a front-rear direction, the two adjacent ground terminals include a front ground terminal and a rear ground terminal, the connecting portion and the first bridging portion corresponding to the rear ground terminal and the second bridging portion and the third bridging portion corresponding to the front ground terminal are exposed in a same one of the through holes.

In certain embodiments, each of the two cutting slots corresponding to the front ground terminal passes backward beyond a front end of the adjacent through slot corresponding to the rear ground terminal.

In certain embodiments, the insulating body is provided with an accommodating slot running downward through the insulating body, the base portion is flat plate shaped, the base portion has a conductive portion located right above a corresponding one of the accommodating slots, the conductive portion is soldered to the second mating component through a solder, the solder is accommodated in the accommodating slot, the conductive portion is provided with a hole, the hole runs through an upper surface and a lower surface of the conductive portion, and when soldering, the solder reaches the upper surface of the conductive portion from the lower surface of the conductive portion through the hole.

In certain embodiments, the terminals include two adjacent terminals in a front-rear direction, the two adjacent terminals include a front terminal and a rear terminal, the rear end of the base portion of the front terminal and the elastic arm of the rear terminal are exposed in a same one of the through holes.

In certain embodiments, the base portion is used as a soldering portion to be soldered and electrically connected with the second mating component through a solder.

In certain embodiments, the electrical connector further includes a plurality of lower terminals, the lower terminals are arranged one-to-one corresponding to the terminals and located below the terminals, each of the lower terminals includes a main body portion and a conductive portion integrally connected to the main body portion, the main body portion of each of the lower terminals and the base portion of a corresponding one of the terminals are fixed and electrically connected with each other, the conductive portion of each of the lower terminals is exposed downward in one of the through holes to be electrically connected with the second mating component.

In certain embodiments, the electrical connector further includes a metal sheet, wherein the metal sheet and the main body portion of each of the lower terminals are flat plate shaped and coplanar with each other, and the terminals and the corresponding lower terminals are arranged symmetrically in a vertical direction.

In certain embodiments, the base portion of each of the terminals is provided with an upper fixing hole running therethrough in the vertical direction, the main body portion of each of the lower terminals is provided with a lower fixing hole running therethrough in the vertical direction, the upper fixing hole of each of the terminals is aligned with the lower fixing hole of a corresponding one of the lower terminals, and the upper fixing hole of each of the terminals and the lower fixing hole of each of the lower terminals are filled by the insulating body.

In certain embodiments, the main body portion of each of the lower terminals and the base portion of the corresponding one of the terminals are fixed together by laser soldering, solder welding, or a conductive adhesive.

Compared with the related art, certain embodiments of the present invention has the following beneficial effects. The connecting portions (or a portion of the cutting slot) and the elastic arm are exposed in a same through hole, which is conducive to the dense arrangement of the terminals. Further, during the insert-molding, a pair of the engaging members of the mold cover the upper and lower surfaces of the elastic arm and simultaneously cover the upper and lower surfaces of the connecting portions (in other words, a pair of the engaging members are removed from the mold to cover the upper and lower surfaces of the connecting portions), such that the forming of the electrical connector is simple. Moreover, a portion of the cutting slot is exposed in the corresponding through hole, such that it is clearly observable whether the connecting portions are cut clean, thus ensuring the connecting portions to be cut clean, and preventing the terminals from being connected together and short-circuiting.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein:

FIG. 25B is an enlarged view of a portion J of FIG. 25A.

DETAILED DESCRIPTION

Figure 1A:
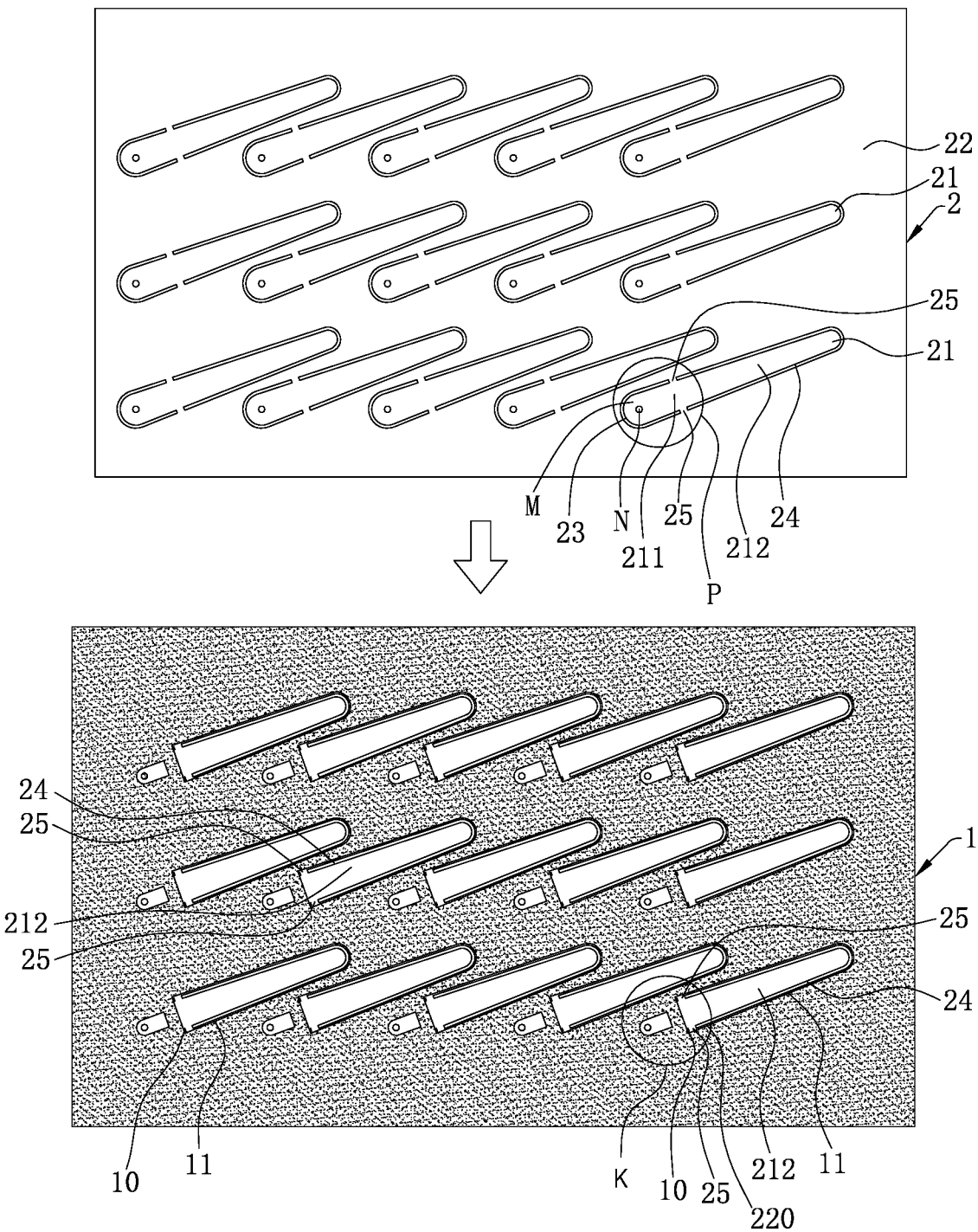
FIG. 1A is a schematic view of an electrical connector according to a first embodiment of the present invention, where a metal plate is insert-molded with an insulating body.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1A-34. In accordance with the purposes of this invention, as embodied and broadly described herein, this invention, in one aspect, relates to an electrical connector.

FIG. 1A to FIG. 6 show an electrical connector according to a first embodiment of the present invention. The electrical connector is used to electrically connect a first mating component E and a second mating component F. In this embodiment, the first mating component E is a chip module, and the second mating component F is a circuit board. In other embodiments, the first mating component E may be a circuit board, and the second mating component F may not be a circuit board. The electrical connector includes an insulating body 1; and a plurality of terminals 21 and a conductive plate 22, altogether formed by cutting from a metal plate 2. The conductive plate 22 is horizontally provided and accommodated in the insulating body 1. Each terminal 21 has a base portion 211 and an elastic arm 212 integrally connected to the base portion 211. The elastic arm 212 is used to be in contact with the first mating component E. The base portion 211 has a conductive portion M to be conductively connected to the second mating component F. In this embodiment, the conductive portion M is soldered to an upper surface of the second mating component F through a solder P.

The insulating body 1 is provided with a plurality of through holes 11 and a plurality of accommodating slots 12. The through holes 11 receive the elastic arms 212 of the terminals 21, and the accommodating slots 12 receive the solders P. Each through hole 11 runs vertically through the insulating body 1, and two protruding portions 10 protrude toward each through hole 11 from a side surface of each through hole 11. The two protruding portions 10 are located at two opposite sides of the base portion 211. Each accommodating slot 12 runs downward through the insulating body 1 and is located right below the conductive portion M, such that the conductive portion M is exposed in the corresponding accommodating slot 12. Each accommodating slot 12 is truncated cone shaped (in other embodiments, each accommodating slot 12 may be in other shapes), and each accommodating slot 12 gradually becomes smaller along an upward direction from a bottom thereof, such that a bottom end of each accommodating slot 12 is circular shaped. The insulating body 1 is provided with a stopping block 13 between a corresponding accommodating slot 12 and a corresponding through hole 11, such that the corresponding accommodating slot 12 and the corresponding through hole 11 are not in communication, thereby effectively preventing the solder P from diffusing into the corresponding through hole 11 to be in contact with the elastic arm 212 and make the elastic arm 212 loses its elasticity, and affecting the contact between the elastic arm 212 and the first mating component E. The stopping block 13 is provided with an arc surface 131. In other embodiments, the stopping block 13 may be in other shapes. The arc surface 131 is connected to the corresponding through hole 11, and the arc surface 131 and the bottom end of the corresponding accommodating slot 12 are concentric, such that the width of the stopping block 13 is increased, thereby better preventing the solder P from diffusing into the corresponding through hole 11.

The terminals 21 include a plurality of signal terminals 21a and a plurality of ground terminals 21b. The signal terminals 21a are separated from each other, and the ground terminals 21b are connected together through the conductive plate 22. In other embodiments, the ground terminals 21b may be separated from each other. The elastic arm 212 is exposed in the corresponding through hole 11, and the elastic arm 212 bends upward and extends upward out of the insulating body 1. The base portion 212 is horizontally flat plate shaped and is coplanar to the conductive plate 22. The conductive portion M is provided with a hole N, and the hole N is circular shaped. In other embodiments, the hole N may be in other shapes. The hole N runs through an upper surface and a lower surface of the conductive portion M. When the conductive portion M is soldered to the second mating component F through the solder P, the solder P reaches the upper surface of the conductive portion M from the lower surface of the conductive portion M through the hole N, such that the solder P presses the upper surface of the conductive portion M, thus preventing the conductive portion M from warping and tearing the solder P when the first mating component E presses downward on the elastic arm 212, and preventing from the ill contact between the conductive portion M and the second mating component F.

Figure 1B:
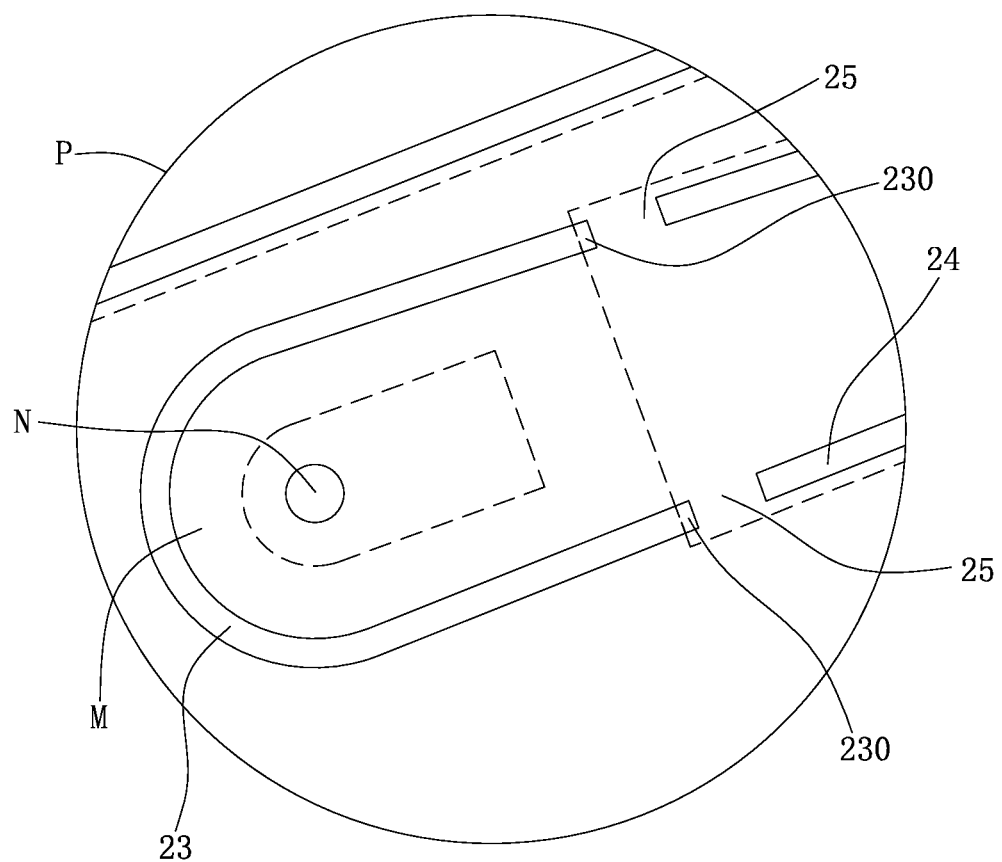
FIG. 1B is an enlarged view of a portion P of FIG. 1A, where the dotted lines schematically show the insulating body being subsequently formed.
Figure 1C:
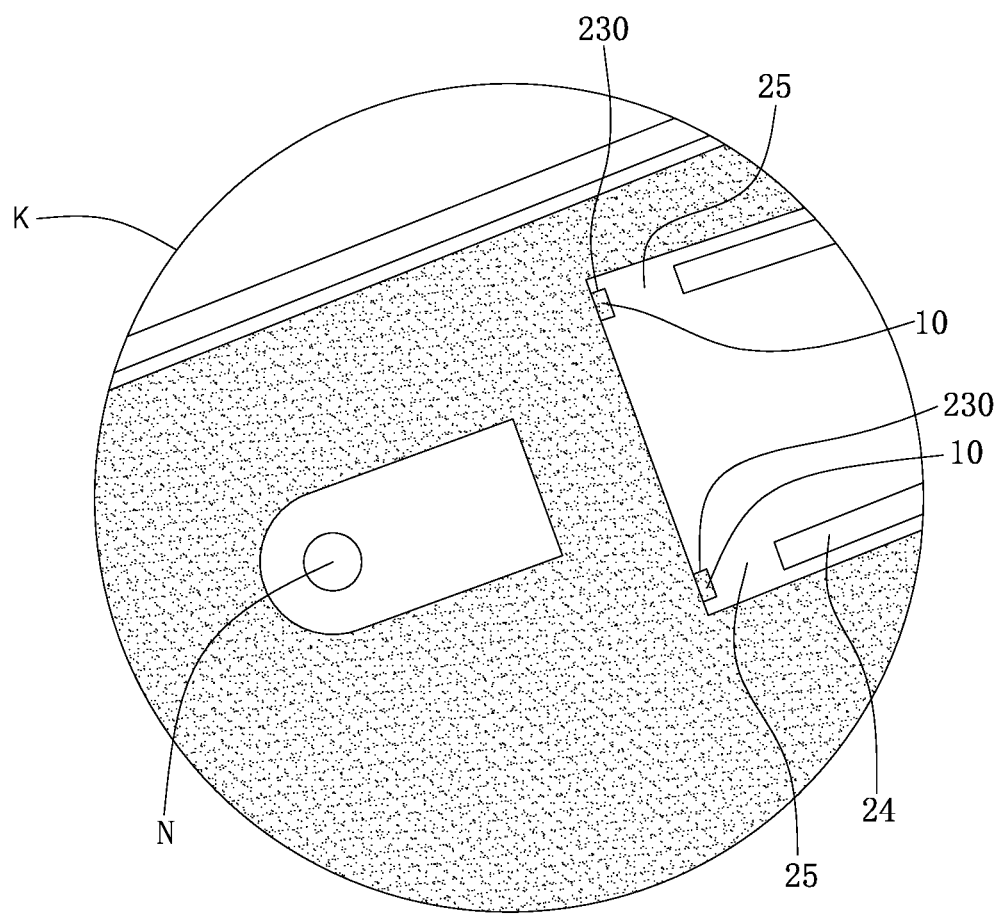
FIG. 1C is an enlarged view of a portion K of FIG. 1A.
Figure 2:
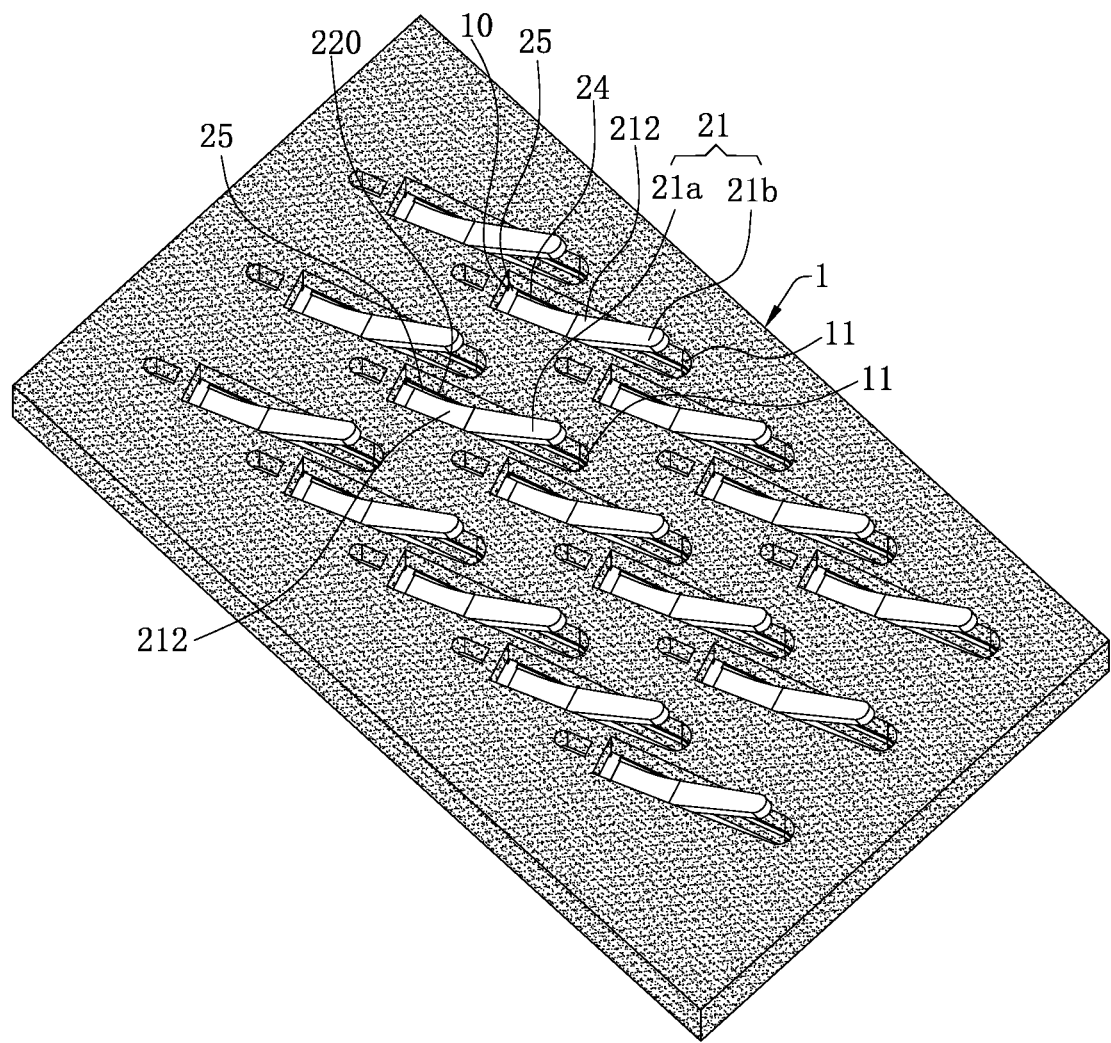
FIG. 2 is a perspective view of the electrical connector of FIG. 1A after the manufacturing of the electrical connector is complete.
Figure 3:
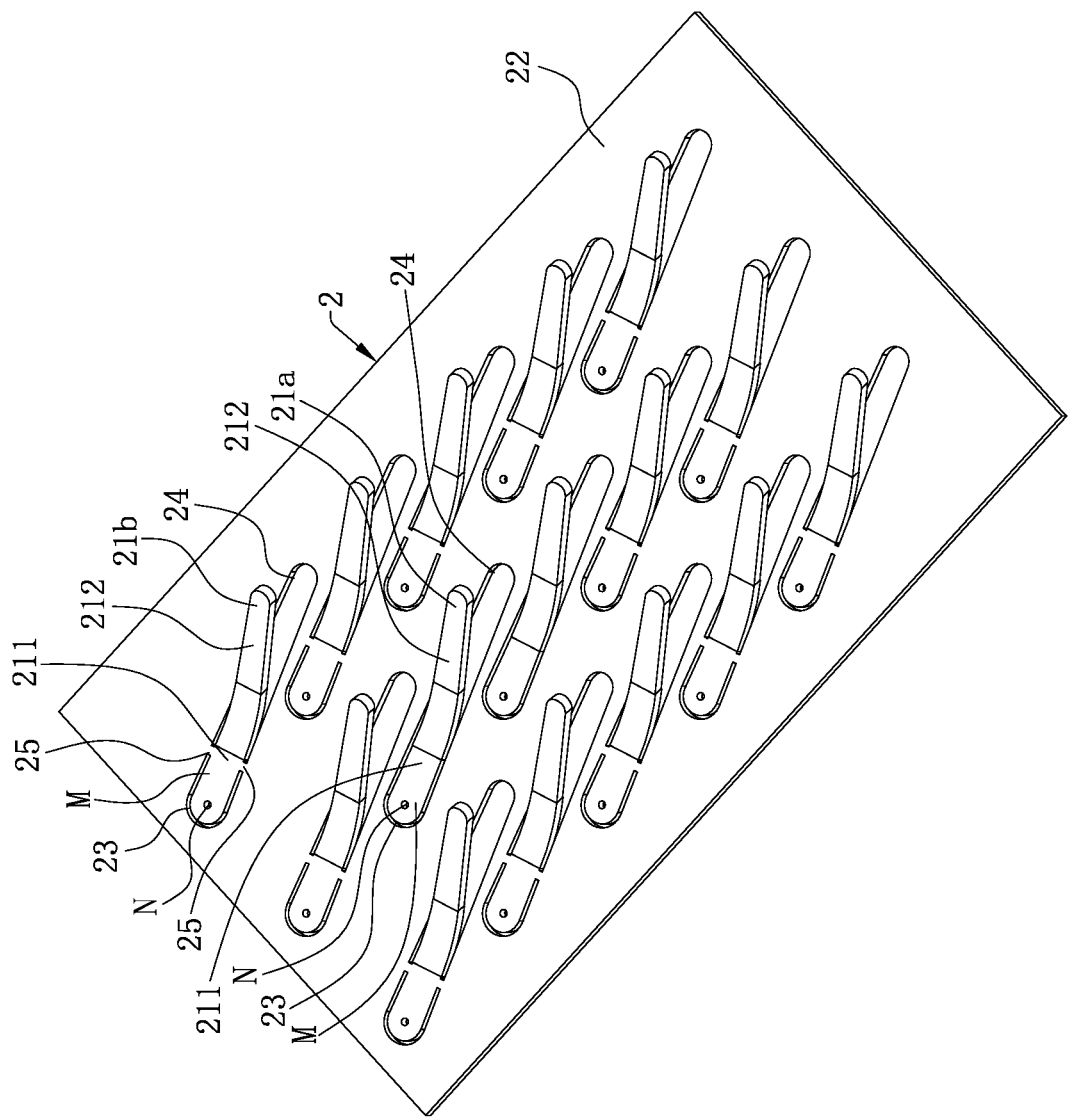
FIG. 3 is a perspective view of the metal plate of the electrical connector of FIG. 2.
Figure 4A:
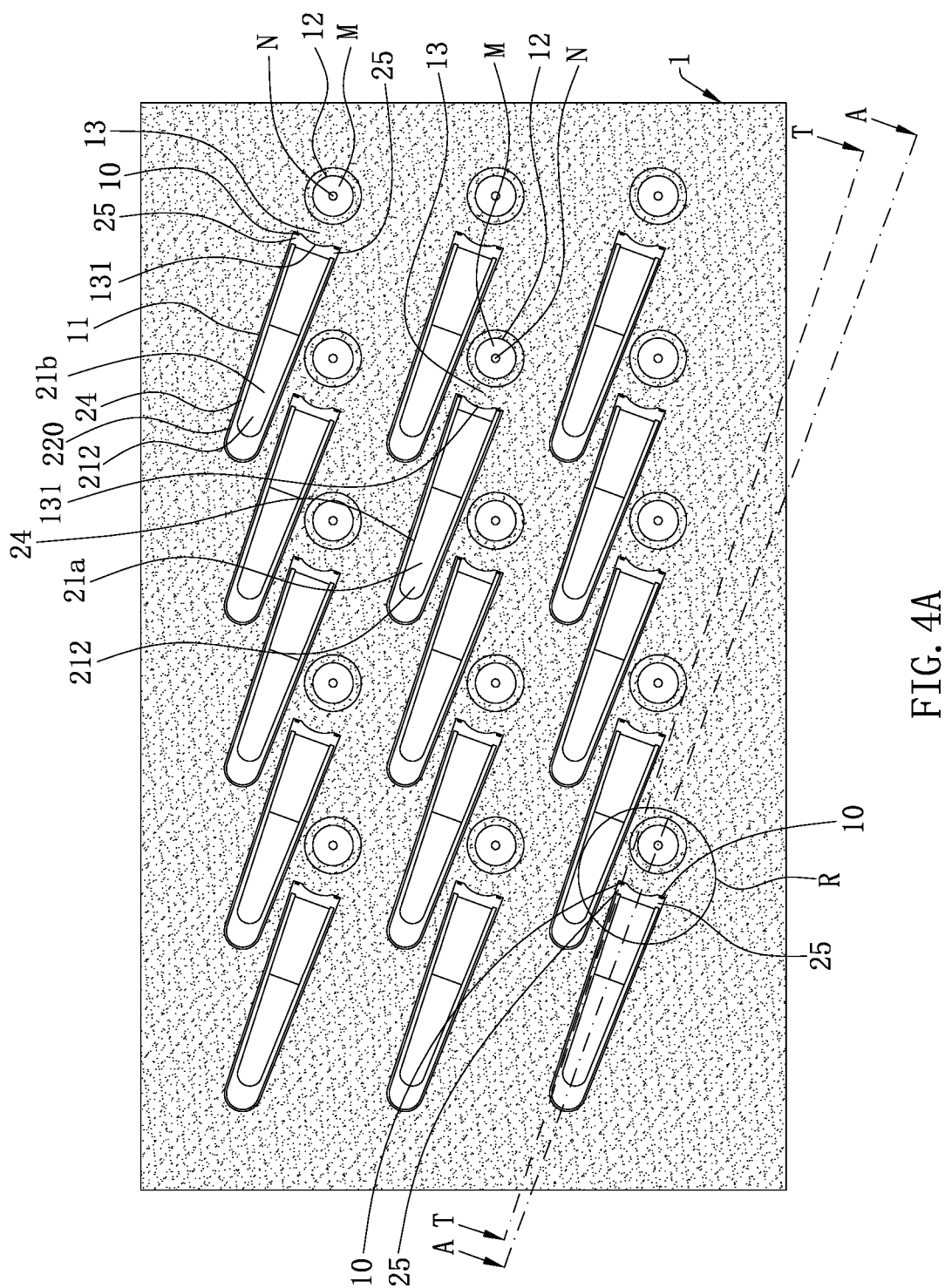
FIG. 4A is a bottom view of FIG. 2 after the manufacturing of the electrical connector is complete.
Figure 4B:
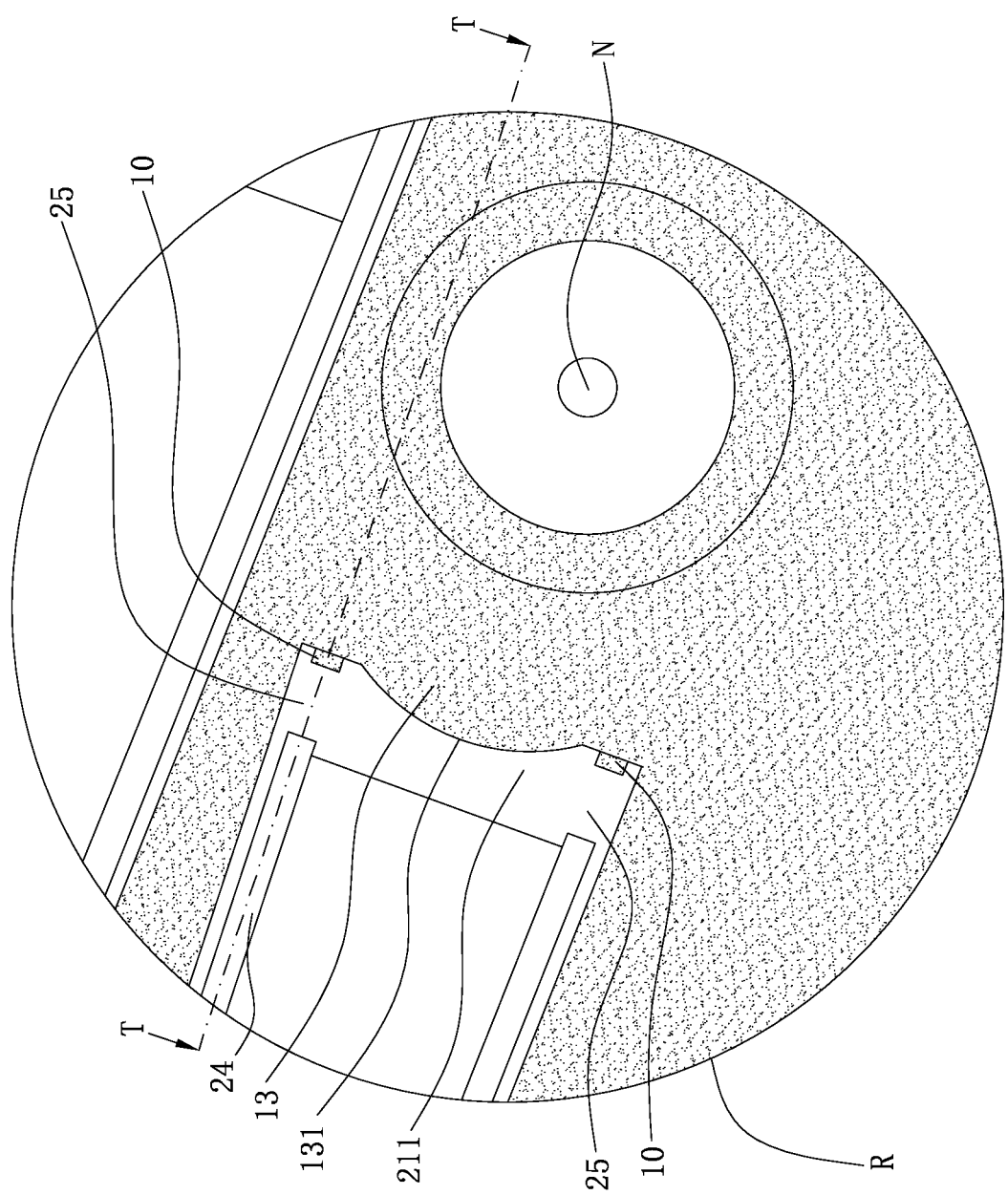
FIG. 4B is an enlarged view of a portion R of FIG. 4A.

By cutting the base portion 211, a cutting slot 23 is formed between the base portion 211 and the conductive plate 22. Referring to FIG. 1B and FIG. 1C, the cutting slot 23 is filled by the insulating body 1, a portion 230 of the cutting slot 23 is exposed in the corresponding through hole 11, and by comparing FIG. 1C to FIG. 1B, the portion 230 of the cutting slot 23 being exposed in the corresponding through hole 11 is filled by the protruding portions 10. By cutting the elastic arm 212, a through slot 24 is formed between the conductive plate 22 and the elastic arm 212. The through slot 24 is not filled by the insulating body 1, an edge of the corresponding through hole 11 is separated from the through slot 24 (in other words, a partial area 220 of the conductive plate 22 connected to the through slot 24 is exposed in the corresponding through hole 11), and the through slot 24 is exposed in the corresponding through hole 11. Referring to FIG. 2, the through slot 24 and the cutting slot 23 surrounding each signal terminal 21a are in communication, such that each signal terminal 21a is separated from the conductive plate 22, thus effectively preventing the signal terminals 21a from short-circuiting. The through slot 24 and the cutting slot 23 surrounding each ground terminal 21b are not in communication, such that the ground terminals 21b are connected together through the conductive plate 22.

The method of manufacturing the electrical connector according to the first embodiment of the present invention includes the following steps:

Step 1: referring to FIG. 1A to FIG. 1B, a metal plate 2 is provided, and a laser (not shown, same below) is used to cut a plurality of terminals 21 on the metal plate 2. For each terminal 21, after cutting the base portion 211, the cutting slot 23 is formed on the metal plate 2, and after cutting the elastic arm 212, the through slot 24 is formed on the metal plate 2. The through slot 24 and the cutting slot 23 are respectively U-shaped and are provided opposite to each other. In other words, the openings of the two U-shaped slots are provided opposite to each other. The metal plate 2 forms two connecting portions 25 between the cutting slot 23 and the through slot 24, and the connecting portions 25 are integrally connected to the elastic arm 212.

Step 2: referring to FIG. 1A to FIG. 1C, a mold (not shown, same below) is provided. The mold is provided with a plurality of pairs of engaging members (not shown, same below), and each elastic arm 212 is vertically clamped by a pair of the engaging members. The length and width of the elastic arm 212 are less than those of each engaging member. The engaging members cover the upper and lower surfaces of the elastic arm 212 and also cover a portion of the cutting slot 23 and the connecting portions 25. Then, a plastic material is injected to the metal plate 2, thereby forming the insulating body 1 on the metal plate 2 by insert-molding. The insulating body 1 is filled in the cutting slot 23, and the insulating body 1 covers the base portion 211 and does not cover the conductive portion M. The insulating body 1 is formed with the through holes 11. The elastic arm 212 is exposed in a corresponding through hole 11. Further, a portion of the cutting slot 23 and the connecting portions 25 are exposed in the corresponding through hole 11, such that in the subsequent step of cutting the connecting portions 25, the connecting portions 25 may be cut clean, thus preventing the signal terminals 21a from being connected together and short-circuiting, and enhancing the safety of the electrical connector.

Step 3: referring to FIG. 2, the laser is used to cut the connecting portions 25 integrally connected to each signal terminal 21a, such that the cutting slot 23 and the through slot 24 surrounding each signal terminal 21a are in communication, thereby separating the signal terminals 21a from each other. The connecting portions 25 integrally connected to each ground terminal 21b are maintained, such that the cutting slot 23 and the through slot 24 surrounding each ground terminal 21b are not in communication, thereby allowing the ground terminals 21b to be connected together through the connecting portions 25. In other embodiments, the connecting portions 25 integrally connected to each ground terminal 21b may be cut. After cutting the connecting portions 25 integrally connected to each signal terminal 21a, the elastic arm 212 bends upward (in other embodiments, the elastic arm 212 may firstly bend upward and then cutting the connecting portions 25), such that the elastic arm 212 extends upward out of the insulating body 1. By bending the elastic arm 212 upward after cutting the connecting portions 25, laser focusing may be facilitated during the cutting process, such that the cutting location becomes more accurate.

Figure 5A:
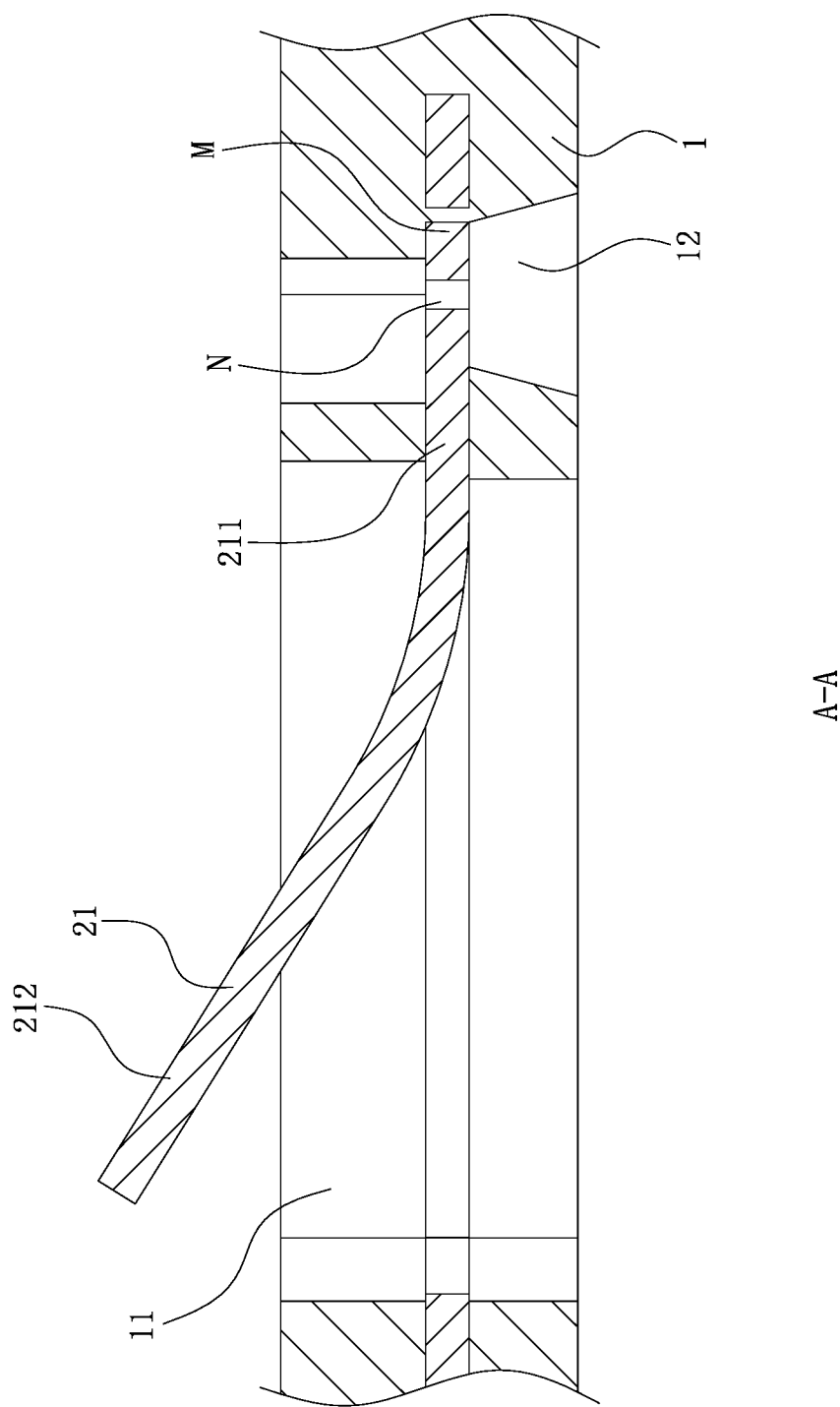
FIG. 5A is a sectional view of FIG. 4A along the A-A direction.
Figure 5B:
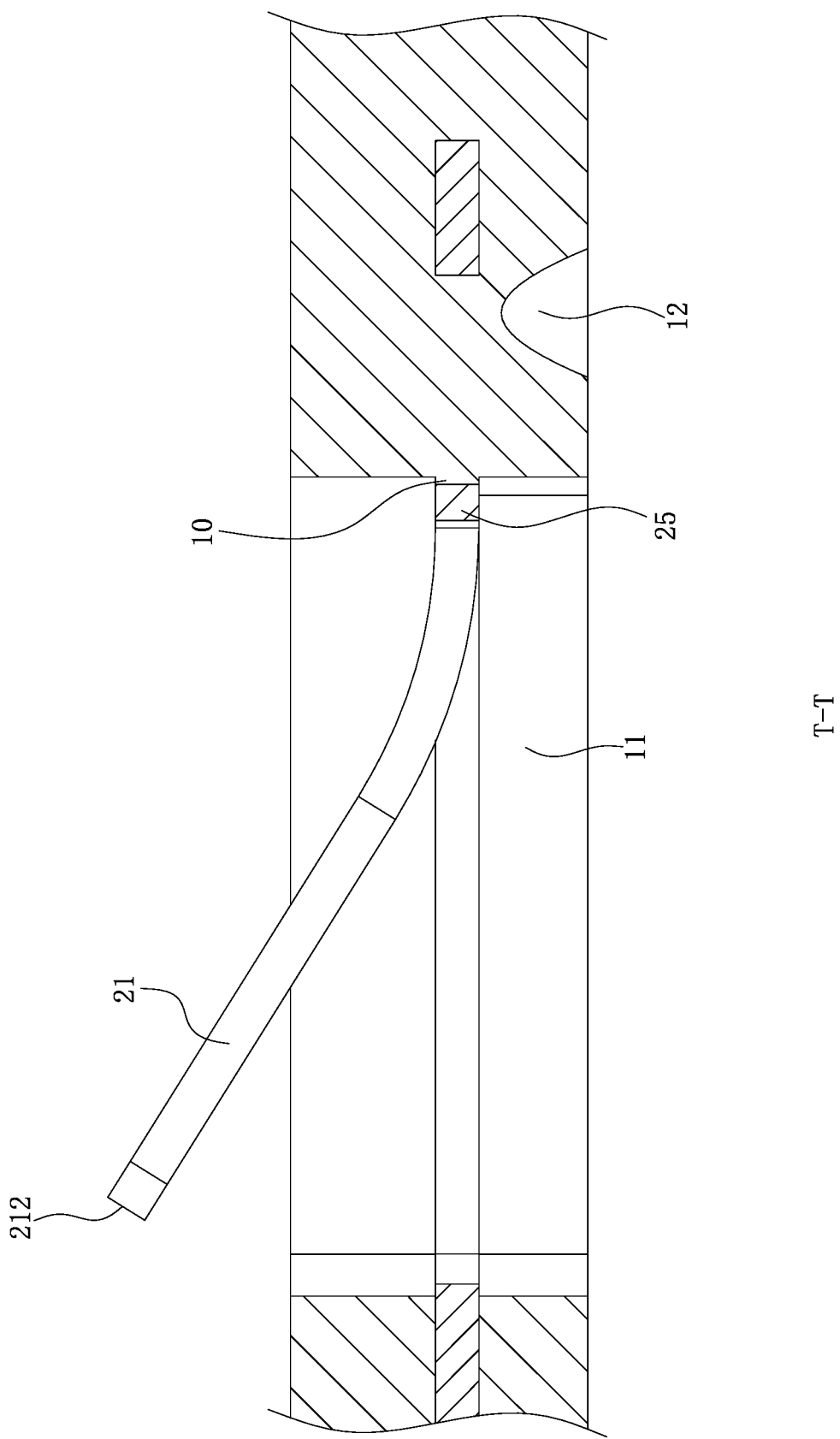
FIG. 5B is a sectional view of FIG. 4A along the T-T direction.
Figure 6:
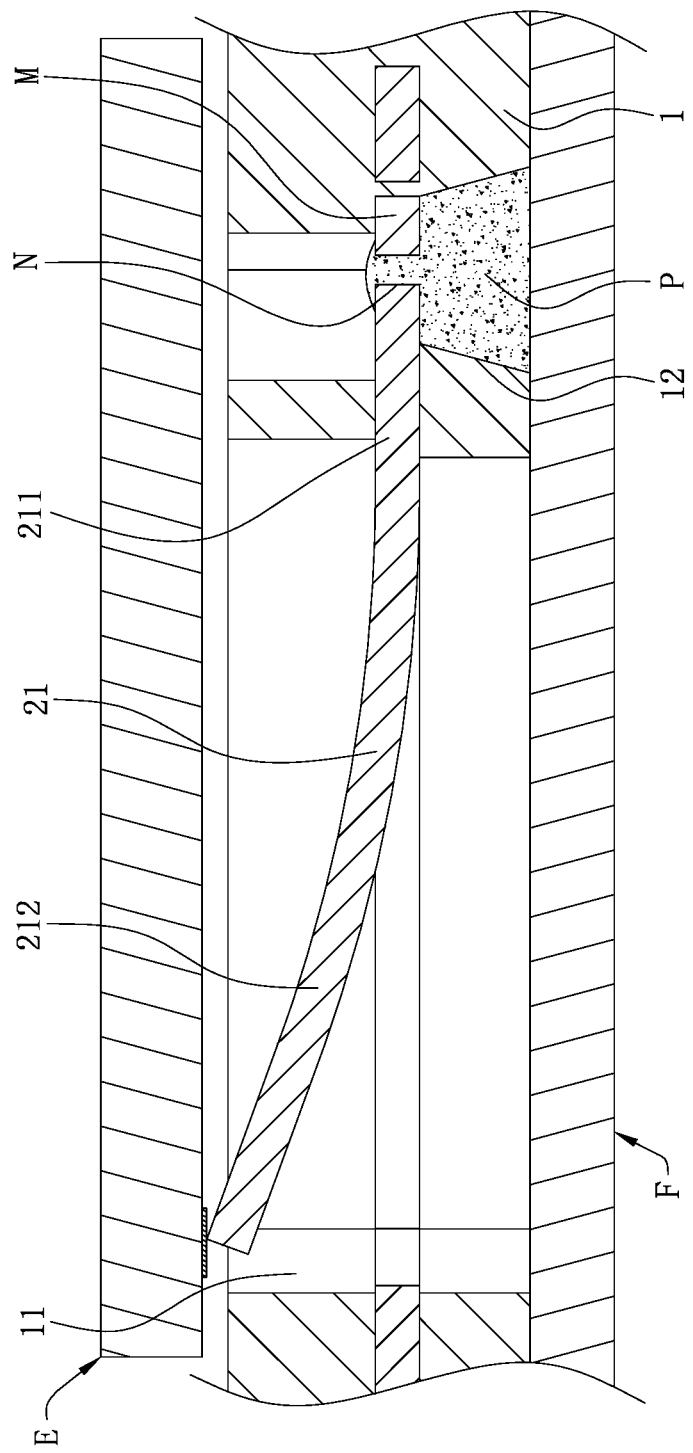
FIG. 6 is a sectional view of the electrical connector of FIG. 5A connecting a first mating component and a second mating component.

Referring to FIG. 5B, an upper surface of each protruding portion 10 is flush with an upper surface of each connecting portion 25, and the upper surface of each connecting portion 25 is coplanar to an upper surface of the whole metal plate 2. Thus, the upper surface of each protruding portion 10 is flush with the upper surface of the metal plate 2.

FIG. 7 to FIG. 13 show an electrical connector according to a second embodiment of the present invention. The electrical connector is used to electrically connect a first mating component E and a second mating component F. In this embodiment, the first mating component E is a chip module, and the second mating component F is a circuit board. In other embodiments, the first mating component E may be a circuit board, and the second mating component F may not be a circuit board. The electrical connector includes an insulating body 1, a plurality of terminals 21 and a conductive plate 22. The conductive plate 22 is horizontally provided and is accommodated in the insulating body 1. Each terminal 21 has a base portion 211 and an elastic arm 212 integrally connected to the base portion 211. The elastic arm 212 is used to be in contact with the first mating component E. The base portion 211 has a conductive portion M to be conductively connected to the second mating component F. In this embodiment, the conductive portion M is soldered to a surface of the second mating component F. In other embodiments, the conductive portion M may be inserted into the second mating component F to be soldered. Alternatively, the conductive portion M and the second mating component F are not soldered, e.g., the conductive portion M elastically abuts the surface of the second mating component F.

The insulating body 1 is provided with a plurality of through holes 11. Each through hole 11 runs vertically through the insulating body 1, and two protruding portions 10 protrude toward each through hole 11 from a side surface of each through hole 11. The two protruding portions 10 are located at two opposite sides of the base portion 211. The insulating body 1 is provided with a plurality of insulating blocks 12', and each insulating block 12' gradually becomes larger along an upward direction from a bottom thereof, In this embodiment, each insulating block 12' is truncated cone shaped (in other embodiments, each insulating block 12' may be in other shapes), which is conducive to guiding the conductive portion M of each terminal 21 during the mold clamping, thus preventing the conductive portion M from being bumped askew, and is not easily attached to the mold, thus facilitating demolding. A groove 13' is provided around each insulating block 12'. The insulating body 1 is provided with a stopping block 14' between the groove 13' and the corresponding through hole 11, and a portion of the stopping block 14' protrudes into the corresponding through hole 11, such that a width of the stopping block 14' along the line B-B is increased. Specifically, the line B-B is perpendicular to a vertical direction. The insulating body 1 has an outer side edge G, and the outer side edge G is inward concavely formed with a plurality of recesses 15 provided at intervals. Each recess 15 runs vertically through the insulating body 1, and two protruding blocks 16 protrude opposite to each other toward each recess 15 from two sides of each recess 15. The two protruding blocks 16 are located on a same horizontal plane, and a tail end of each protruding block 16 is flush with the outer side edge G. A plurality of protrusions 17 are provided in the insulating body 1, and each of the protrusions 17 is cylindrical shaped. In other embodiments, the protrusion 17 may be in other shapes. Each protrusion 17 is located above a corresponding insulating block 12' and extends to enter the base portion 211 of a corresponding terminal 21.

The terminals 21 include a plurality of signal terminals 21a and a plurality of ground terminals 21b. The signal terminals 21a are separated from each other, and the ground terminals 21b are connected together through the conductive plate 22. In other embodiments, the ground terminals 21b may be separated from each other. The base portion 211 includes a first portion 2111 being horizontal and a second portion 2112 formed by bending perpendicularly from the first portion 2111 and extending downward. An elastic arm 212 is formed by bending upward and extending from the base portion 211. The elastic arm 212 is exposed in the corresponding through hole 11, and the elastic arm 212 extends upward out of the insulating body 1. Two opposite side edges of the base portion 211 along a width direction of the base portion 211 along a horizontal direction are defined as first side edges 2113, and two opposite side edges of the elastic arm 212 along a width direction of the elastic arm 212 along the horizontal direction are defined as second side edges 2121. Specifically, the horizontal direction is perpendicular to the line B-B and the vertical direction. The elastic arm 212 includes a wide portion 2122 integrally connected to the base portion 211 and a narrow portion 2123 integrally connected to the wide portion 2122. The narrow portion 2123 is used to be in upward contact with the first mating component E. A width of the wide portion 2122 is greater than a width of the narrow portion 2123, and a width of the base portion 211 is less than the width of the wide portion 2122. Viewing downward from a top thereof, along a width direction of the base portion 211, the base portion 211 is arranged side by side with the narrow portion 2123 of an adjacent terminal 21 and is staggered from the wide portion 2122 of the adjacent terminal 21. In other words, the base portion 211 is not arranged side by side with the wide portion 2122 of the adjacent terminal 21. The first portion 2111 is provided with a hole N, and the hole N runs vertically through the first portion 2111. The hole N is circular shaped. In other embodiments, the hole N may be in other shapes. The protrusion 17 enters the hole N to better fix the terminals 21 in the insulating body 1. The first portion 2111 is partially exposed in the groove 13'. During the mold clamping, a portion of the first portion 2111 being exposed in the groove 13' abuts the mold to fix the base portion 211, thus preventing the base portion 211 from deviation during the insert-molding. The second portion 2112 is surrounded by the insulating block 12', and a portion of the second portion 2112 protruding out of the insulating block 12' forms the conductive portion M. A lower end of the conductive portion M is lower than a lower surface of the insulating body 1.

Figure 10:
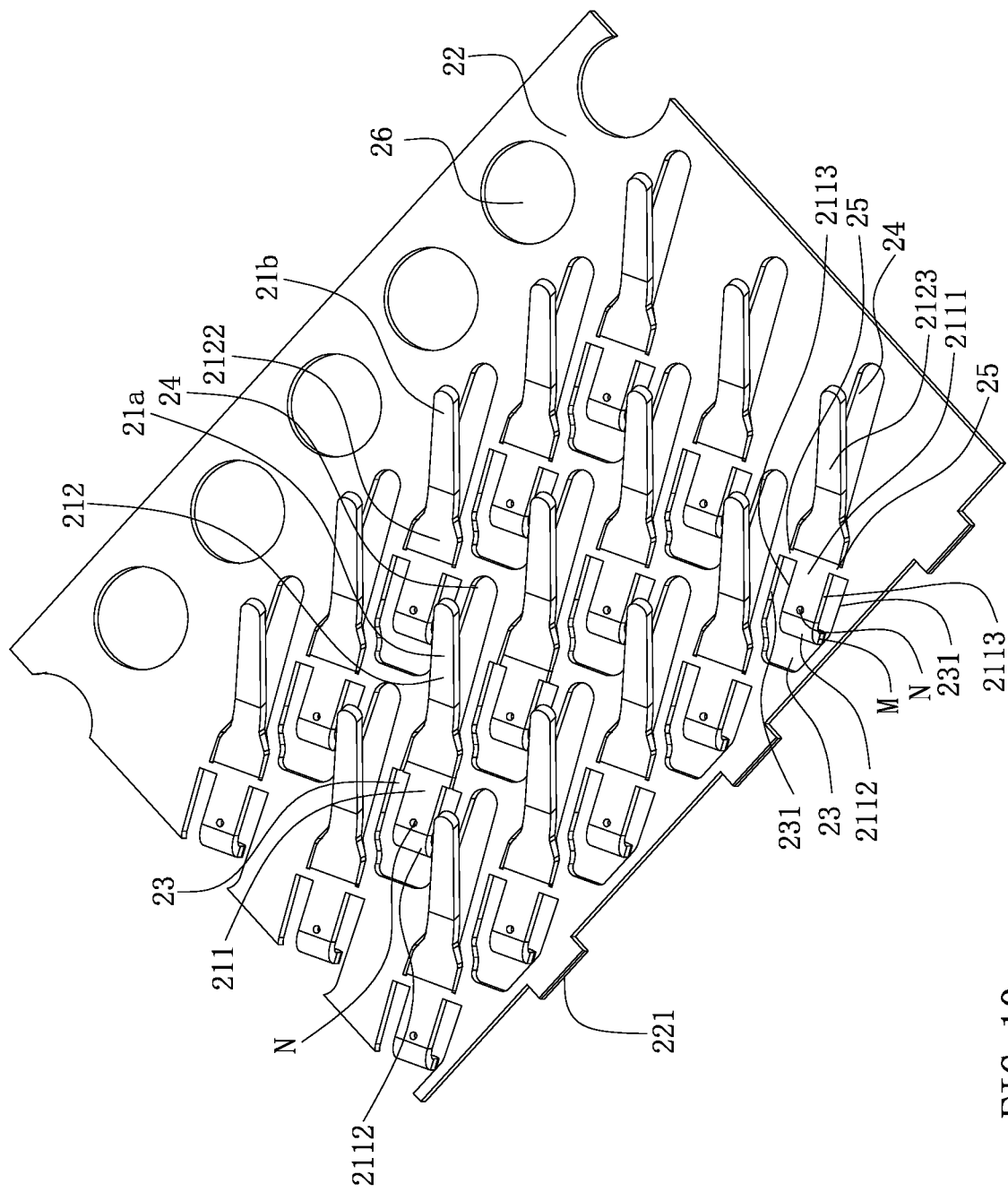
FIG. 10 is a perspective view of a metal plate of FIG. 9 after the manufacturing of the electrical connector is complete.

The conductive plate 22 is horizontally flat plate shaped, and the first portion 2111 is coplanar to the conductive plate 22. By cutting the base portion 211, a cutting slot 23 is formed between the base portion 211 and the conductive plate 22. The cutting slot 23 is U-shaped and surrounds the base portion 211. The cutting slot 23 is filled by the insulating body 1, a portion of the cutting slot 23 is exposed in the corresponding through hole 11, and the portion of the cutting slot 23 being exposed in the corresponding through hole 11 is filled by the protruding portions 10. A side edge of the cutting slot 23 opposite to one of the first side edges 2113 is defined as a third side edge 231. By cutting the elastic arm 212, a through slot 24 is formed between the conductive plate 22 and the elastic arm 212. The through slot 24 is U-shaped and is provided opposite to the cutting slot 23. In other words, the openings of the two U-shaped slots are provided opposite to each other. And the through slot 24 surrounds the elastic arm 212. An edge of the corresponding through hole 11 is separated from the through slot 24 (in other words, a partial area 220 of the conductive plate 22 connected to the through slot 24 is exposed in the corresponding through hole 11). A side edge of the through slot 24 opposite to one of the second side edges 2121 is defined as a fourth side edge 241. The third side edge 231 passes outward beyond the fourth side edge 241 along the width direction of the base portion 211, and a distance between the one of the first side edges 2113 and the third side edge 231 is greater than a distance between the one of the second side edges 2121 and the fourth side edge 241, such that the width of the base portion 211 is reduced, thereby reducing the capacitive effect of the base portion 211. Referring to FIG. 10, the through slot 24 and the cutting slot 23 surrounding each signal terminal 21a are in communication, such that the signal terminals 21a are separated from each other, thus effectively preventing the signal terminals 21a from short-circuiting. The through slot 24 and the cutting slot 23 surrounding each ground terminal 21b are not in communication, such that the ground terminals 21b are connected together through the conductive plate 22. In other embodiments, the ground terminals 21b may be separated from each other.

The conductive plate 22 has a plurality of strip connecting portions 221 to be integrally connected to a same strip 28. The strip connecting portions 221 are located in the recesses 15, and the upper and lower surfaces of each strip connecting portion 221 are exposed in the corresponding recess 15 and do not pass outward beyond the outer side edge G. The two opposite sides of each strip connecting portion 221 abut the two protruding blocks 16. The upper surface of each protruding block 16 is flush with the upper surface of each strip connecting portion 221, and the lower surface of each protruding block 16 is flush with the lower surface of each strip connecting portion 221. The tail end of each protruding block 16 is flush with the outer side edge G, and each strip connecting portion 221 does not pass beyond the outer side edge G, thus preventing each strip connecting portion 221 from being scratched by outer objects, and preventing each strip connecting portion 221 from scratching and hurting working staffs. The two protruding blocks 16 abut the two opposite sides of each strip connecting portion 221. When the strip 28 is removed, the damage caused by the acting force being applied may be absorbed by the two protruding blocks 16, which does not affect the overall structure of the insulating body 1, and is conducive to ensuring the completeness of the structure of the insulating body 1.

Figure 7:
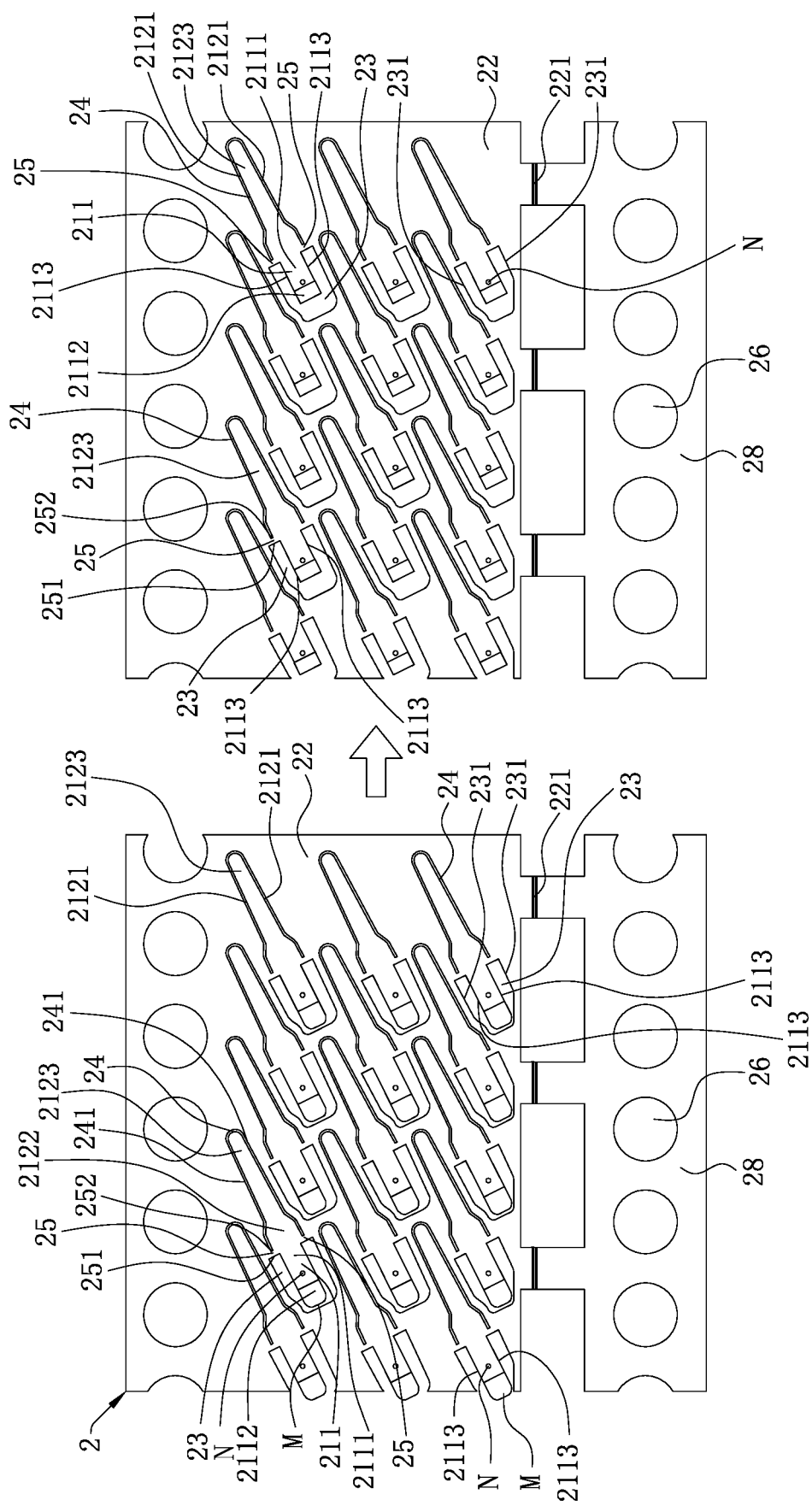
FIG. 7 and FIG. 8 are schematic views of steps of a method of manufacturing an electrical connector according to a second embodiment of the present invention.

The method of manufacturing the electrical connector according to the second embodiment of the present invention includes the following steps:

Step 1: referring to FIG. 7, a metal plate 2 is provided, and a strip 28, a plurality of positioning holes 26 and a plurality of terminals 21 are cut on the metal plate 2. The remaining material of the metal plate 2 after cutting the terminals 21 and the strip 28 is defined as the conductive plate 22. Each positioning hole 26 is circular shaped. After the positioning holes 26 are used to fix the metal plate 2, a laser (not shown, same below) is used to cut the base portion 211 of each terminal 21 on the metal plate 2 (and when cutting the base portion 211 of each terminal 21 on the metal plate 2, the positioning holes 26 provide the positioning function for the metal plate 2), thereby forming the cutting slot 23 on the metal plate 2. For each terminal 21, after cutting the base portion 211, the base portion 211 bends perpendicularly downward, such that the base portion 211 forms the horizontal first portion 2111 and the second portion 2112 formed by bending perpendicularly and extending downward from the first portion 2111; and after cutting the elastic arm 212, the through slot 24 is formed on the metal plate 2. The metal plate 2 forms a connecting portion 25 between the cutting slot 23 and the through slot 24, and the narrow portion 2123 is arranged side by side with the connecting portion 25 of the adjacent terminal 21. The connecting portion 25 has a first cutting edge 251 and a second cutting edge 252 opposite to each other. The first cutting edge 251 is connected to the cutting slot 23, and the second cutting edge 252 is connected to the through slot 24. A width of the first cutting edge 251 is less than a width of the second cutting edge 252.

Figure 8:
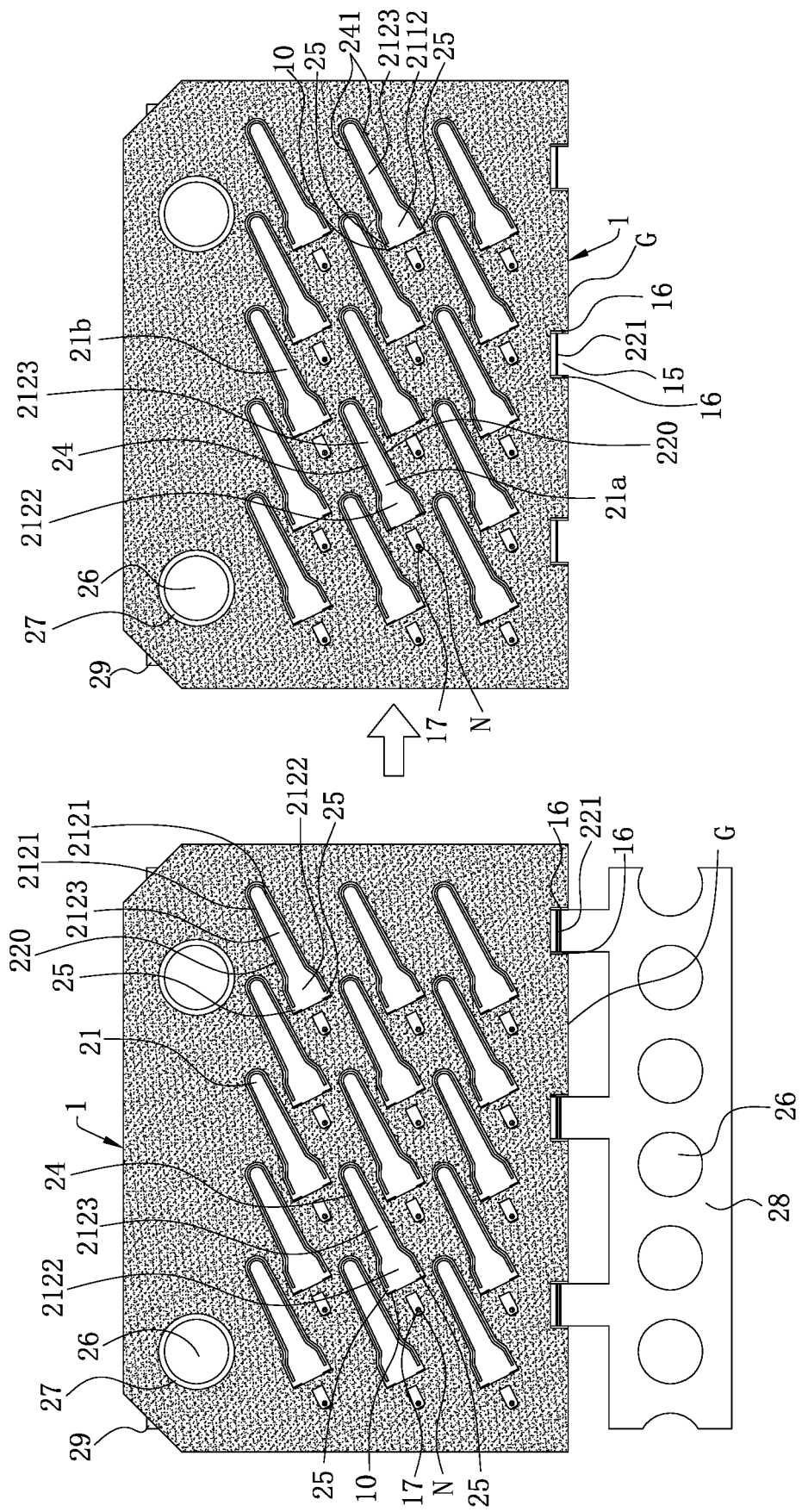

Step 2: referring to FIG. 8, a mold (not shown, same below) is provided. The mold is provided with a plurality of pairs of fixing posts (not shown, same below, and in this embodiment, there are two pairs of fixing posts) and a plurality of pairs of engaging members (not shown, same below). A diameter of each positioning hole 26 is less than a diameter of each fixing post. Each pair of the positioning posts vertically clamp a corresponding positioning hole 26, and each elastic arm 212 is vertically clamped by a pair of the engaging members. The length and width of the elastic arm 212 are less than those of each engaging member. The engaging members cover the upper and lower surfaces of the elastic arm 212 and also cover a portion of the cutting slot 23 and the connecting portion 25. Then, a plastic material is injected to the metal plate 2, thereby forming the insulating body 1 on the metal plate 2 by insert-molding. The insulating body 1 covers the metal plate 2. After removing the mold, the insulating body 1 is formed with the through holes 11. The elastic arm 212 is exposed in a corresponding through hole 11. The connecting portion 25 and a portion of the cutting slot 23 are exposed in the corresponding through hole 11. Each positioning hole 26 being vertically clamped by the fixing posts is not filled by the insulating body 1, and a partial area 27 of the metal plate 2 connected to each positioning hole 26 is exposed in the insulating body 1. Further, at least one outer edge of the metal plate 2 is exposed in the insulating body 1. In other embodiments, the outer edge of the metal plate 2 may be not exposed. In this embodiment, two corners 29 of the metal plate 2 are exposed in the insulating body 1. In other embodiments, other outer edges of the metal plate 2 may be exposed in the insulating body 1. After the insert-molding, the two corners 29 of the metal plate 2 being exposed in the insulating body 1 are connected to the electrodes to perform electroplating to the metal plate 2.

Figure 9:
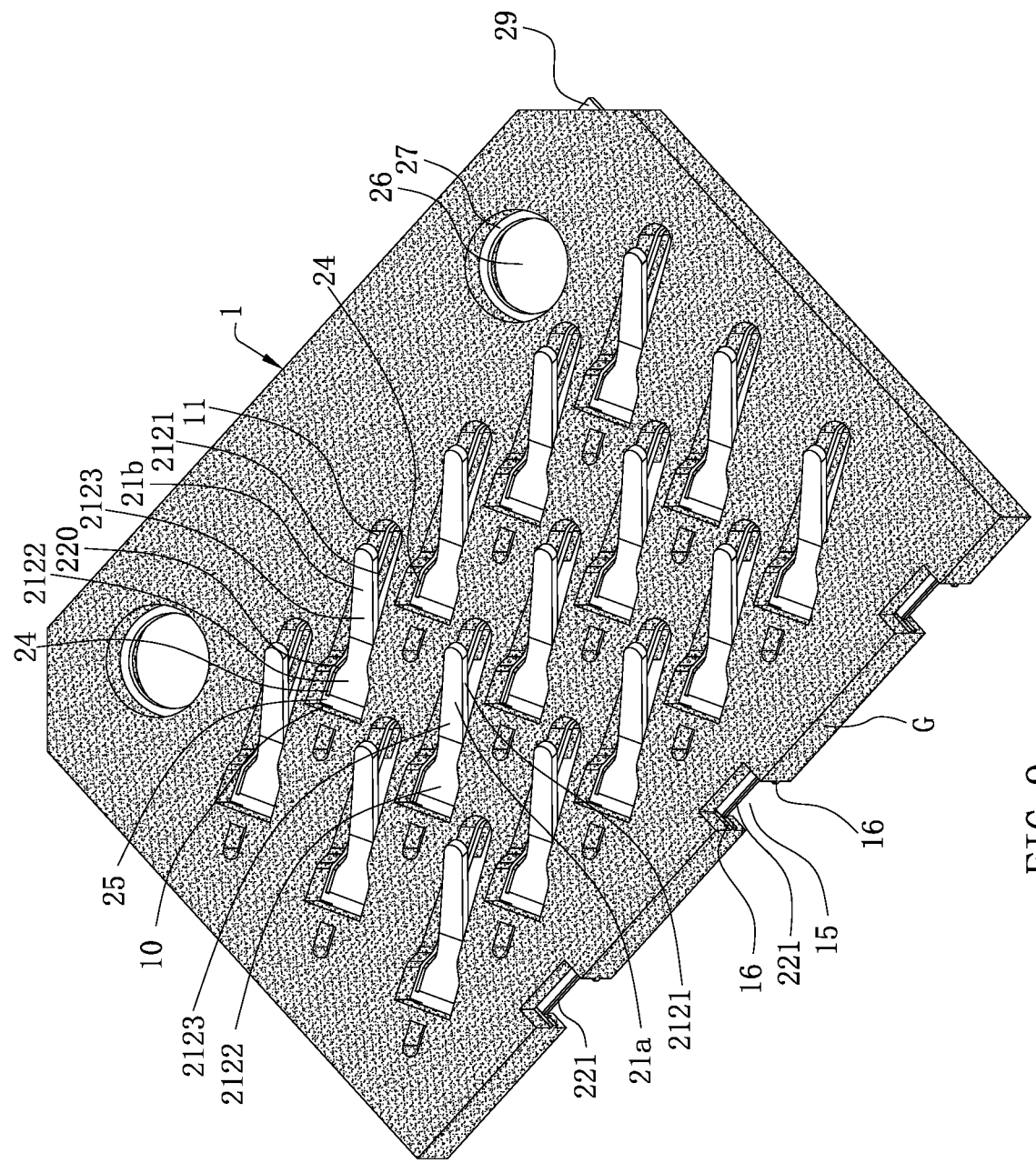
FIG. 9 is a perspective view of an electrical connector according to the second embodiment of the present invention after manufacturing thereof is complete.

Step 3: referring to FIG. 9 and FIG. 10, after electroplating the metal plate 2, the laser is used to cut the connecting portion 25 (in other embodiments, the electroplating may be performed after cutting the connecting portion 25), thus cutting the connecting portion 25 integrally connected to each signal terminal 21a, such that the cutting slot 23 and the through slot 24 surrounding each signal terminal 21a are in communication, thereby separating the signal terminals 21a from each other. The connecting portion 25 integrally connected to each ground terminal 21b is maintained, such that the cutting slot 23 and the through slot 24 surrounding each ground terminal 21b are not in communication, thereby allowing the ground terminals 21b to be connected together through the connecting portion 25.

Step 4: referring to FIG. 9 and FIG. 10, after cutting the connecting portion 25, the elastic arm 212 bends upward (in other embodiments, the elastic arm 212 may firstly bend upward and then cutting the connecting portion 25), such that the elastic arm 212 extends upward out of the insulating body 1. By bending the elastic arm 212 upward after cutting the connecting portions 25, laser focusing may be facilitated during the cutting process, such that the cutting location becomes more accurate.

Figure 11:
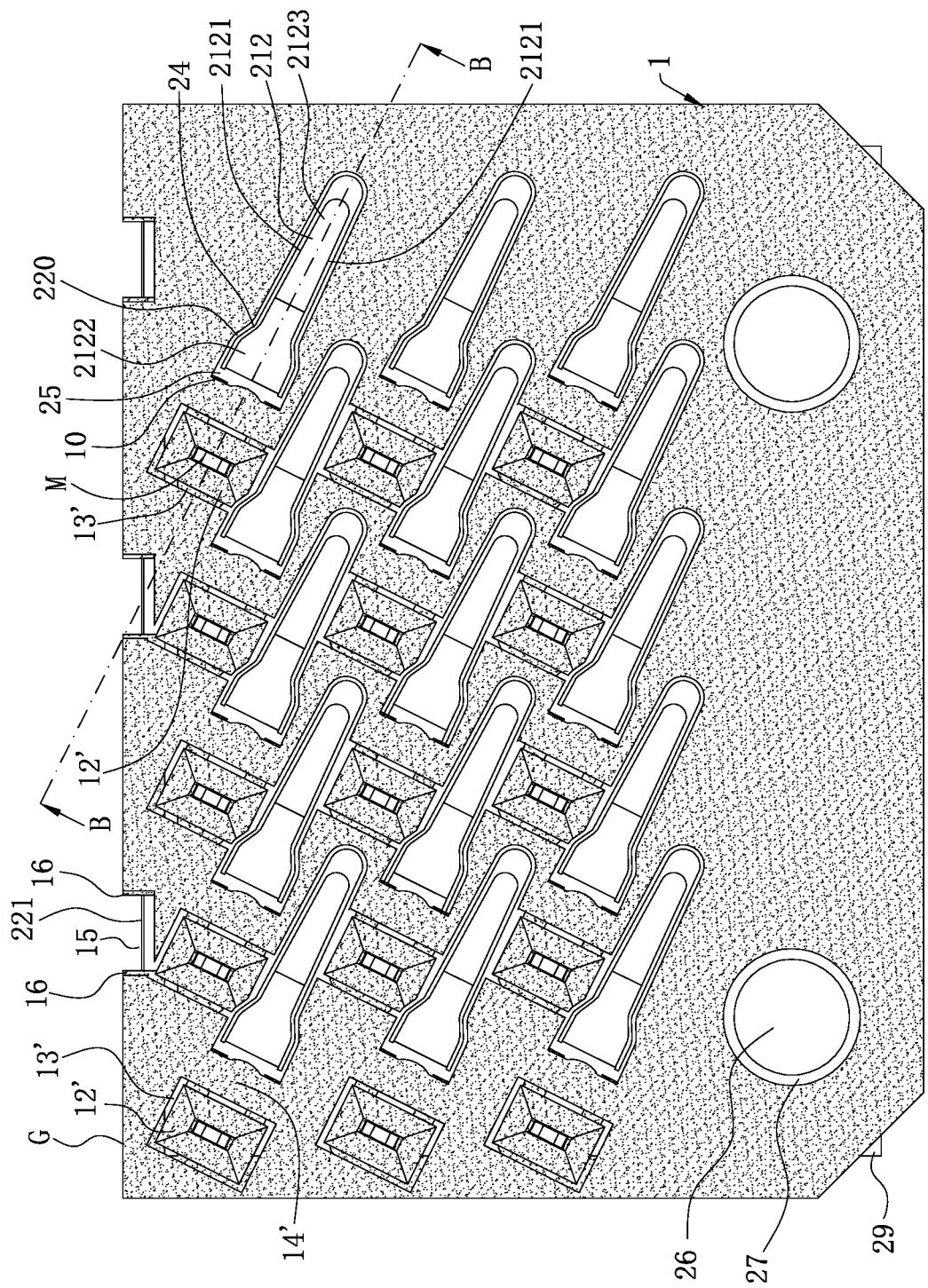
FIG. 11 is a bottom view of FIG. 9 after the manufacturing of the electrical connector is complete.
Figure 12:
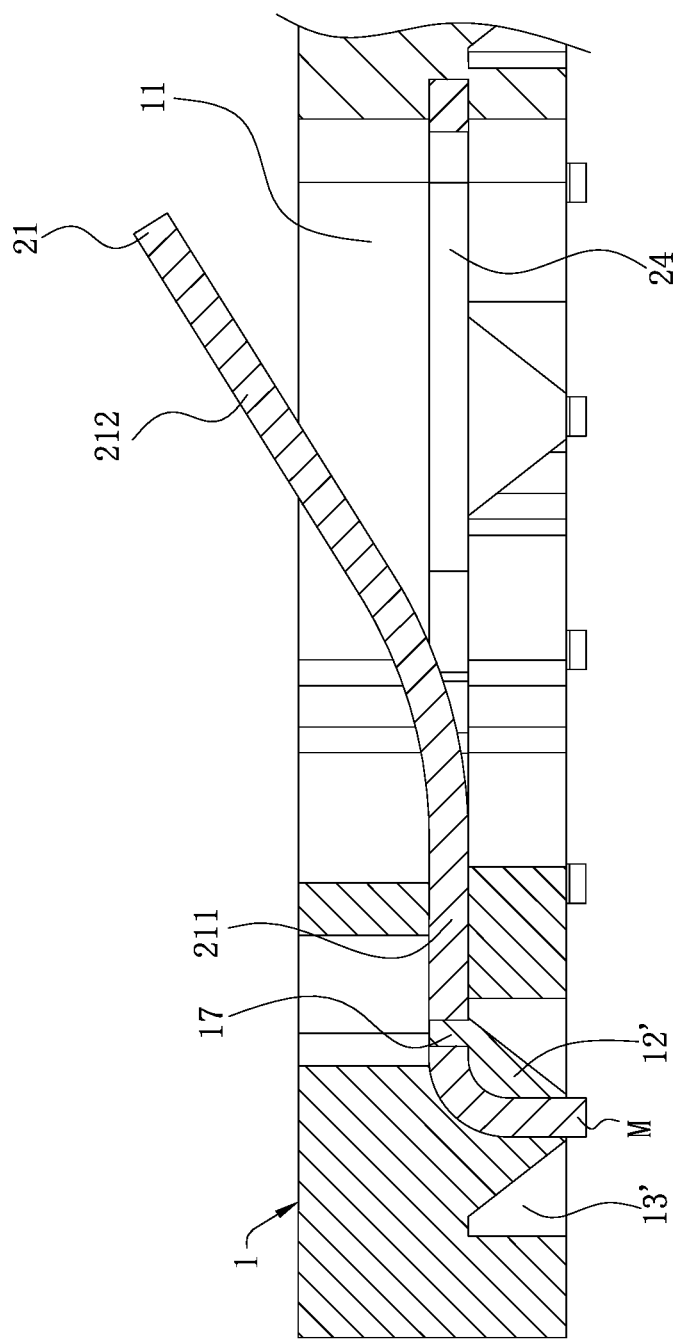
FIG. 12 is a sectional view of FIG. 11 along the B-B direction.
Figure 13:
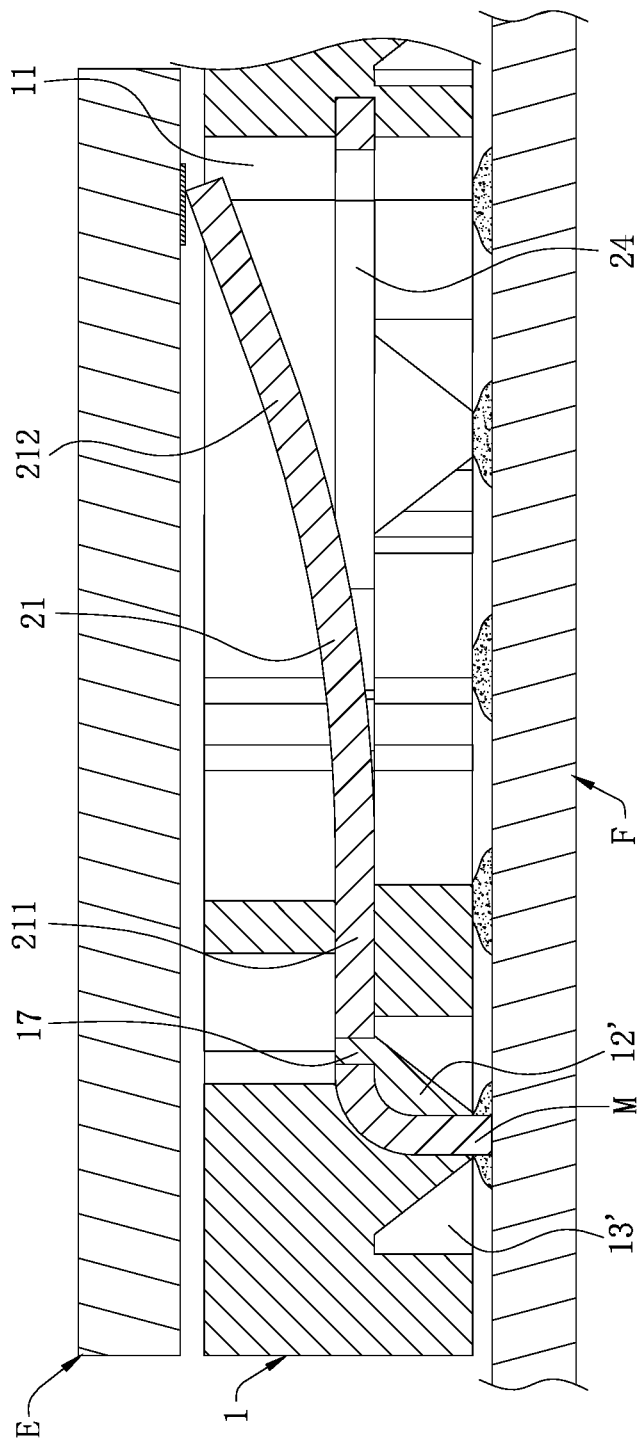
FIG. 13 is a sectional view of the electrical connector of FIG. 12 connecting a first mating component and a second mating component.

Step 5: referring to FIG. 11, the strip connecting portions 221 are broken, and the strip 28 is removed.

In other embodiments, the elastic arm 212 may be cut after the insert-molding of the insulating body 1 and the metal plate 2. Thus, when cutting the elastic arm 212 of each signal terminal 21a, the connecting portion 25 connected to each signal terminal 21a may be simultaneously cut.

FIG. 14 to FIG. 21 show an electrical connector according to a third embodiment of the present invention. The electrical connector is used to electrically connect a first mating component E and a second mating component F. In this embodiment, the first mating component E is a chip module, and the second mating component F is a circuit board. In other embodiments, the first mating component E may be a circuit board, and the second mating component F may not be a circuit board. The electrical connector includes an insulating body 1; a plurality of terminals 21 and a conductive plate 22, altogether formed by cutting from a metal plate 2; and a metal sheet 3 and a plurality of lower terminals 4, altogether formed by cutting from another metal plate 2. The insulating body 1, the terminals 21, the conductive plate 22, the lower terminals 4 and the metal sheet 3 are insert-molded. The conductive plate 22 and the metal sheet 3 are respectively horizontally provided and accommodated in the insulating body 1. The metal sheet 3 is located below the conductive plate 22 and is in contact with the conductive plate 22. Each terminal 21 has a base portion 211 and an elastic arm 212 integrally connected to the base portion 211.

The elastic arm 212 is used to be in contact with the first mating component E. Each lower terminal 4 has a main body portion 40 and a conductive portion 41 integrally connected to the main body portion 40. The main body portion 40 is horizontally flat plate shaped and is coplanar to the metal sheet 3. The conductive portion 41 is downward exposed in the insulating body 1 to abut the second mating component F. In other embodiments, the conductive portion 41 may be used to be soldered to the second mating component F. The main body portion 40 is located below the base portion 211 and is in contact with the base portion 211.

Figure 16:
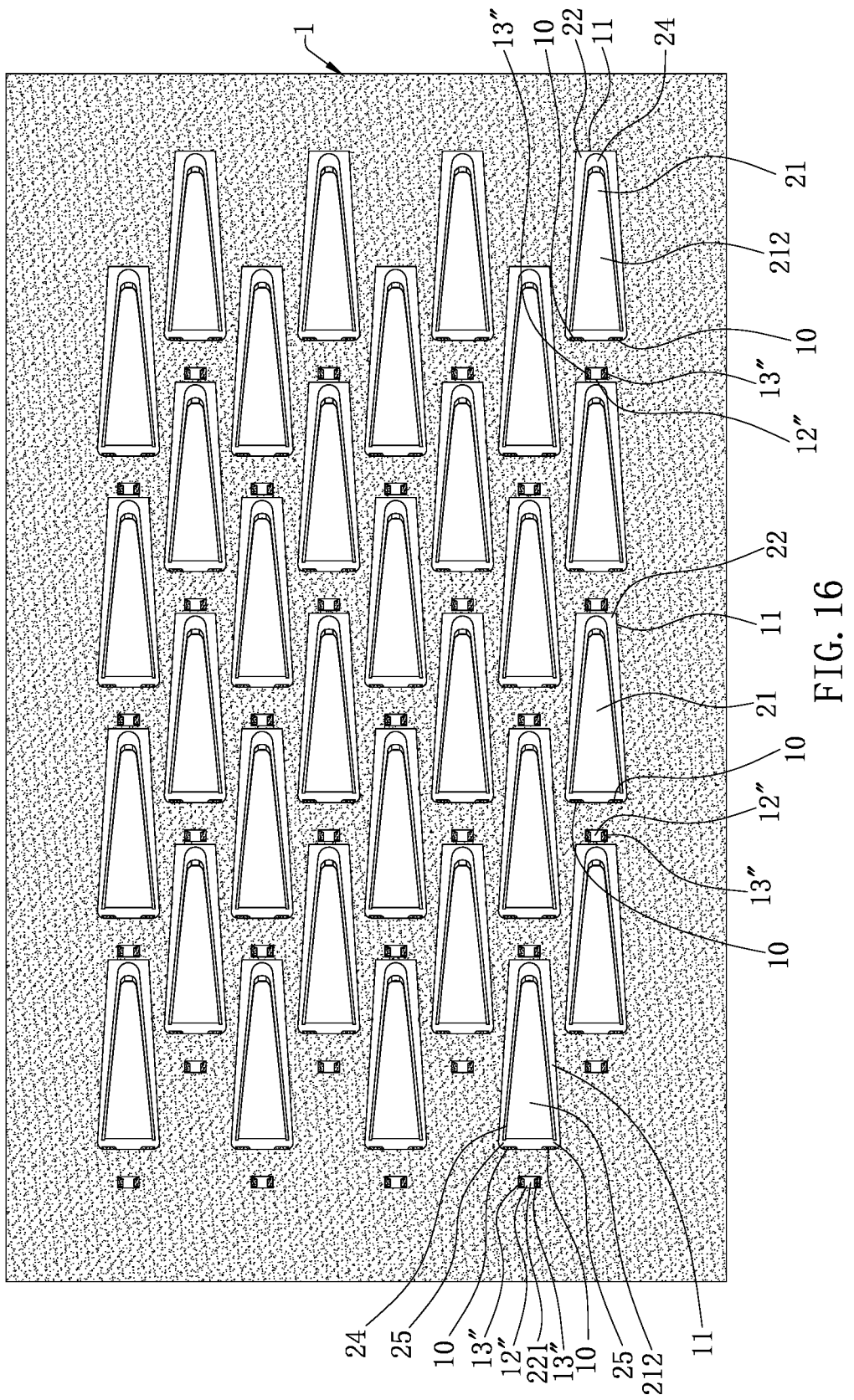
FIG. 16 is a schematic view of a step 3 of the method of manufacturing an electrical connector according to the third embodiment of the present invention.

Referring to FIG. 16, the insulating body 1 is provided with a plurality of through holes 11 and a plurality of accommodating holes 12". Each through hole 11 runs vertically through the insulating body 1, and two protruding portions 10 protrude toward each through hole 11 from a side surface of each through hole 11. The two protruding portions 10 are located at two opposite sides of the base portion 211, and the upper surfaces of the two protruding portions 10" are flush with the upper surface of the conductive plate 22. Each accommodating hole 12" runs downward through the insulating body 1, and two retaining blocks 13" protrude opposite to each other toward each accommodating hole 12" from two opposite sides of each accommodating hole 12".

Figure 19:
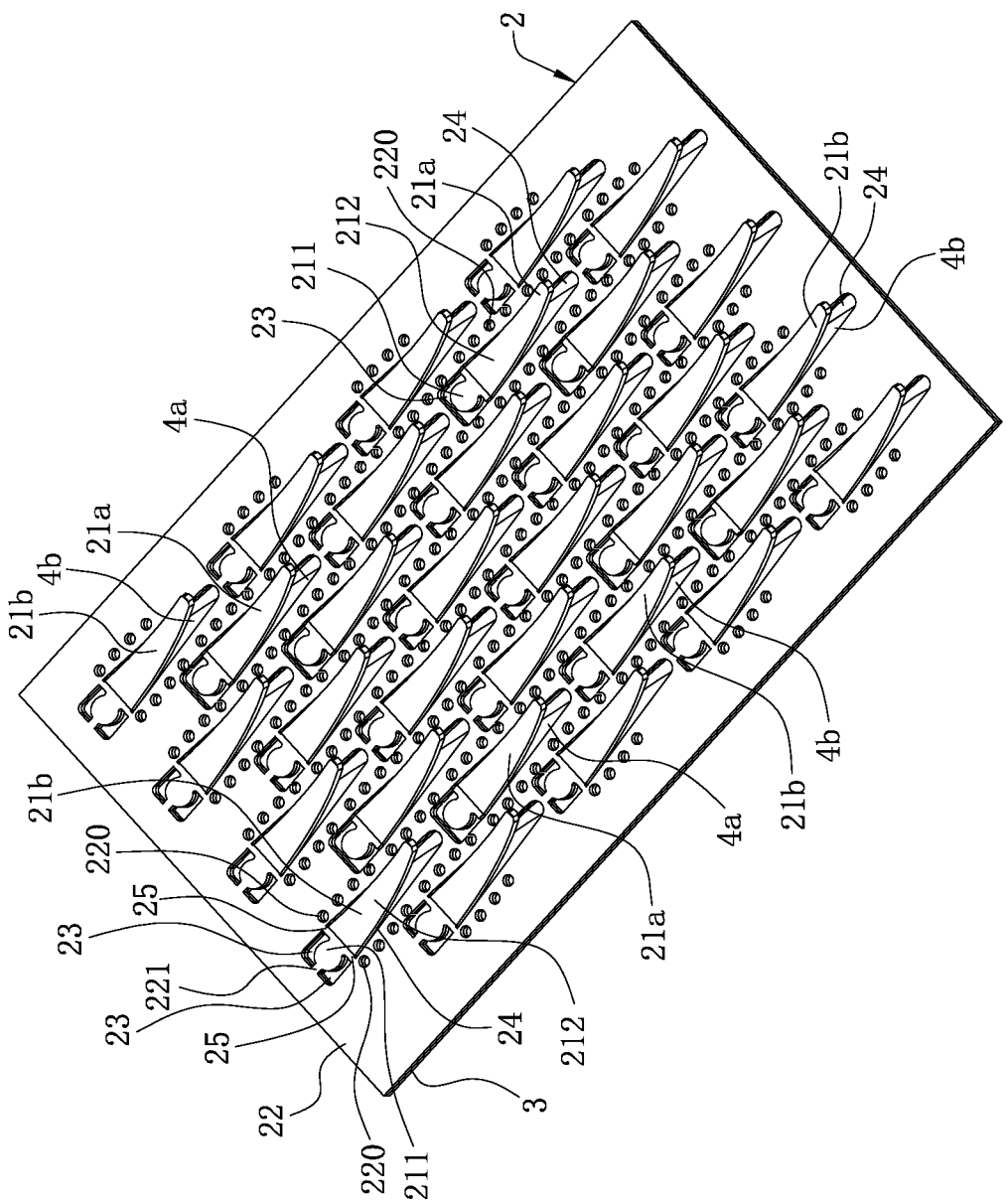
FIG. 19 is a perspective view of a metal plate of FIG. 18 after the manufacturing of the electrical connector is complete.
Figure 20:
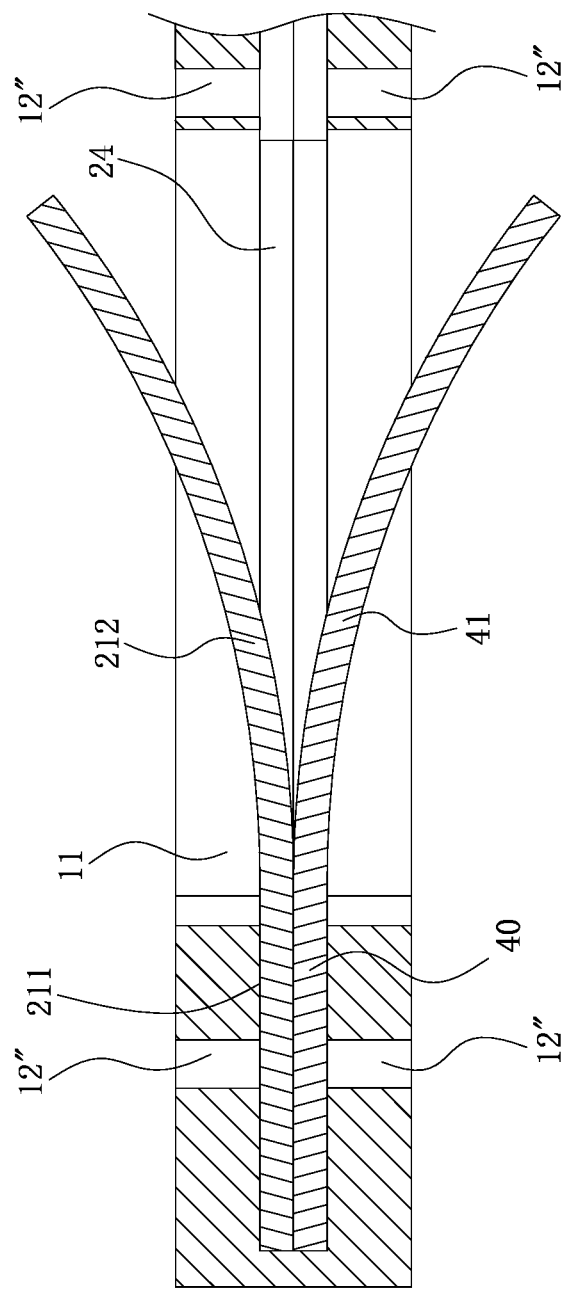
FIG. 20 is a sectional view of FIG. 17 along the C-C direction.

Referring to FIG. 19, the terminals 21 include a plurality of signal terminals 21a and a plurality of ground terminals 21b. The signal terminals 21a are separated from each other, and the ground terminals 21b are connected together through the conductive plate 22. In other embodiments, the ground terminals 21b may be separated from each other. The elastic arm 212 is exposed in the corresponding through hole 11, and the elastic arm 212 bends upward and extends upward out of the insulating body 1. The base portion 212 is horizontally flat plate shaped and is coplanar to the conductive plate 22.

Figure 14:
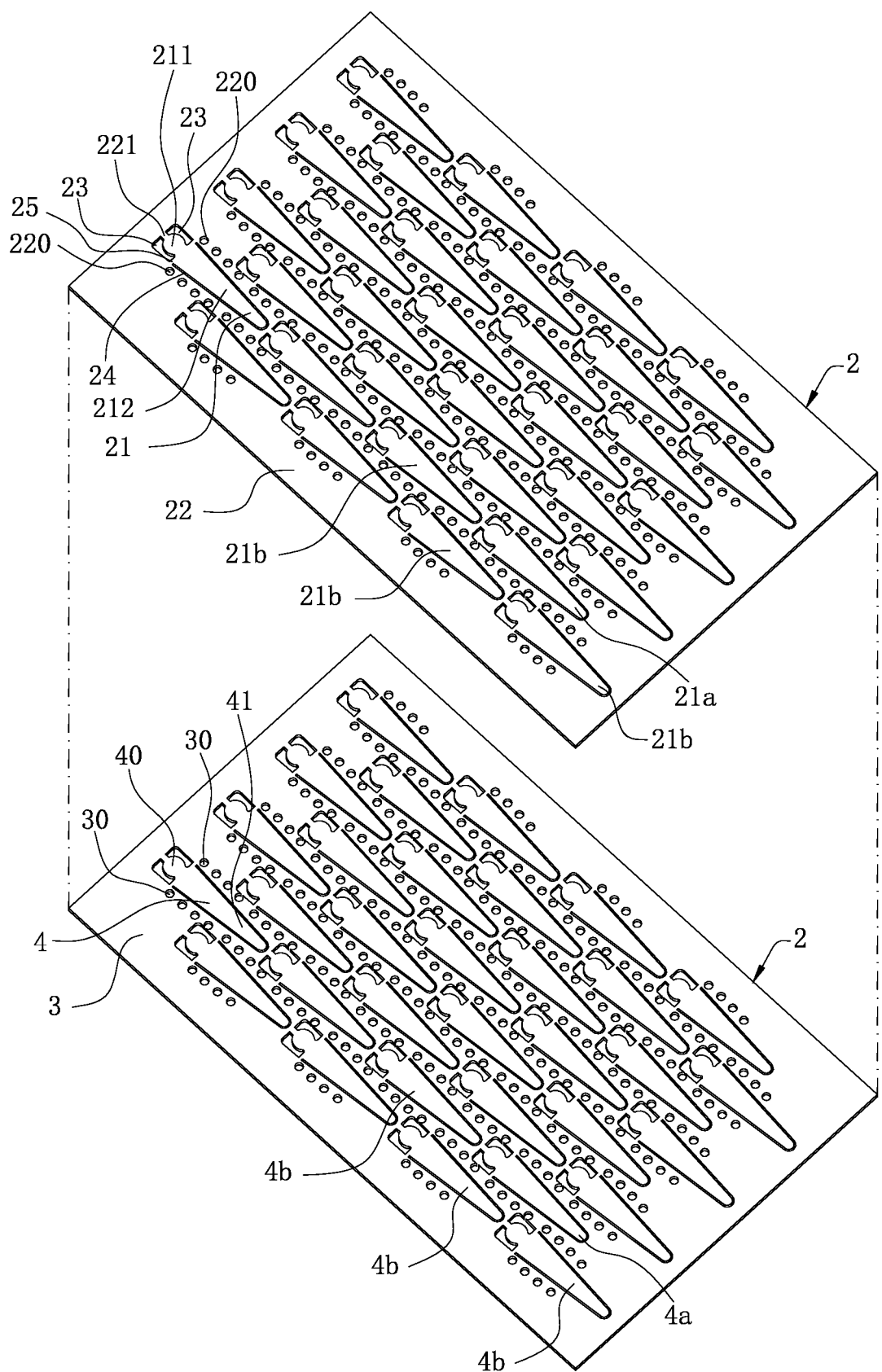
FIG. 14 is a schematic view of a step 1 of a method of manufacturing an electrical connector according to a third embodiment of the present invention.
Figure 21:
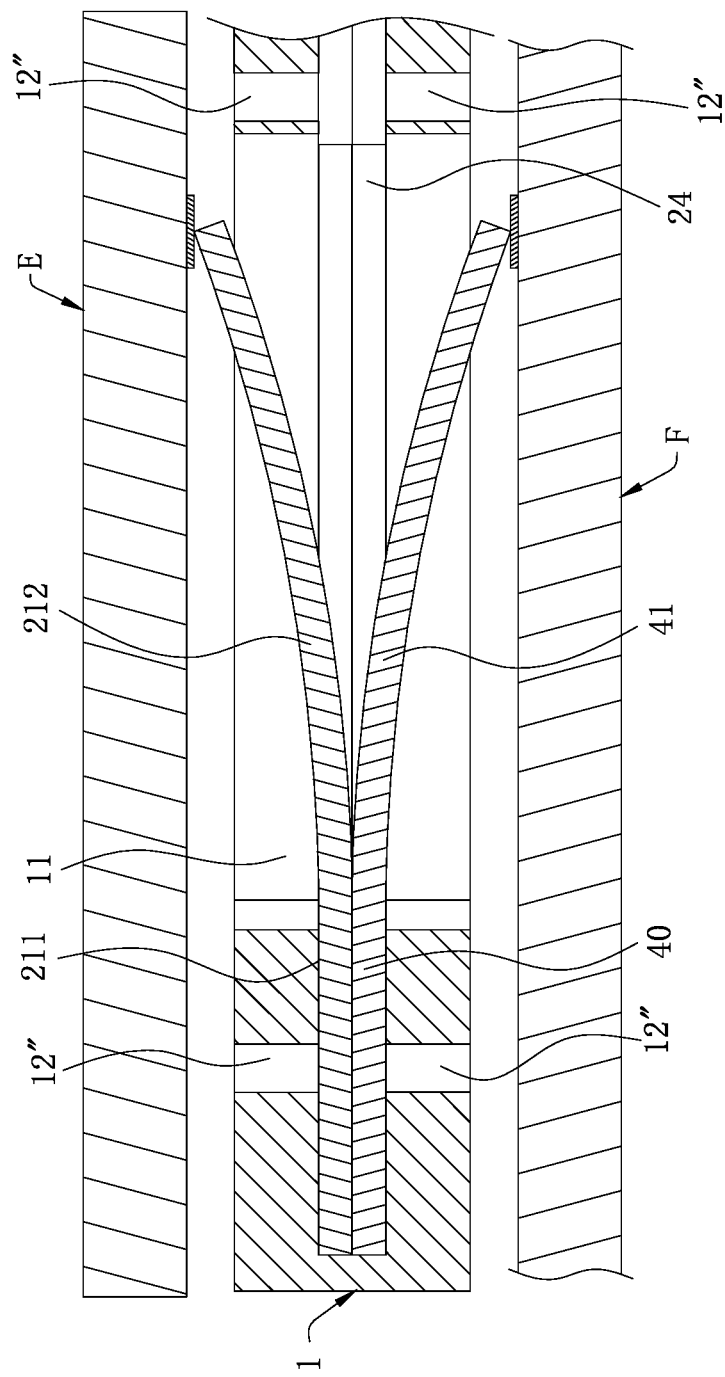
FIG. 21 is a sectional view of the electrical connector of FIG. 20 connecting a first mating component and a second mating component.
Figure 22:
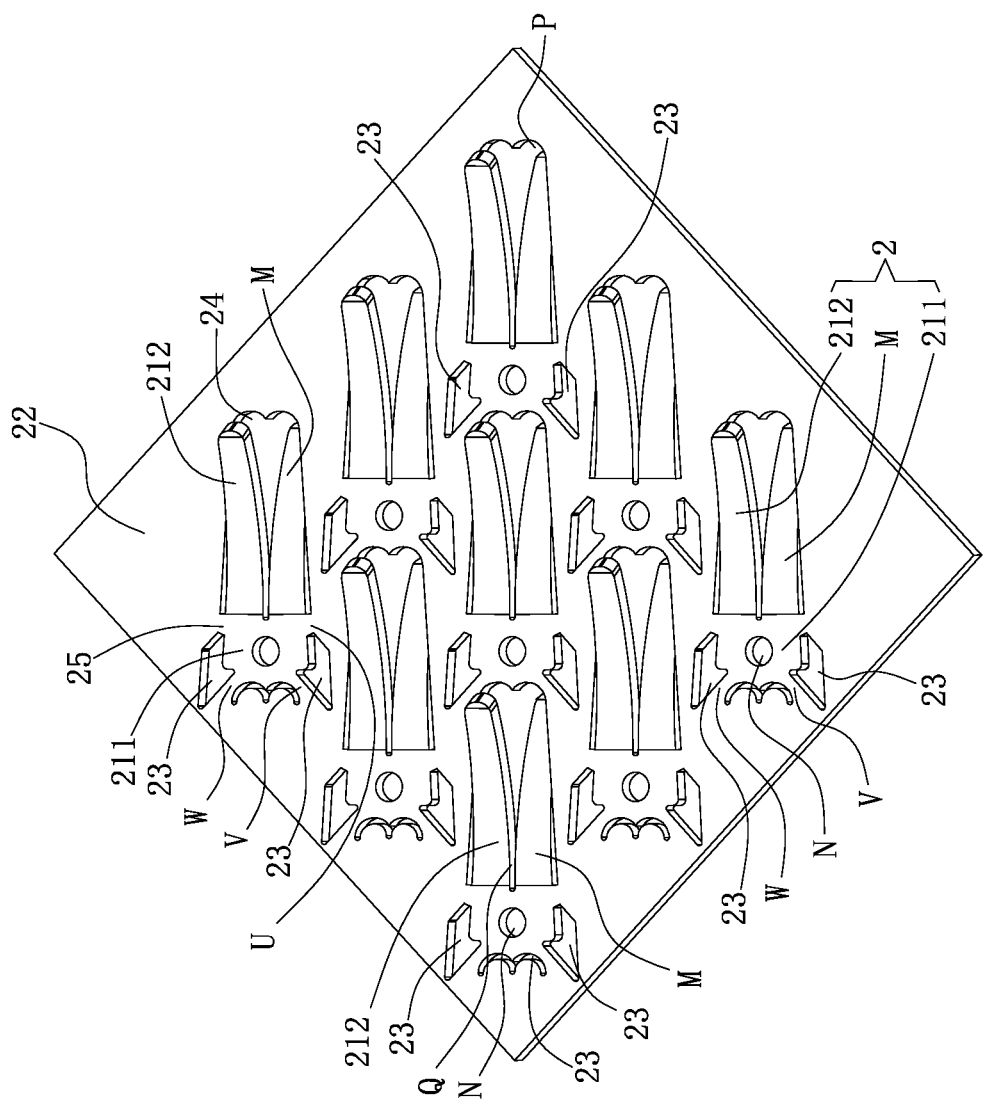
FIG. 22 is a perspective view of terminals and a conductive plate formed by cutting a metal plate according to a fourth embodiment of the present invention.

Referring to FIG. 14, FIG. 19 and FIG. 21, in this embodiment, the lower terminals 4 are correspondingly provided to be vertically symmetrical to the terminals 21, and the structures of each lower terminal 4 is identical to the structures of each terminal 21. In other embodiments, the structures of each lower terminal 4 may be different from the structures of each terminal 21. The lower terminals 4 include a plurality of lower signal terminals 4a and a plurality of lower ground terminals 4b. The lower ground terminals 4b are integrally connected to the metal sheet 3. The main body portion 40 and the corresponding base portion 211 are laser soldered. The conductive portion 41 is formed by bending downward and extending from the main body portion 40, and the conductive portion 41 elastically abuts an upper surface of the second mating component F.

Referring to FIG. 14 and FIG. 16, by cutting the base portion 211, a cutting slot 23 is formed between the base portion 211 and the conductive plate 22. The cutting slot 23 is filled by the insulating body 1, a portion of the cutting slot 23 is exposed in the corresponding through hole 11, and the portion of the cutting slot 23 being exposed in the corresponding through hole 11 is filled by the protruding portions 10. By cutting the elastic arm 212, a through slot 24 is formed between the conductive plate 22 and the elastic arm 212. The through slot 24 is U-shaped. The through slot 24 is not filled by the insulating body 1, an edge of the corresponding through hole 11 is separated from the through slot 24 (in other words, a partial area 220 of the conductive plate 22 connected to the through slot 24 is exposed in the corresponding through hole 11), and the through slot 24 is exposed in the corresponding through hole 11. The conductive plate 22 has a plurality of upper bonding holes 220, and the metal sheet 3 has a plurality of lower bonding holes 30 corresponding to the upper bonding holes 220. The upper bonding holes 220 and the lower bonding holes 30 align vertically. The insulating body 1 is filled in the upper bonding holes 220 and the lower bonding holes 30. Some of the upper bonding holes 220 are in communication with the cutting slot 23.

Referring to FIG. 19, the through slot 24 and the cutting slot 23 surrounding each signal terminal 21a are in communication, such that the signal terminals 21a are separated from each other, thus effectively preventing the signal terminals 21a from short-circuiting. The location of the elastic arm 212 is defined as the front, and the location of the base portion 211 is defined as the rear. In this embodiment, the cutting slot 23 surrounding each ground terminal 21b is divided into left and right portions, and the conductive plate 22 is provided with an extending portion 221 between the left and right portions. The extending portion 221 is integrally connected to the base portion 211 of the corresponding ground terminal 21b. The metal plate 2 forms two connecting portions 25 between the through slot 24 and the cutting slot 23 of each ground terminal 21b, such that the through slot 24 and the cutting slot 23 surrounding each ground terminal 21b are not in communication. The connecting portions 25 are integrally connected to the elastic arm 212 of the corresponding ground terminal 21b, and the two connecting portions 25 are located at two opposite sides of the corresponding elastic arm 212. Thus, the ground terminals 21b are connected together through the conductive plate 22.

The method of manufacturing the electrical connector according to the third embodiment of the present invention includes the following steps:

Step 1: referring to FIG. 14, two metal plates 2 are provided. A laser (not shown, same below) is used to cut a plurality of terminals 21 on one metal plate 2. For each terminal 21, after cutting the base portion 211, the cutting slot 23 is formed on the metal plate 2. An extending portion 221 integrally connected to the base portion 211 is formed on the metal plate 2 between the left and right portions of the cutting slot 23. After cutting the elastic arm 212, the through slot 24 is formed on the metal plate 2, and the through slot 24 is U-shaped. A connecting portion 25 integrally connected to the elastic arm 212 is formed on the metal plate 2 between the cutting slot 23 and the through slot 24. The laser (not shown, same below) is used to cut a plurality of lower terminals 4 on the other metal plate 2. The shape of each lower terminal 4 being cut is identical to the shape of each terminal 21. Further, a plurality of upper bonding holes 220 and a plurality of lower bonding holes 30 are cut on the two metal plates 2. After cutting the elastic arm 212 and the conductive portion 41, the elastic arm 212 bends upward, and the conductive portion 41 bends downward.

Figure 15:
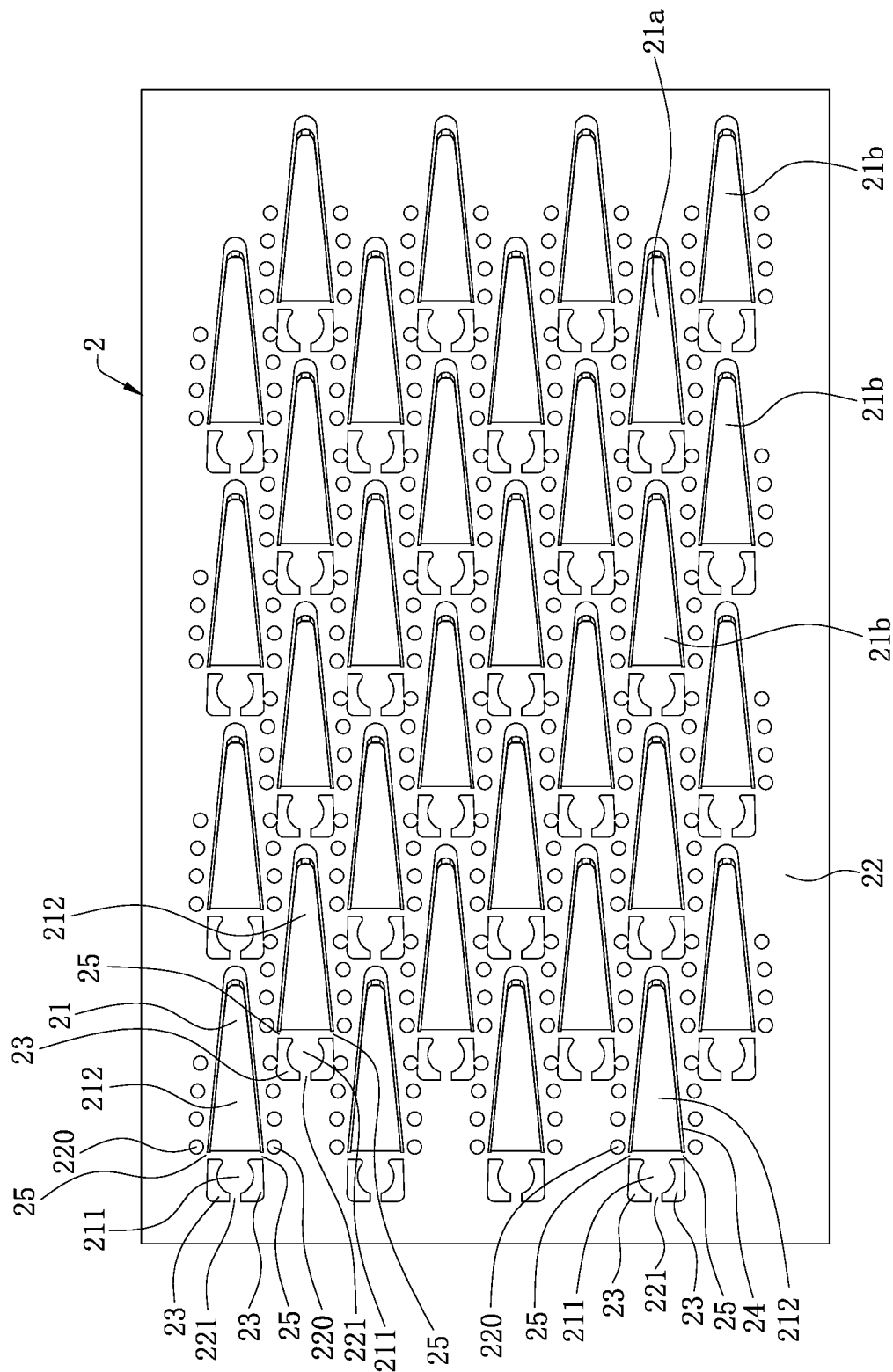
FIG. 15 is a schematic view of a step 2 of the method of manufacturing an electrical connector according to the third embodiment of the present invention.

Step 2: referring to FIG. 15, the two metal plates 2 are fixed together by laser soldering (or, in other embodiments, may be fixed by other methods), such that the terminals 21 are provided to be symmetrical to the lower terminals 4.

Step 3: referring to FIG. 16 and FIG. 18, a mold (not shown, same below) is provided. The mold is provided with a plurality of upper engaging members and a plurality of lower engaging members (not shown, same below). Each elastic arm 212 is pressed downward from top thereof by a corresponding upper engaging member. The length and width of the elastic arm 212 are less than those of each upper engaging member. The corresponding upper engaging member covers the upper surface of the elastic arm 212 and also covers a portion of the cutting slot 23 and the connecting portion 25. Each conductive portion 41 is abutted by a corresponding lower engaging member. The length and width of the conductive portion 41 are less than those of each lower engaging member. The corresponding lower engaging member covers the upper surface of the conductive portion 41 and also cover a portion of the cutting slot 23 and the connecting portion 25. The mold is further provided with a plurality of pairs of protruding posts (not shown, same below). The protruding posts vertically clamp the extending portions 221. The length and width of each protruding post are greater than those of the extending portion 221, and the protruding posts cover a portion of the cutting slot 23. Then, a plastic material is injected to the metal plates 2 and the metal sheet 3, thereby forming the insulating body 1 on the two metal plates 2 by insert-molding. The insulating body 1 is filled in the cutting slot 23, and the insulating body 1 covers the base portion 211 and the main body portion 40. The insulating body 1 is formed with the through holes 11 and the accommodating holes 12". The elastic arm 212 and the conductive portion 41 are exposed in a corresponding through hole 11. Further, a portion of the cutting slot 23 and the connecting portion 25 are exposed in the corresponding through hole 11, and the extending portion 221 and a portion of the cutting slot 23 are exposed in the corresponding accommodating hole 12", such that in the subsequent step of cutting the connecting portion 25 and the extending portion 221, the connecting portion 25 and the extending portion 221 may be cut clean, thus preventing the signal terminals 21a from being connected together and short-circuiting.

Figure 17:
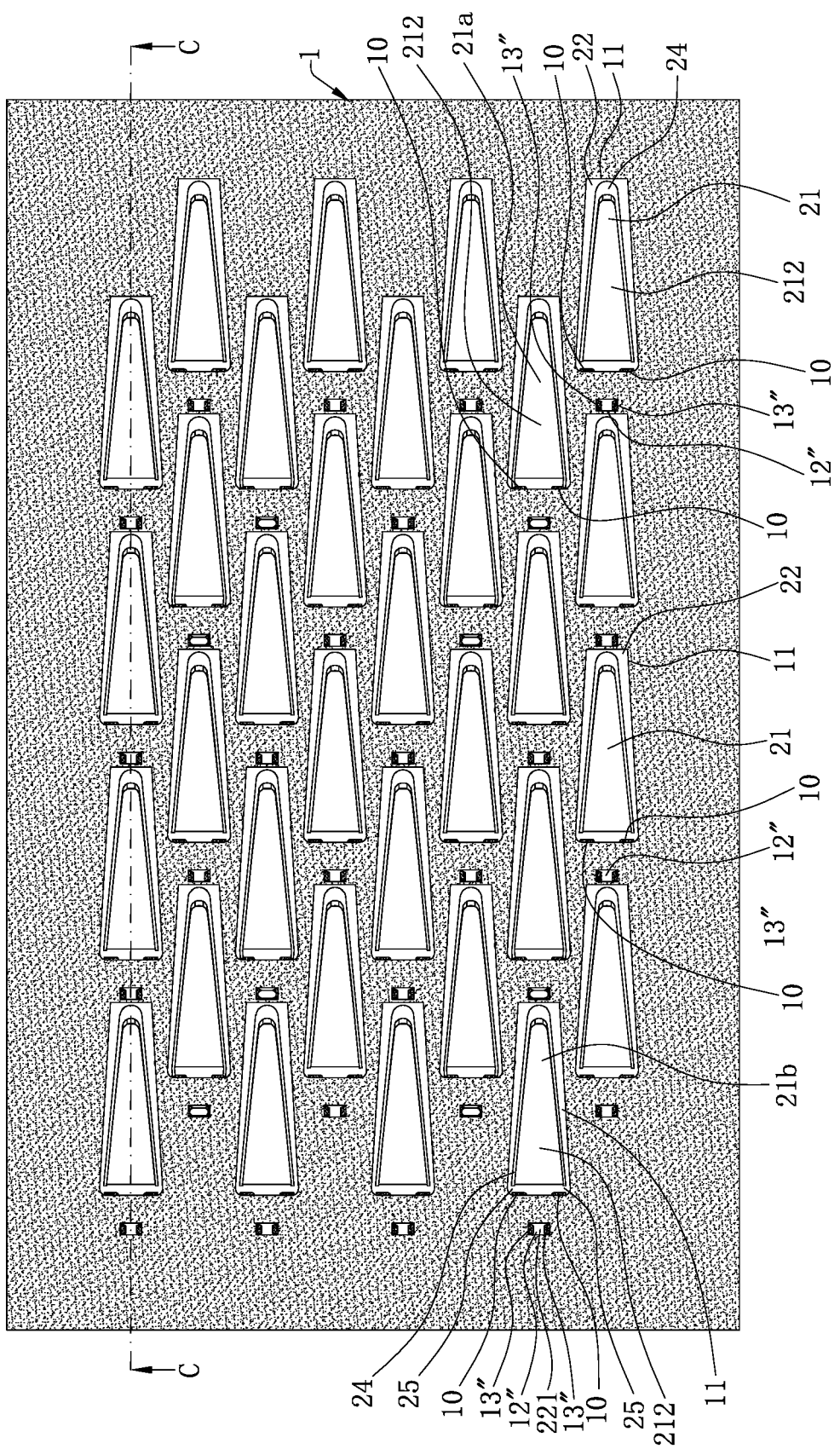
FIG. 17 is a schematic view of a step 4 of the method of manufacturing an electrical connector according to the third embodiment of the present invention.
Figure 18:
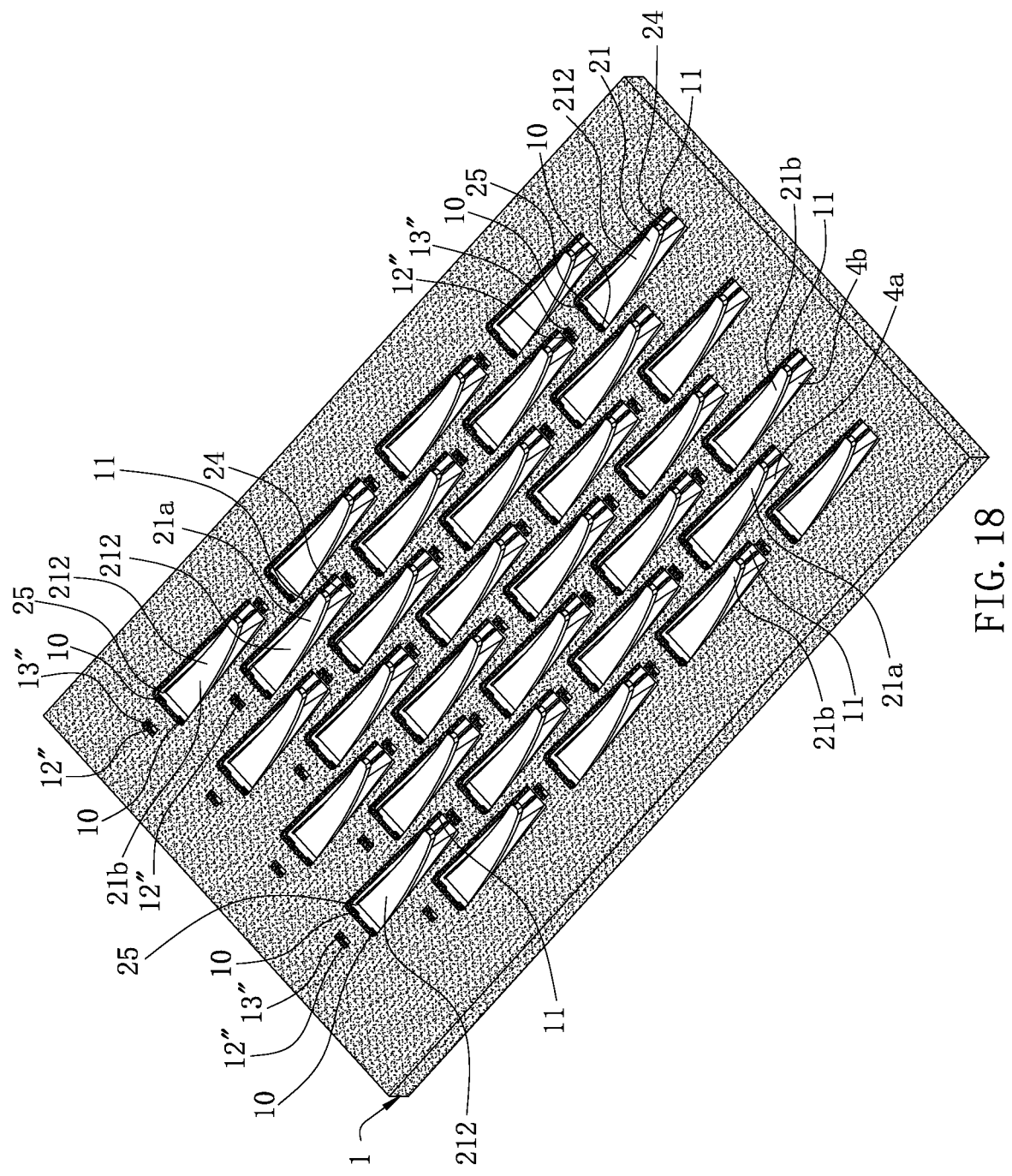
FIG. 18 is a perspective view of the electrical connector of FIG. 17 after the manufacturing of the electrical connector is complete.

Step 4: referring to FIG. 17 and FIG. 18, the laser is used to cut the connecting portion 25 integrally connected to each signal terminal 21a, such that the cutting slot 23 and the through slot 24 surrounding each signal terminal 21a are in communication, and to cut the extending portion 221 integrally connected to each signal terminal 21a, such that the signal terminals 21a are separated from each other. The connecting portion 25 and the extending portion 221 integrally connected to each ground terminal 21b are maintained, such that the cutting slot 23 and the through slot 24 surrounding each ground terminal 21b are not in communication, and the cutting slot 23 is divided into the left and right portions, thereby allowing the ground terminals 21b to be connected together through the connecting portion 25 and the extending portion 221.

FIG. 22 to FIG. 26 show an electrical connector according to a fourth embodiment of the present invention. The electrical connector includes an insulating body 1, a plurality of terminals 21 accommodated in the insulating body 1 and a conductive plate 22 accommodated in the insulating body 1. The terminals 21 and the conductive plate 22 are altogether formed by cutting from a metal plate 2.

Figure 25A:
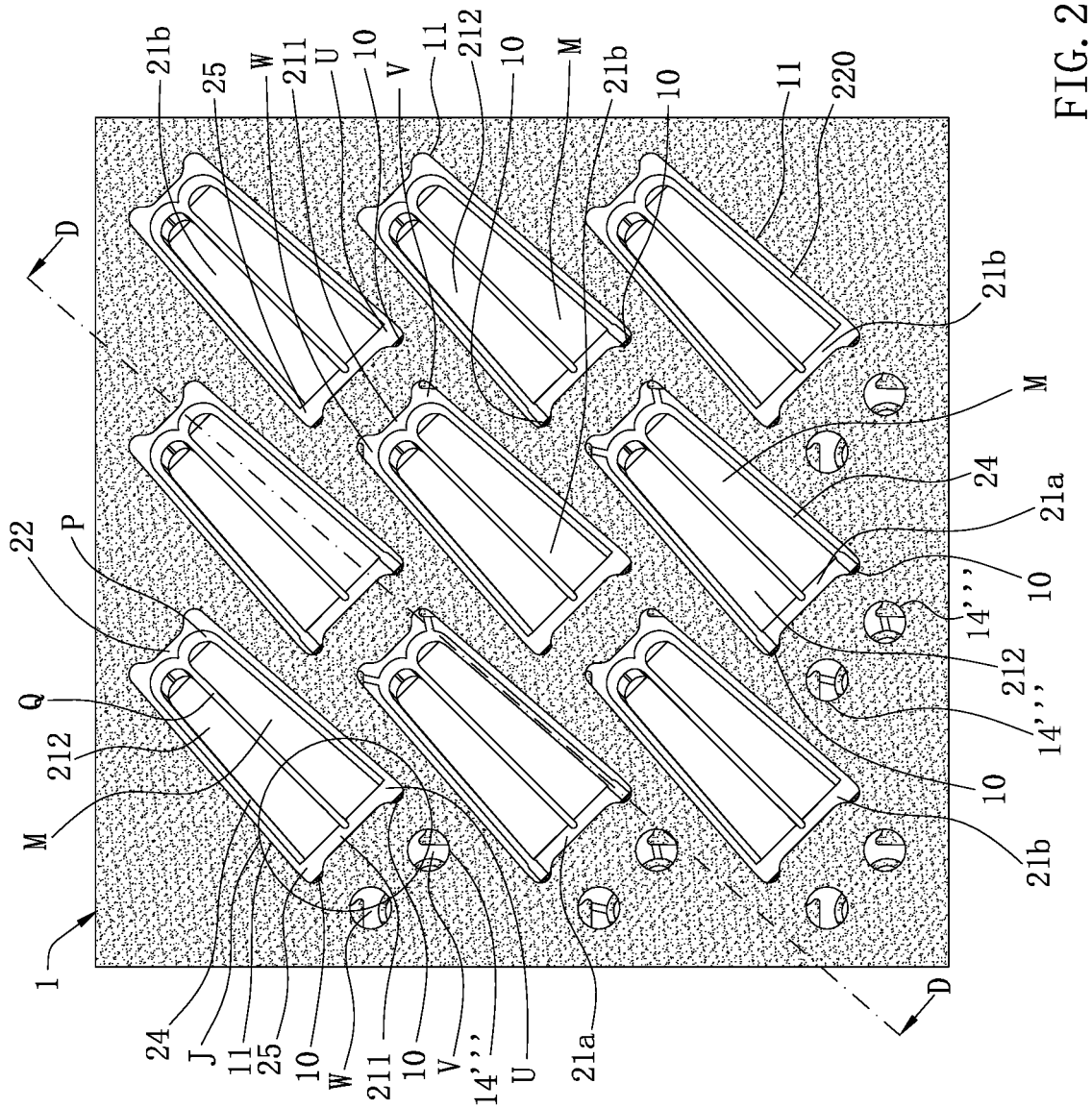
FIG. 25A is a schematic view of FIG. 24 after cutting a portion of the connecting portion.
Figure 26:
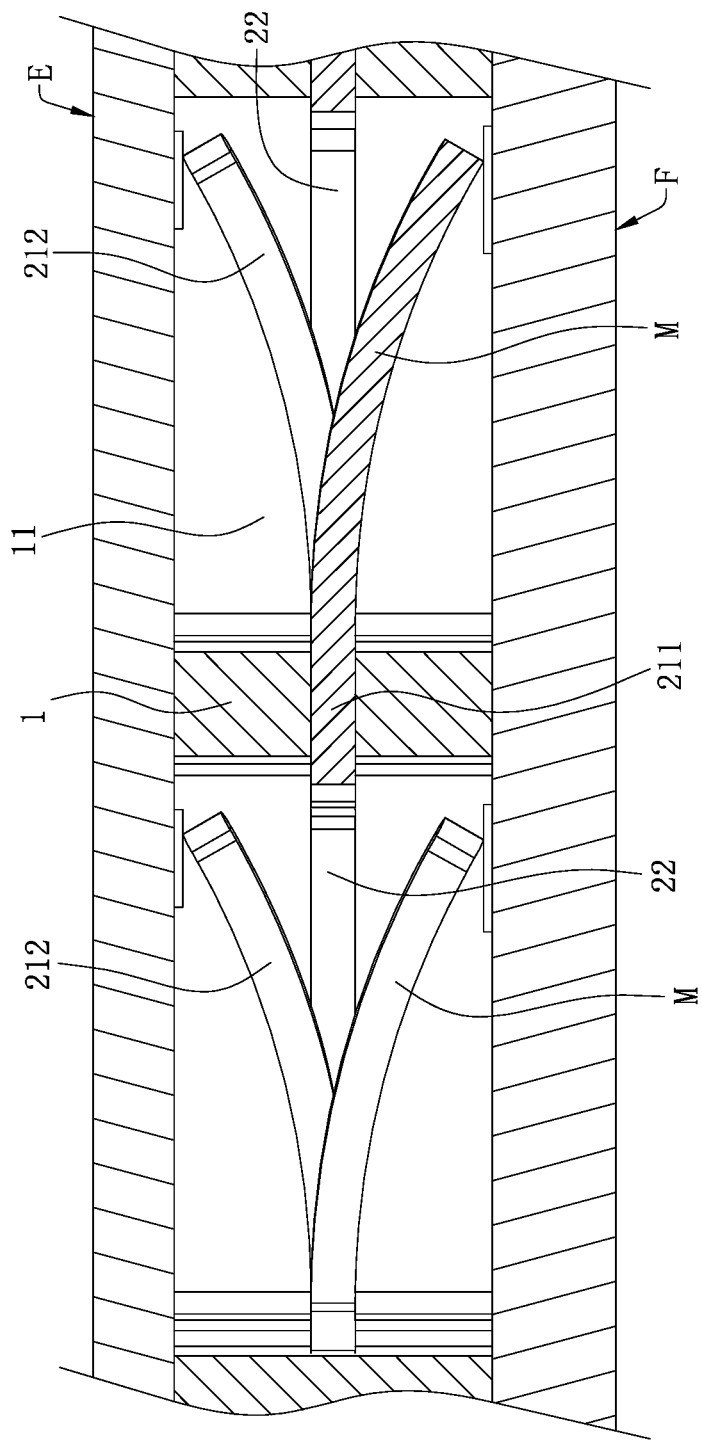
FIG. 26 is a partial sectional view of FIG. 25A sectioned along the D-D direction.

Referring to FIG. 25A and FIG. 26, the insulating body 1 is provided with a plurality of through holes 11. Each through hole 11 runs vertically through the insulating body 1. The insulating body 1 further has a plurality of protruding portions 10 provided at the edges of the through holes 11, and each through hole 11 is corresponding provided with two protruding portions 10. The two protruding portions 10 are located at two opposite sides of the rear edge of each through hole 11, and protrude toward each through hole 11 from a side surface of each through hole 11.

Figure 24:
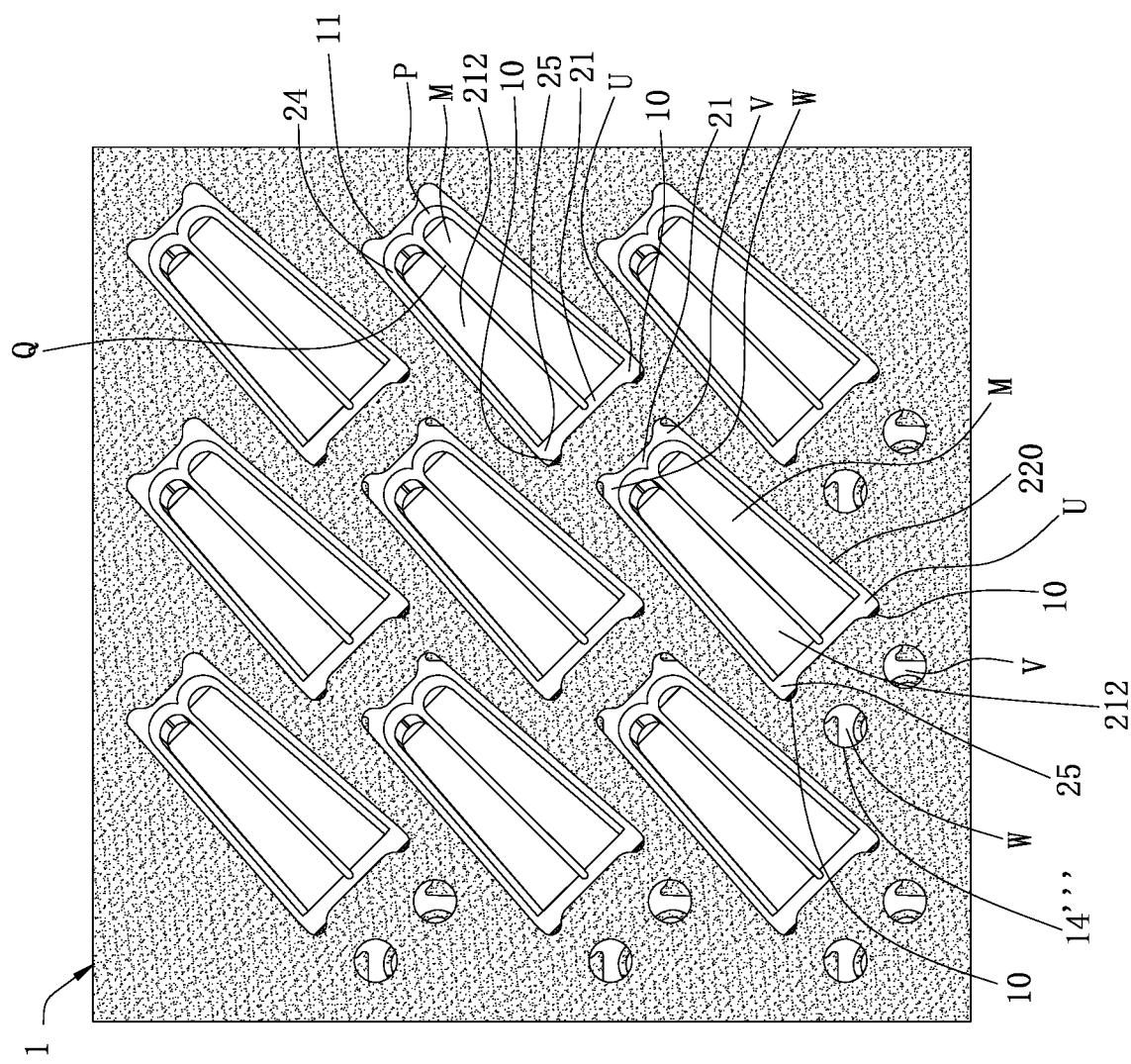
FIG. 24 is a schematic view of an insulating body insert-molded on the terminals and the conductive plate as shown in FIG. 23.

Referring to FIG. 24 and FIG. 26, each terminal 21 has a base portion 211, and an elastic arm 212 and a conductive portion M bending and extending respectively from a front end of the base portion 211. The elastic arm 212 bends and extends upward, and the conductive portion M bends and extends downward. A large portion of the base portion 211 is covered by the insulating body 1 between two adjacent through holes 11. The base portion 211 has a hole N. The hole N runs vertically through the base portion 211. The insulating body 1 enters the hole N to be vertically in communication, such that the base portion 211 is fixed to the insulating body 1. The elastic arm 212 and the conductive portion M of the same terminal 21 are exposed in a same corresponding through hole 11. Further, the elastic arm 212 protrudes upward out of the corresponding through hole 11 to be in contact with the first mating component E, and the conductive portion M protrudes downward out of the corresponding through hole 11 to be in contact with the second mating component F. Viewing downward from a top thereof, the elastic arm 212 and the conductive portion M are provided side by side in a left-right direction, and the two protruding portions 10 are located at two opposite sides of the elastic arm 212 and the conductive portion M.

Referring to FIG. 25A and FIG. 26, in the same terminal 21, the elastic arm 212 and the conductive portion M located at the front end of the base portion 211 and the rear end of the base portion 211 are correspondingly exposed in different through holes 11. In two terminals 21 adjacent to each other in a front-rear direction, the rear end of the base portion 211 of the terminal 21 located in front thereof and the elastic arm 212 and the conductive portion M of the terminal 21 located therebehind are exposed in a same through hole 11.

Referring to FIG. 25A, the terminals 21 include a plurality of signal terminals 21a and a plurality of ground terminals 21b. The signal terminals 21a are separated from each other, and the ground terminals 21b are connected together through the conductive plate 22. In other embodiments, the ground terminals 21b may be separated from each other.

Referring to FIG. 22 to FIG. 26, the conductive plate 22 is horizontally provided. Similar to the above-mentioned embodiments, the base portion 211 is coplanar to the conductive plate 22. By cutting the base portion 211, a plurality of cutting slots 23 are formed between the base portion 211 and the conductive plate 22. The cutting slots 23 are located around the corresponding base portion 211 and are separated from each other. In this embodiment, each of most of the terminals 21 corresponds to two cutting slots 23, and the two cutting slots 23 extend backward relative to the base portion 211 to pass beyond the through hole 11 therebehind, and extend leftward or rightward to be wing shaped. Each of some of the terminals 21 located at the edge thereof is further correspondingly provided with a third cutting slot 23, and this third cutting slot 23 extends between the two cutting slots 23. The cutting slots 23 are filled by the insulating body 1. A front end and a rear end of each of the two cutting slots 23 are exposed in two through holes 11, and the front end of each of the two cutting slots 23 being exposed in the corresponding through hole 11 is filled by the protruding portions 10. By cutting the elastic arm 212, a through slot 24 is formed between the conductive plate 22 and the elastic arm 212, and by cutting the conductive portion M, a separation slot P is formed between the conductive plate 22 and the conductive portion M. The elastic arm 212 and the conductive portion M are separated from each other, and a gap Q is formed between the elastic arm 212 and the conductive portion M. Referring to FIG. 25B, the gap Q is located in front of the protruding portions 10. Viewing downward from a top thereof, the through slot 24 and the gap Q surround the elastic arm 212, and the edge of the corresponding through hole 11 is separated from the through slot 24; the separation slot P and the gap Q surround the conductive portion M, and the edge of the corresponding through hole 11 is separated from the separation slot P. In other words, a partial area 220 of the conductive plate 22 surrounding the through slot 24 and the separation slot P is exposed in the corresponding through hole 11. A front end of the through slot 24 and a front end of the separation slot P extend to be between the two cutting slots 23 located in front thereof. The gap Q is located in front of the protruding portions 10. Since the plastic fills in the cutting slots 23 to form the protruding portions 10 in the insert-molding process, the gap Q is located in front of the portions of the cutting slots 23 being exposed in the corresponding through hole 11. In short, for a same terminal 21, the through slot 24, the separation slot P and the gap Q are all located in front of the cutting slots 23.

Referring to FIG. 23 to FIG. 25A, the ground terminals 21b include two adjacent ground terminals 21b in the front-rear direction. For description purposes, the two adjacent ground terminals 21b includes a front ground terminal and a rear ground terminal. It should be noted that, for each ground terminal 21b, a set of two adjacent ground terminals 21b may be by the ground terminal 21b and another ground terminal 21b in front thereof, such that the ground terminal 21b functions as a rear ground terminal, and the ground terminal 21b in front thereof functions as a front ground terminal. On the other hand, another set of two adjacent ground terminals 21b may be by the ground terminal 21b and another ground terminal 21b therebehind, such that the ground terminal 21b functions as a front ground terminal, and the ground terminal 21b therebehind functions as a rear ground terminal. In other words, the same ground terminal 21b may simultaneously function as the rear ground terminal in one set of two adjacent ground terminals 21b and function as the front ground terminal in another set of two adjacent ground terminals 21b.

Referring to FIG. 23 to FIG. 25A, the metal plate 2 forms a connecting portion 25 between the through slot 24 and one of the cutting slots 23 corresponding to a same ground terminal 21b, such that the cutting slot 23 is not in communication with the through slot 24 located in front thereof. The connecting portion 25 is connected to the elastic arm 212 of the ground terminal 21b. The metal plate 2 forms a first bridging portion U between the separation slot P and the other cutting slot 23 corresponding to the same ground terminal 21b, such that the other cutting slot 23 is not in communication with the separation slot P in front thereof. The first bridging portion U is connected to the conductive portion M of the ground terminal 21b. The connecting portion 25 and the first bridging portion U are located at two opposite sides of the elastic arm 212 and the conductive portion M.

Figure 23:
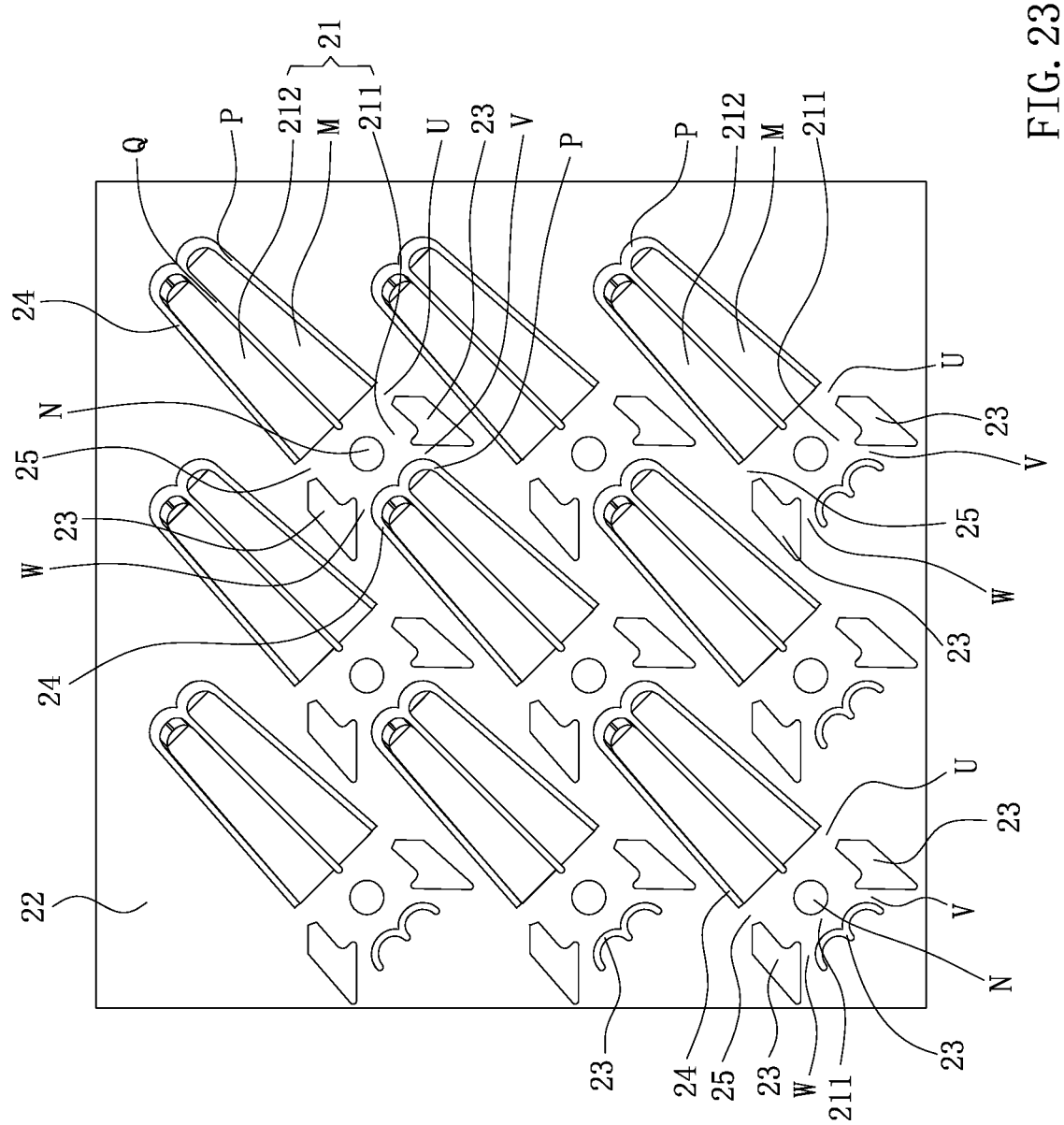
FIG. 23 is a top view of FIG. 22 being rotated for a certain angle.

Referring to FIG. 23 and FIG. 25A, the metal plate 2 forms a second bridging portion V between one of the cutting slots 23 corresponding to one ground terminal 21b''' (i.e., a front ground terminal of the two adjacent ground terminals 21b) and the separation slot P corresponding to the ground terminals 21b located therebehind (i.e., the rear ground terminal of the two adjacent ground terminals 21b), such that the cutting slot 23 corresponding to the front rear terminal is not in communication with the separation slot P located therebehind (i.e., the separation slot P corresponding to the rear ground terminal). The second bridging portion V is connected to the rear end of the base portion 211 of the ground terminal 21b. The metal plate 2 forms a third bridging portion W between the other of the cutting slots 23 corresponding to one ground terminal 21b (i.e., a front ground terminal of the two adjacent ground terminals 21b) and the through slot 24 corresponding to the ground terminals 21b located therebehind (i.e., the rear ground terminal of the two adjacent ground terminals 21b), such that the cutting slot 23 corresponding to the front ground terminal is not in communication with the through slot 24 located therebehind (i.e., the through slot 24 corresponding to the rear ground terminal). The third bridging portion W is connected to the rear end of the base portion 211 of the ground terminal 21b.

Referring to FIG. 25A, for a same ground terminal 21b, the elastic arm 212 is connected to the conductive plate 22 through the connecting portion 2, the conductive portion M is connected to the conductive plate 22 through the first bridging portion U, and the rear end of the base portion 211 is connected to the conductive plate 22 through the second bridging portion V and the third bridging portion W. The ground terminals 21b are connected together through the conductive plate 22.

Referring to FIG. 25A, for a same ground terminal 21b, the connecting portion 2 and the third bridging portion W are exposed in different through holes 11, and the first bridging portion U and the second bridging portion V are exposed in different through holes 11.

Referring to FIG. 25A, on the other hand, to prevent the signal terminals 21a from short-circuiting, the through slot 24, the separation slot P and the cutting slots 23 surrounding each signal terminal 21a are in communication. That is, the connecting portion 25, the first bridging portion U, the second bridging portion V; and the third bridging portion W do not exist around each signal terminal 21a. In other embodiments, the ground terminals 21b may be separated from each other.

Referring to FIG. 24 and FIG. 25A, the edge of the insulating body 1 has a plurality of cutting holes 14'''. The locations of the cutting holes 14''' correspond to the second bridging portions V and the third bridging portions W at the edge thereof, and the cutting holes 14''' run vertically through the insulating body 1, such that the second bridging portions V and the third bridging portions W at the edge thereof are exposed in the cutting holes 14'''.

Referring to FIG. 22 to FIG. 26, the major steps of the method of manufacturing the electrical connector according to the fourth embodiment of the present invention are similar to the methods according to the embodiments as discussed above, and is described as follows. Step 1: the terminals 21, a conductive plate 22 and a strip are cut on the metal plate 2, and the elastic arm 212 and the conductive portion M of each terminal 21 are arranged side by side in the left-right direction. In two adjacent terminals 21, the rear end of the base portion 211 of the terminal 21 located in front thereof and the elastic arm 212 and the conductive portion M of the terminal 21 located therebehind are exposed in a same through hole 11. Step 2: the insulating body 1 is inserted-molded on the terminals 21 and the conductive plate 22. Step 3: the connecting portion 25, the first bridging portion U, the second bridging portions V and the third bridging portions W between each signal terminal 21a and the conductive plate 22 are cut. Step 4: the strip is removed. In this embodiment, the step of bending the elastic arm 212 and the conductive portion M, such that the elastic arm 212 bends upward and the conductive portion M bends downward is provided in the step 1. In other embodiments, this bending step may be provided between the step 3 and the step 4.

FIG. 27 to FIG. 32 show an electrical connector according to a fifth embodiment of the present invention. The electrical connector is used to electrically connect a first mating component E and a second mating component F. In this embodiment, the first mating component E is a chip module, and the second mating component F is a circuit board. In other embodiments, the first mating component E may be a circuit board, and the second mating component F may not be a circuit board. The electrical connector includes an insulating body 1; a plurality of terminals 21 and a conductive plate 22, altogether formed by cutting from a metal plate 2; and a metal sheet 3 and a plurality of lower terminals 4, altogether formed by cutting from another metal plate 2. The insulating body 1, the terminals 21, the conductive plate 22, the lower terminals 4 and the metal sheet 3 are insert-molded. The conductive plate 22 and the metal sheet 3 are respectively horizontally provided and accommodated in the insulating body 1. The metal sheet 3 is located below the conductive plate 22 and is in contact with the conductive plate 22. Each terminal 21 has a base portion 211 and an elastic arm 212 integrally connected to the base portion 211. The elastic arm 212 is used to be in contact with the first mating component E. The location of the elastic arm 212 is defined as the front, and the location of the base portion 211 is defined as the rear. Each lower terminal 4 has a main body portion 40 and a conductive portion 41 integrally connected to the main body portion 40. The main body portion 40 is horizontally flat plate shaped and is coplanar to the metal sheet 3. The conductive portion 41 is downward exposed in the insulating body 1 to abut the second mating component F. In other embodiments, the conductive portion 41 may be used to be soldered to the second mating component F. The main body portion 40 is located below the base portion 211 and is in contact with the base portion 211.

Figure 31:
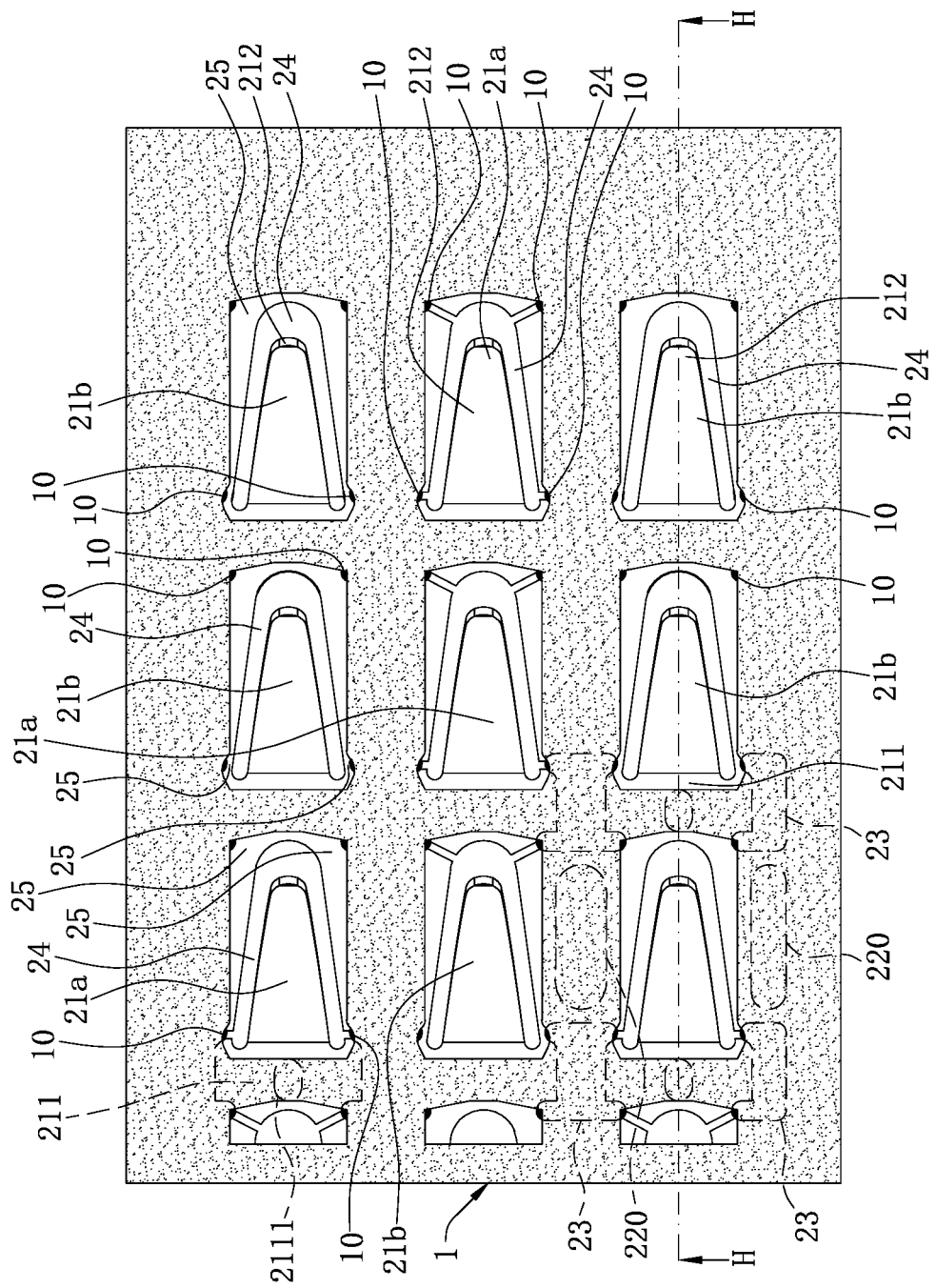

Referring to FIG. 31, the insulating body 1 is provided with a plurality of through holes 11, and the through holes 11 receive the elastic arms 212 of the terminals 21. Each through hole 11 runs vertically through the insulating body 1, and four protruding portions 10 protrude toward each through hole 11 from a side surface of each through hole 11. Two of the four protruding portions 10 are located at a front end of the base portion 211, and the other two of the four protruding portions 10 are located in front of the elastic arm 212. The upper surface of the protruding portion 10 is flush with the upper surface of the conductive plate 22. The lower surface of the protruding portion 10 is flush with the lower surface of the conductive plate 22.

Figure 32:
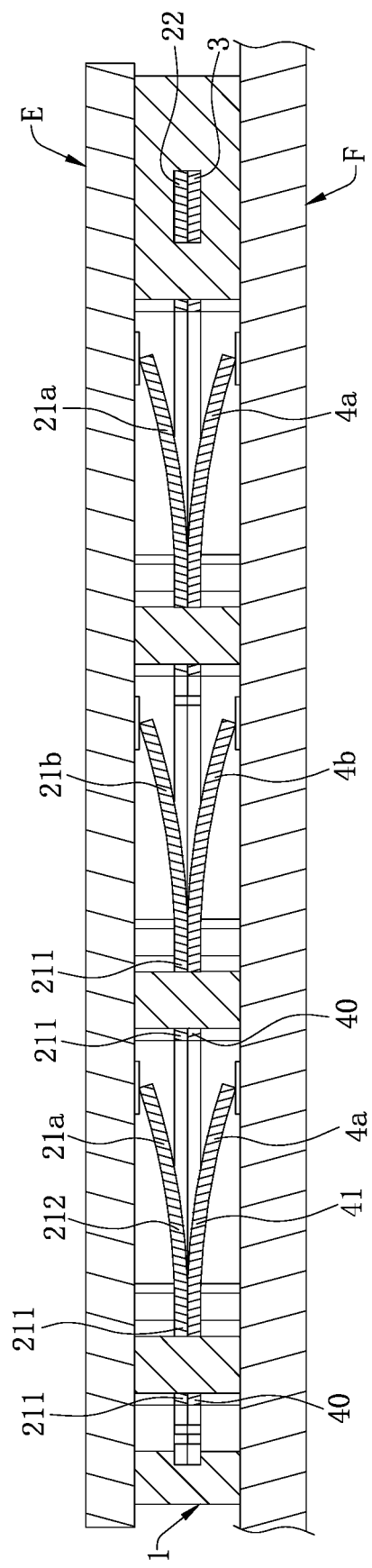
FIG. 32 is a sectional view along the H-H direction after the electrical connector in FIG. 31 is electrically connected with a first mating component and a second mating component.

Referring to FIG. 31 and FIG. 32, the terminals 21 include a plurality of signal terminals 21*a* and a plurality of ground terminals 21*b*. The signal terminals 21*a* are separated from each other, and the ground terminals 21*b* are connected together through the conductive plate 22. In other embodiments, the ground terminals 21*b* may be separated from each other. The elastic arm 212 is exposed in the corresponding through hole 11, and the elastic arm 212 bends upward and extends upward out of the insulating body 1. The base portion 212 is flat plate-shaped and is coplanar to the conductive plate 22.

Figure 27:
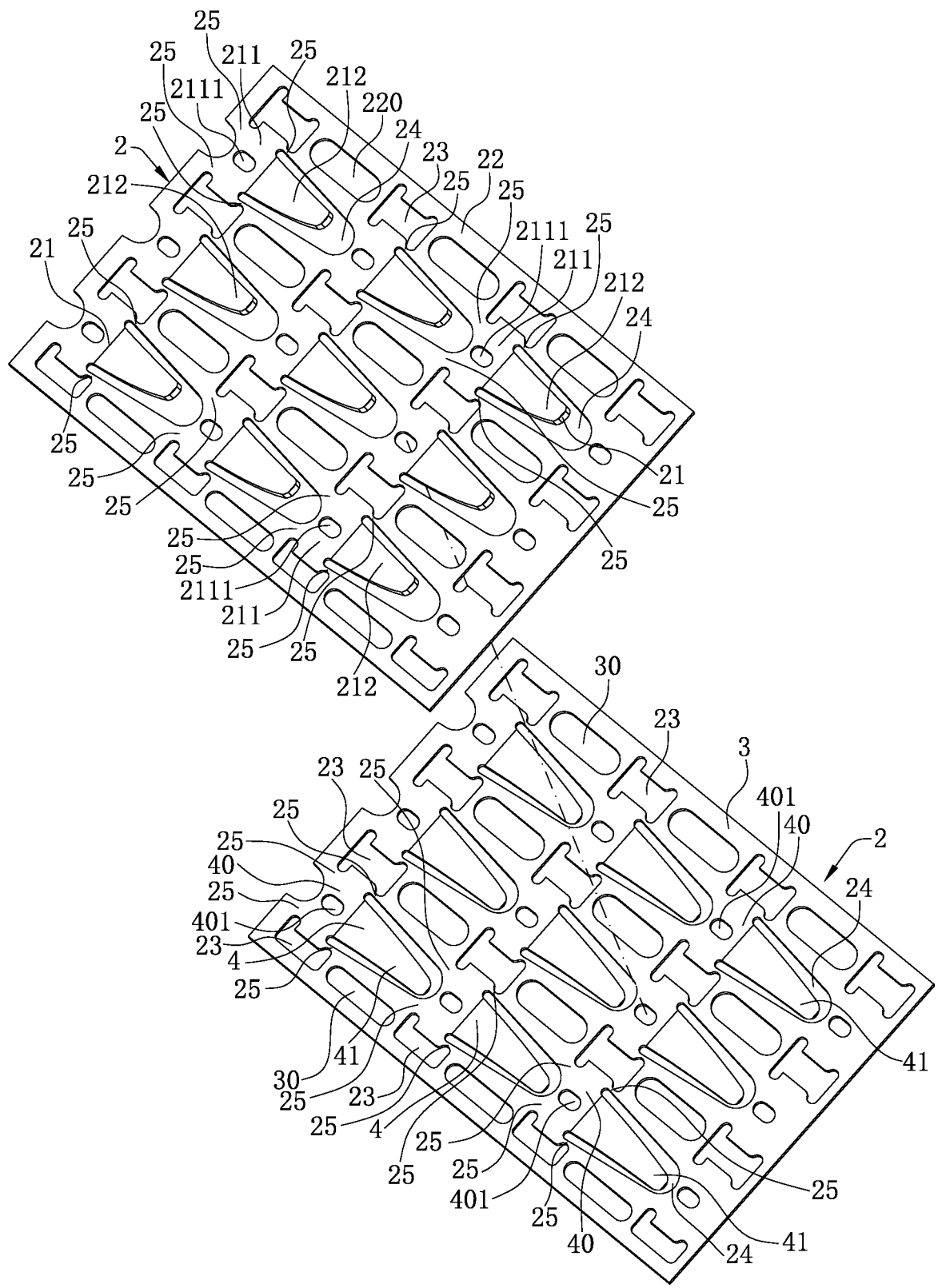
FIG. 27 is a schematic view of a step 1 of a method of manufacturing an electrical connector according to a fifth embodiment of the present invention.

Referring to FIG. 27 and FIG. 32, in this embodiment, the lower terminals 4 are correspondingly provided to be vertically symmetrical to the terminals 21, and the structures of each lower terminal 4 is identical to the structures of each terminal 21. In other embodiments, the structures of each lower terminal 4 may be different from the structures of each terminal 21. The lower terminals 4 include a plurality of lower signal terminals 4*a* and a plurality of lower ground terminals 4*b*. The lower ground terminals 4*b* are integrally connected to the metal sheet 3. The main body portion 40 and the corresponding base portion 211 are electrically connected to each other and can be fixed together by laser soldering, solder welding, or a conductive adhesive. The conductive portion 41 is formed by bending downward and extending from the main body portion 40, and the conductive portion 41 elastically abuts an upper surface of the second mating component F.

Referring to FIG. 27 and FIG. 32, each of the base portions 211 includes an upper fixing hole 2111, and the upper fixing hole 2111 runs vertically through the base portion 211. Each of the main body portions 40 includes a lower fixing hole 401, and the lower fixing hole 401 runs vertically through the main body portion 40. The upper fixing hole 2111 and the lower fixing hole 401 align with each other in the vertical direction, and are filled by the insulating body 1.

Referring to FIG. 27 and FIG. 32, by cutting the base portion 211 and the main body portion 40, two cutting slots 23 are formed between the base portion 211 and the conductive plate 22, and between the main body portion 40 and the metal sheet 3, respectively. The cutting slot 23 receives a part of the insulating body 1, a portion of the cutting slot 23 is exposed in the corresponding through hole 11, and the portion of the cutting slot 23 being exposed in the corresponding through hole 11 receives the protruding portion 10. By cutting the elastic arm 212 and the conductive portion 41, a through slot 24 is formed between the conductive plate 22 and the elastic arm 212, and between the metal sheet 3 and the conductive portion 41, respectively. The through slot 24 is U-shaped. The through slot 24 is not filled by the insulating body 1. An edge of the corresponding through hole 11 is separated from the through slot 24 (in other words, a partial area 220 of the conductive plate 22 connected to the through slot 24 is exposed in the corresponding through hole 11, and a partial area of the metal sheet 3 connected to the through slot 24 is exposed in the corresponding through hole 11), and the through slot 24 is exposed in the corresponding through hole 11. The conductive plate 22 has a plurality of upper bonding holes 220, and the metal sheet 3 has a plurality of lower bonding holes 30 corresponding to the upper bonding holes 220. The upper bonding holes 220 and the lower bonding holes 30 align vertically. The insulating body 1 is filled in the upper bonding holes 220 and the lower bonding holes 30. The upper bonding holes 220 and the cutting slot 23 are arranged at intervals along the front-rear direction.

Referring to FIG. 31 and FIG. 32, in the same terminal 21, the elastic arm 212 located at the front end of the base portion 211 and the rear end of the base portion 211 are exposed in different through holes 11. In the same lower terminals 4, the conductive portion 41 located at the front end of the main body portion 40 and the rear end of the main body portion 40 are exposed in different through holes 11. In two terminals 21 adjacent to each other in a front-rear direction, the rear end of the base portion 211 of the front terminal 21 and the rear end of the main body portion 40 of the front lower terminal 4, and the elastic arm 212 of the rear terminal 21 and the conductive portion 41 of the rear lower terminal 4 are exposed in a same through hole 11.

Referring to FIG. 31 and FIG. 32, the through slot 24 and the cutting slot 23 surrounding each signal terminal 21*a* are in communication, such that the signal terminals 21*a* are separated from each other, thus effectively preventing the signal terminals 21*a* from short-circuiting. The metal plate 2 forms four connecting portions 25 corresponding to each ground terminal 21*b*, and each connecting portion 25 is located between the through slot 24 and the cutting slot 23, such that the through slot 24 and the cutting slot 23 surrounding each ground terminal 21*b* are not in communication. Two of the connecting portions 25 are integrally connected to the front end of the base portion 211 of the corresponding ground terminal 21b, and the two connecting portions 25 are located at two opposite sides of the corresponding elastic arm 212 within the same through hole 11. The other two of the connecting portions 25 are integrally connected to the rear end of the base portion 211 of the corresponding ground terminal 21b, and are located in another same through hole 11. The two connecting portions 25 and the other two of the connecting portions 25 are located in two different through holes 11. Thus, the ground terminals 21b are connected together through the conductive plate 22.

Referring to FIG. 31 and FIG. 32, the through slot 24 and the cutting slot 23 surrounding each lower signal terminal 4a are in communication, such that the lower signal terminals 4a are separated from each other, thus effectively preventing the lower signal terminals 4a from short-circuiting. The other metal plate 2 forms four connecting portions 25 between the through slot 24 and the cutting slot 23 corresponding to each lower ground terminal 4b, such that the through slot 24 and the cutting slot 23 surrounding each lower ground terminal 4b are not in communication. Two of the connecting portions 25 are integrally connected to the front end of the main body portion 40 of the corresponding lower ground terminal 4b. The two connecting portions 25 are located at two opposite sides of the corresponding conductive portion 41, and are located in the same through hole 11. The other two of the connecting portions 25 are integrally connected to the rear end of the main body portion 40 of the corresponding lower ground terminal 4b, and are located in another same through hole 11. The two connecting portions 25 and the other two of the connecting portions 25 are located in two different through holes 11. Thus, the lower ground terminals 4b are connected together through the metal sheet 3.

The method of manufacturing the electrical connector according to the fifth embodiment of the present invention includes the following steps:

Step 1: referring to FIG. 27, two metal plates 2 are provided. A laser (not shown, same below) is used to cut a plurality of terminals 21 and a conductive plate 22 on one metal plate 2. For each terminal 21, after cutting the base portion 211, two cutting slots 23 are formed on the metal plate 2. After cutting the elastic arm 212, the through slot 24 is formed on the metal plate 2, and the through slot 24 is U-shaped. The metal plate 2 forms a plurality of connecting portions 25 integrally connecting the base portion 211 and the conductive plate 22, and each connecting portion 25 is located between one of the two cutting slots 23 and the through slot 24. The laser (not shown, same below) is used to cut a plurality of lower terminals 4 and a metal sheet 3 on the other metal plate 2. The shape of each lower terminal 4 being cut is identical to the shape of each terminal 21. The other metal plate 2 forms a plurality of connecting portions 25 integrally connecting the main body portion 40 and the metal sheet 3, and each connecting portion 25 of the other metal plate 2 is located between the cutting slot 23 and the through slot 24. Further, a plurality of upper bonding holes 220 are cut on the conductive plate 22, and a plurality of upper fixing holes 2111 are cut on the base portions 211. A plurality of lower bonding holes 30 are cut on the metal sheet 3, and a plurality of lower fixing holes 401 are cut on the main body portions 40. After cutting the elastic arm 212 and the conductive portion 41, the elastic arm 212 bends upward, and the conductive portion 41 bends downward.

Figure 28:
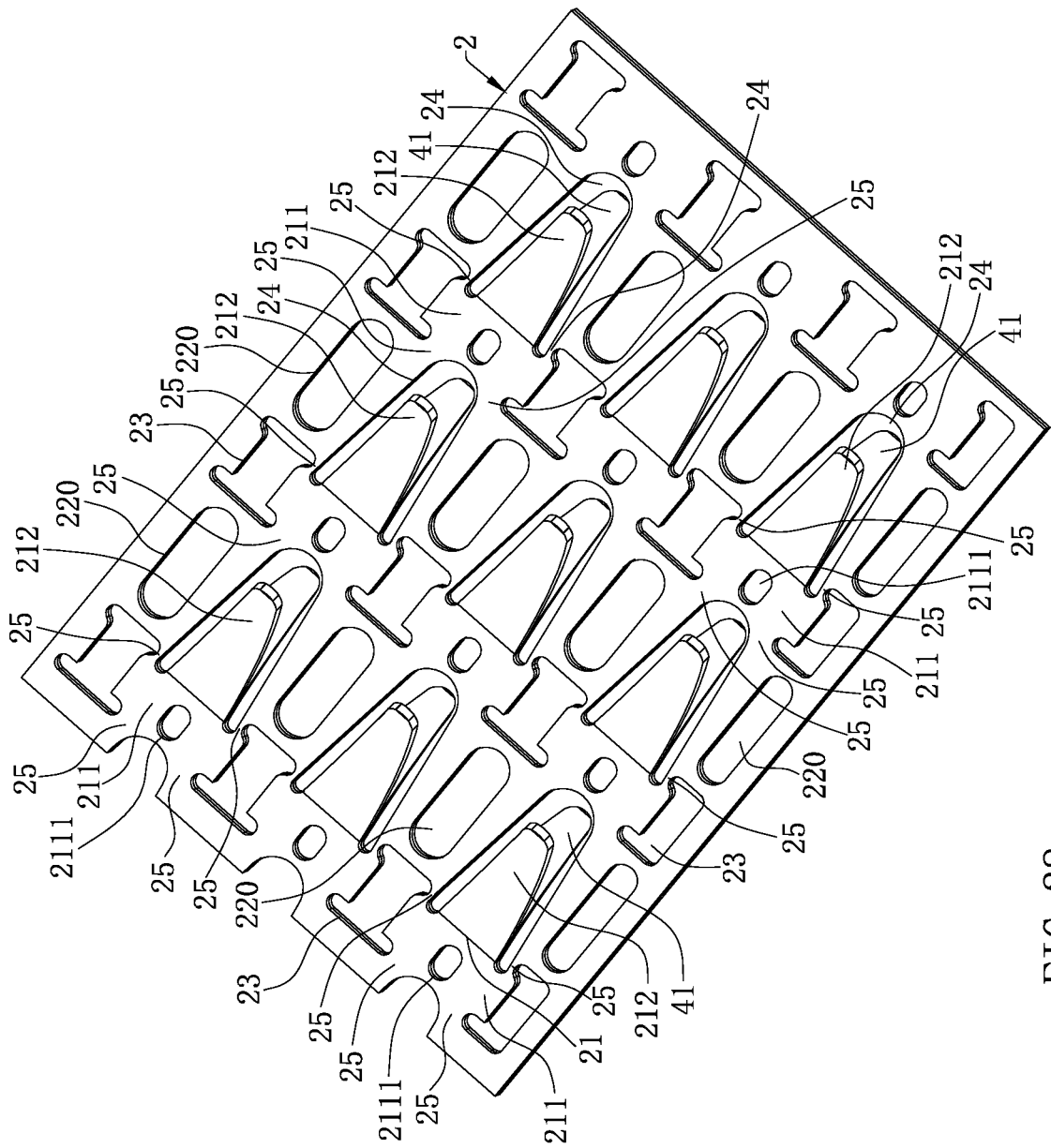
FIG. 28 is a schematic view of a step 2 of the method of manufacturing an electrical connector according to the fifth embodiment of the present invention.

Step 2: referring to FIG. 28, the two metal plates 2 cut in step 1 are fixed together by laser soldering, and a soldering position is provided between the base portion 211 and the main body portion 40 (or, in other embodiments, the two metal plates 2 may be fixed by other methods in other positions), such that the terminals 21 are provided to be symmetrical to the lower terminals 4. The connecting portions 25 connected to the conductive plate 22 and the connecting portions 25 connected to the metal plate 3 are aligned one-to-one in the vertical direction.

Figure 29:
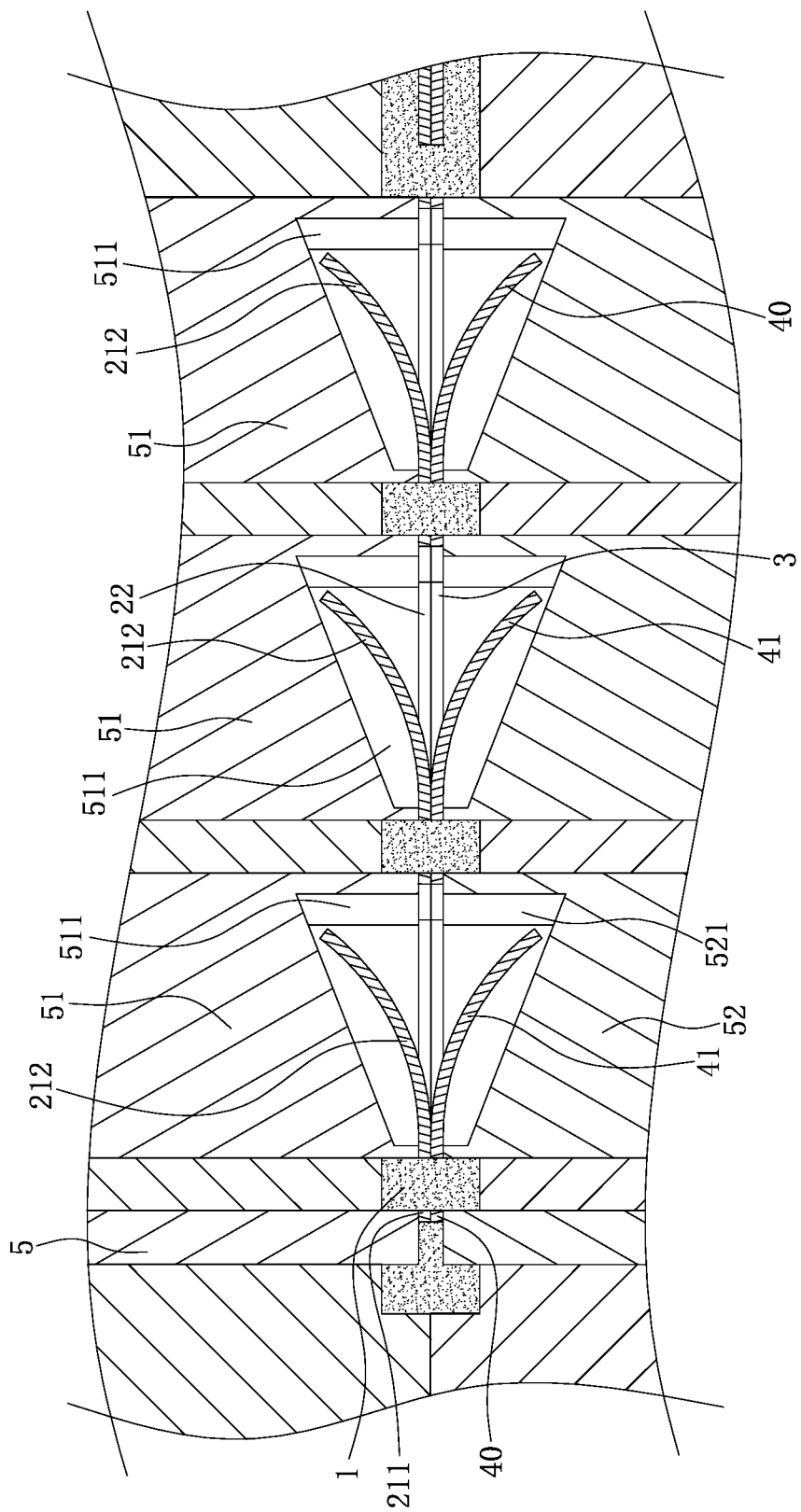
FIG. 29 is a schematic view of a step 3 of the method of manufacturing an electrical connector according to the fifth embodiment of the present invention.
Figure 30:
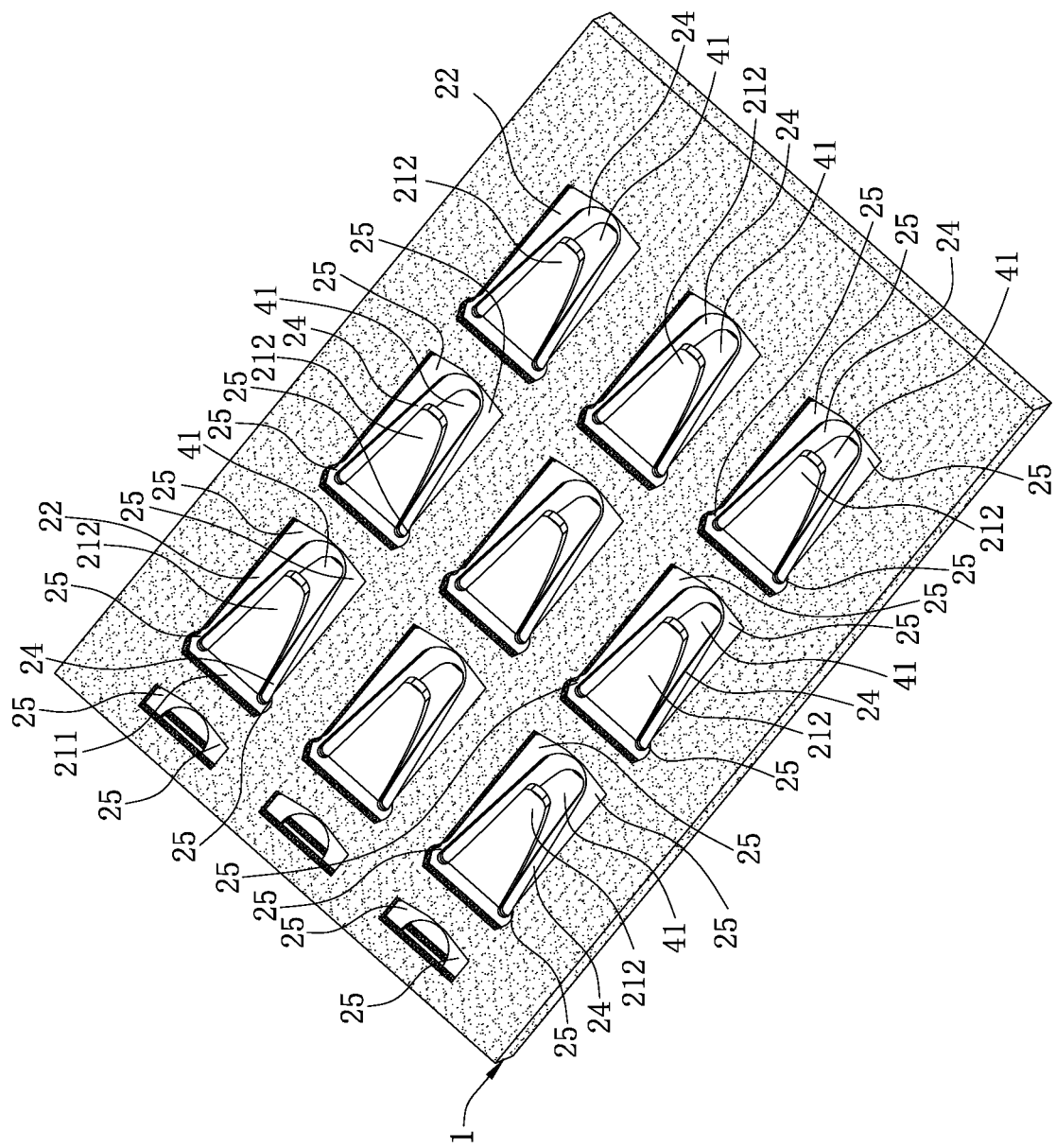
FIG. 30 and FIG. 31 are schematic views of a step 4 of the method of manufacturing an electrical connector according to the fifth embodiment of the present invention.

Step 3: referring to FIG. 29 and FIG. 30, a mold 5 is provided. The mold 5 is provided with a plurality of upper engaging members 51 and a plurality of lower engaging members 52. The conductive plate 22 and the metal sheet 3 fixed together are placed in the mold. Each of the upper engaging members 51 has an upper cavity 511, and each of the lower engaging members 52 has a lower cavity 521. Each elastic arm 212 is received in the upper cavity 511. The length and width of the elastic arm 212 are less than those of each upper cavity 511. The corresponding upper engaging member 51 receives the elastic arm 212 and also covers a portion of the cutting slot 23 and the connecting portion 25. Each conductive portion 41 is received in the lower cavity 521. The length and width of the conductive portion 41 are less than those of each lower cavity 521. The corresponding lower engaging member 52 receives the conductive portion 41 and also covers a portion of the cutting slot 23 and the connecting portion 25. Then, a plastic material is injected to the conductive plate 22 and the metal sheet 3, thereby forming the insulating body 1 on the two metal plates 2 by insert-molding. The insulating body 1 is filled in the upper bonding holes 220 and the lower bonding holes 30 and enters the cutting slot 23, and the insulating body 1 covers the base portion 211 and the main body portion 40 and fills the upper fixing holes 2111 and the lower fixing holes 401. The insulating body 1 is formed with the through holes 11. The elastic arm 212 and the conductive portion 41 are exposed in a corresponding through hole 11, and an area of each through hole 11 is greater than an area of the elastic arm 212 and a area of the conductive portion 41. Further, a portion of the cutting slot 23 and the connecting portion 25 are exposed in the corresponding through hole 11, and a portion of the cutting slot 23 are exposed in the corresponding accommodating hole 12, such that in the subsequent step of cutting the connecting portion 25, the connecting portion 25 and the extending portion 221 may be cut clean, thus preventing the signal terminals 21a and the lower signal terminals 4a from short-circuiting respectively.

Step 4: referring to FIG. 30 and FIG. 31, the laser is used to cut the connecting portion 25 integrally connected to each signal terminal 21a and each lower signal terminal 4a, such that the cutting slot 23 and the through slot 24 surrounding each signal terminal 21a are in communication, and the cutting slot 23 and the through slot 24 surrounding each lower signal terminal 4a are in communication, such that the signal terminals 21a are separated from each other, and the lower signal terminals 4a are separated from each other. In this embodiment, the connecting portions 25 connecting the conductive plate 22 with the signal terminals 21a and the connecting portions 25 connecting the metal plate 3 with the lower signal terminals 4a are cut simultaneously. The connecting portion 25 integrally connected to each ground terminal 21b and each lower ground terminal 4b are maintained, such that the cutting slot 23 and the through slot 24 surrounding each ground terminal 21b are not in communication, and the cutting slot 23 and the through slot 24 surrounding each lower ground terminal 4b are not in communication, thereby allowing the ground terminals 21b to be connected together through the connecting portion 25 and the lower ground terminals 4b to be connected together through the connecting portion 25.

Figure 33:
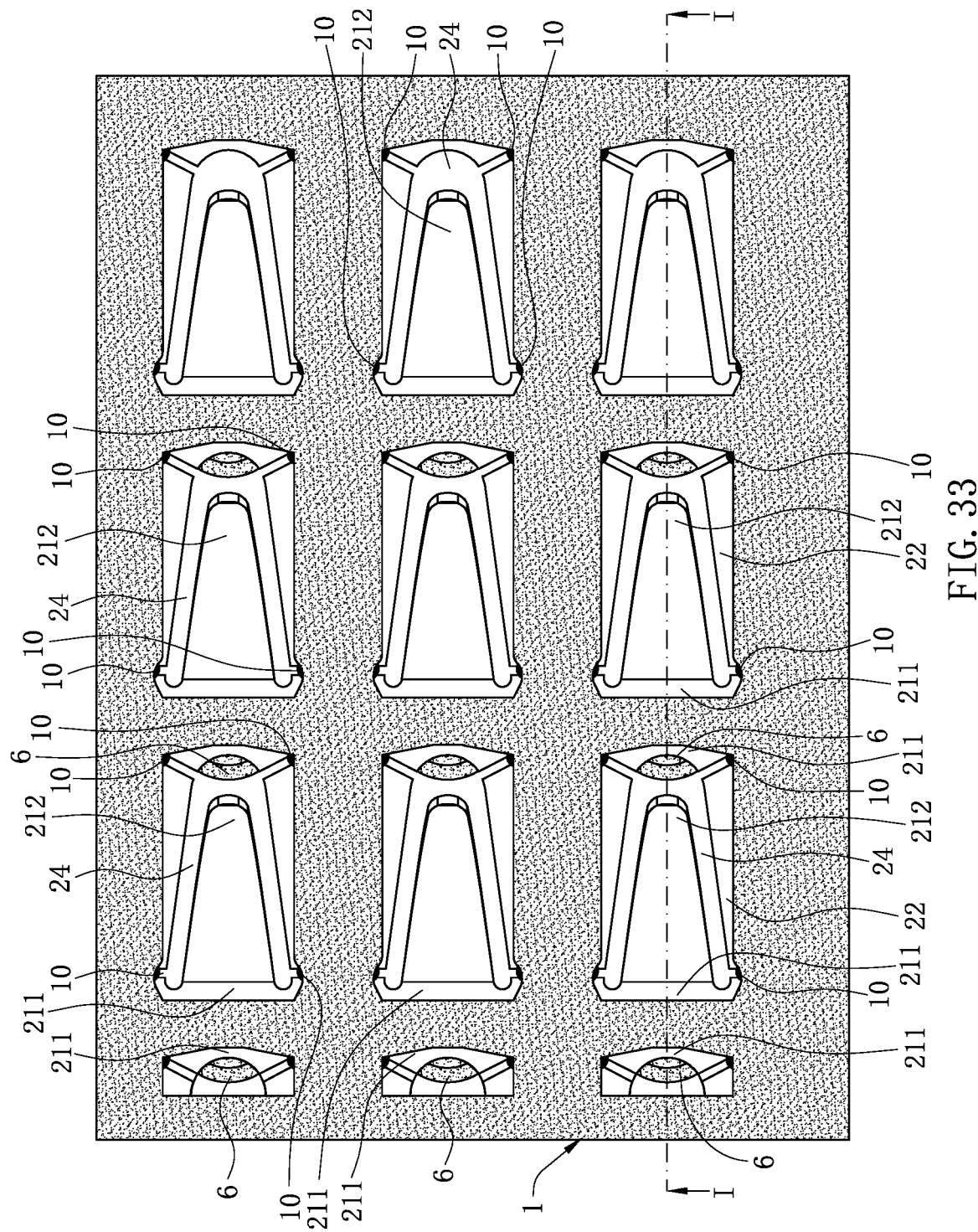
FIG. 33 is a top view of an electrical connector according to a sixth embodiment of the present invention.
Figure 34:
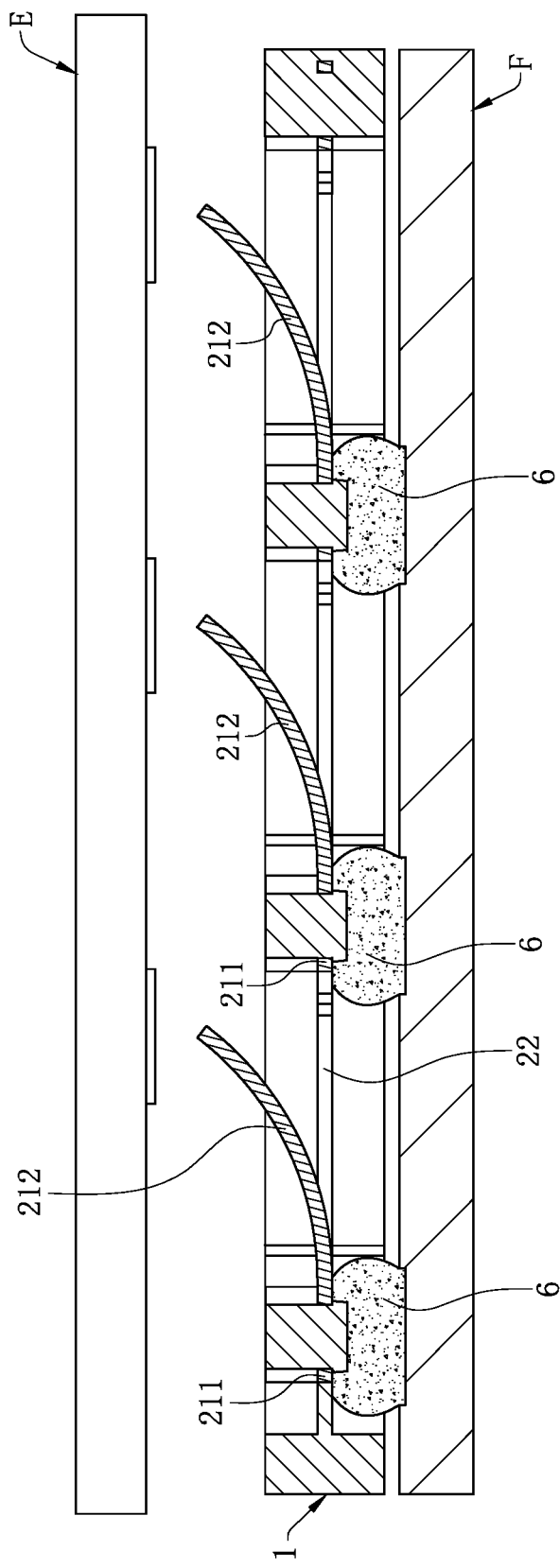
FIG. 34 is a sectional view along the I-I direction after the electrical connector in FIG. 33 is electrically connected with a second mating component.

FIG. 33 and FIG. 34 show an electrical connector according to a sixth embodiment of the present invention, which is mainly different from the fifth embodiment in that: the electrical connector is provided with the terminals 21 and the conductive plate 22, the lower terminals and the metal sheet are not provided, and the base portion 211 is soldered with the second mating component F through a solder 6 to form an electrical connection. A portion of the insulating body 1 below the base portion 211 is recessed upward relative to the bottom surface of the insulating body 1 to receive the solder 6. Other structures not mentioned of the sixth embodiment may be referred to in the fifth embodiment, and are thus not further elaborated hereinafter.

In sum, the electrical connector according to certain embodiments of the present invention has the following beneficial effects:

1. The connecting portions (or a portion of the cutting slot) and the elastic arm are exposed in a same through hole, which is conducive to the dense arrangement of the terminals. Further, during the insert-molding, a pair of the engaging members of the mold cover the upper and lower surfaces of the elastic arm and simultaneously cover the upper and lower surfaces of the connecting portions, and compared to the related art, the mold does not need to provide two pairs of the engaging members to cover the upper and lower surfaces and the elastic arm and the upper and lower surfaces of the connecting portions (in other words, a pair of the engaging members are removed from the mold to cover the upper and lower surfaces of the connecting portions), such that the forming of the electrical connector is simple. Moreover, a portion of the cutting slot is exposed in the corresponding through hole, such that it is clearly observable whether the connecting portions are cut clean, thus ensuring the connecting portions to be cut clean, and preventing the terminals from being connected together and short-circuiting.

2. The conductive portion is provided with a hole, and the hole runs through an upper surface and a lower surface of the conductive portion. When soldering, the solder P enters the upper surface of the conductive portion from the lower surface of the conductive portion through the hole, such that the solder P presses the upper surface of the conductive portion, thus preventing the conductive portion from warping when the first mating component presses downward on the elastic arm, and preventing from the ill contact between the conductive portion and the second mating component.

3. A distance between the one of the first side edges and the third side edge is greater than a distance between the one of the second side edges and the fourth side edge, such that the width of the base portion is reduced. The base portion is arranged side by side with the narrow portion of an adjacent terminal and is staggered from the wide portion of the adjacent terminal, thereby reducing the capacitive effect of the base portion.

4. Two protruding blocks protrude opposite to each other toward each recess from two sides of each recess, and the two protruding blocks abut the two opposite sides of each strip connecting portion. When the strip is removed, the damage caused by the acting force being applied may be absorbed by the two protruding blocks, which does not affect the overall structure of the insulating body, and is conducive to ensuring the completeness of the structure of the insulating body. Further, the strip connecting portions are located in the recesses, and each strip connecting portion does not pass beyond the outer side edge, thus preventing each strip connecting portion from being scratched by outer objects, and preventing each strip connecting portion from scratching and hurting working staffs.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, comprising:
an insulating body, provided with a plurality of through holes running vertically through the insulating body, wherein two protruding portions protrude toward each of the through holes from a side surface of each of the through holes; and
a plurality of terminals and a conductive plate, altogether formed by cutting from a metal plate, wherein the terminals are configured to electrically connect a first mating component located above the insulating body and a second mating component located below the insulating body, the insulating body, the terminals and the conductive plate are insert-molded, and the conductive plate is horizontally accommodated in the insulating body;
wherein each of the terminals has a base portion and an elastic arm integrally connected to the base portion, the elastic arm bends upward and is configured to be in contact with the first mating component, the two protruding portions are located at two opposite sides of the base portion, top surfaces of the two protruding portions and a top surface of the conductive plate are flush, and the base portion is at least partially horizontally provided to be coplanar to the conductive plate;
wherein at least one cutting slot is formed between the conductive plate and the base portion of each of the terminals by cutting the base portion of each of the terminals, and a through slot is formed between the conductive plate and the elastic arm of each of the terminals by cutting the elastic arm of each of the terminals;
wherein the elastic arm and the through slot are exposed in a corresponding one of the through holes, the insulating body covers a portion of the base portion, the cutting slot receives a part of the insulating body and the through slot is not filled by the insulating body, a portion of the cutting slot is exposed in the corresponding one of the through holes, and the portion of the cutting slot being exposed in the corresponding one of the through holes receives at least one of the protruding portions;
wherein the terminals comprise a plurality of signal terminals, and the through slot and the cutting slot corresponding to each of the signal terminals are in communication to each other.

2. The electrical connector according to claim 1, wherein two opposite side edges of the base portion along a width direction thereof are defined as first side edges, two opposite side edges of the elastic arm along a width direction thereof are defined as second side edges, a side edge of the cutting slot opposite to one of the first side edges is defined as a third side edge, a side edge of the through slot opposite to one of the second side edges is defined as a fourth side edge, and a distance between the one of the first side edges and the third side edge is greater than a distance between the one of the second side edges and the fourth side edge.

3. The electrical connector according to claim 2, wherein the elastic arm comprises a wide portion integrally connected to the base portion and a narrow portion integrally connected to the wide portion, the narrow portion is configured to be in upward contact with the first mating component, a width of the wide portion is greater than a width of the narrow portion, a width of the base portion is less than the width of the wide portion, and viewing downward from a top thereof, the third side edge passes outward beyond the fourth side edge along the width direction of the base portion, and the base portion is arranged side by side with the narrow portion of an adjacent terminal of the terminals and is staggered from the wide portion of the adjacent terminal.

4. The electrical connector according to claim 1, wherein each of the terminals comprises a conductive portion having elasticity, the conductive portion and the elastic arm are both formed by extending forward from a front end of the base portion, the conductive portion bends downward to be elastically in contact with the second mating component, a gap is formed between the elastic arm and the conductive portion of each of the terminals, a separation slot is formed between the conductive portion of each of the terminals and the conductive plate, and viewing downward from a top thereof, the elastic arm and the conductive portion are provided side by side, the gap is located in front of the protruding portions, and the two protruding portion is located at two opposite sides of the conductive portion and the elastic arm.

5. The electrical connector according to claim 4, wherein the cutting slot extends backward and passes beyond the through slot located therebehind.

6. The electrical connector according to claim 4, wherein the terminals further comprise a plurality of ground terminals, two cutting slots are formed between the conductive plate and the base portion of each of the ground terminals by cutting the base portion of each of the ground terminals, the metal plate is provided with a connecting portion, a first bridging portion, a second bridging portion and a third bridging portion corresponding to each of the ground terminals, the ground terminals include two adjacent ground terminals in a front-rear direction, the two adjacent ground terminals include a front ground terminal and a rear ground terminal, the connecting portion corresponding to the front ground terminal is formed between the through slot corresponding to the front ground terminal and one of the two cutting slots corresponding to the front ground terminal, the first bridging portion corresponding to the front ground terminal is connected to the conductive portion of the front ground terminal and is located between the separation slot corresponding to the front ground terminal and the other one of the two cutting slots corresponding to the front ground terminal, the second bridging portion corresponding to the front ground terminal is connected to a rear end of the base portion of the front ground terminal and is formed between the other one of the two cutting slots corresponding to the front ground terminal and the separation slot corresponding to the rear ground terminal, the third bridging portion corresponding to the front ground terminal is connected to the rear end of the base portion of the front ground terminal and is formed between the one of the two cutting slots corresponding to the front ground terminal and the through slot corresponding to the rear ground terminal, and for a same one of the ground terminals, the connecting portion and the third bridging portion are exposed in different ones of the through holes, and the first bridging portion and the second bridging portion are exposed in different ones of the through holes.

7. The electrical connector according to claim 1, wherein the terminals further comprise a plurality of ground terminals, the metal plate forms two connecting portions between the through slot and the at least one cutting slot corresponding to each of the ground terminals, such that the through slot and the cutting slot corresponding to each of the ground terminals are not in communication, the two connecting portions are integrally connected to a corresponding one of the ground terminals, and an edge of each of the through holes is separated from the through slot.

8. The electrical connector according to claim 1, wherein the through slot and the cutting slot are U-shaped and are provided opposite to each other.

9. The electrical connector according to claim 1, further comprising a metal sheet and a plurality of lower terminals, wherein the metal sheet is horizontally provided, the metal sheet is located below the conductive plate and is in contact with the conductive plate, each of the lower terminals has a main body portion and a conductive portion integrally connected to the main body portion, the conductive portion is downward exposed to the insulating body and is configured to abut or be soldered to the second mating component, the main body portion is at least partially horizontally provided to be coplanar with the metal sheet, the main body portion is located below the base portion and is in contact with the base portion, the conductive plate has a plurality of upper bonding holes, the metal sheet has a plurality of lower bonding holes, the upper bonding holes and the lower bonding holes align vertically, the insulating body, the metal sheet and the lower terminals are insert-molded, and the insulating body is filled in the upper bonding holes and the lower bonding holes.

10. An electrical connector, comprising:
an insulating body, provided with a plurality of through holes running vertically through the insulating body; and
a plurality of terminals and a conductive plate, altogether formed by cutting from a metal plate, wherein the terminals are configured to electrically connect a first mating component located above the insulating body and a second mating component located below the insulating body, the terminals comprise a plurality of signal terminals and a plurality of ground terminals, the insulating body, the terminals and the conductive plate are insert-molded, and the conductive plate is horizontally accommodated in the insulating body;
wherein each of the terminals has a base portion and an elastic arm integrally connected to the base portion, the elastic arm bends upward and is configured to be in contact with the first mating component, and the base portion is at least partially horizontally provided to be coplanar to the conductive plate;
wherein at least one cutting slot is formed between the conductive plate and the base portion of each of the terminals by cutting the base portion of each of the terminals, and a through slot is formed between the conductive plate and the elastic arm of each of the terminals by cutting the elastic arm of each of the terminals;

wherein the elastic arm and the through slot are exposed in a corresponding one of the through holes, the insulating body covers a portion of the base portion, the cutting slot receives a part of the insulating body and the through slot is not filled by the insulating body, and a portion of the cutting slot is exposed in the corresponding one of the through holes;

wherein the through slot and the at least one cutting slot corresponding to each of the signal terminals are in communication to each other, the metal plate forms at least one connecting portion between the through slot and the at least one cutting slot corresponding to each of the ground terminals, such that the through slot and the cutting slot corresponding to each of the ground terminals are not in communication, the at least one connecting portion is integrally connected to a corresponding one of the ground terminals, and the at least one connecting portion is exposed in the corresponding one of the through holes.

11. The electrical connector according to claim 10, wherein each of the connecting portions has a first cutting edge and a second cutting edge opposite to each other, the first cutting edge is connected to the cutting slot, the second cutting edge is connected to the through slot, and a width of the first cutting edge is less than a width of the second cutting edge.

12. The electrical connector according to claim 10, wherein the elastic arm comprises a wide portion integrally connected to the base portion and a narrow portion integrally connected to the wide portion, a width of the wide portion is greater than a width of the narrow portion, and viewing downward from a top thereof, along a width direction of the base portion, the connecting portions are arranged side by side with the narrow portion of an adjacent terminal of the terminals.

13. The electrical connector according to claim 10, further comprising a metal sheet and a plurality of lower terminals, wherein the metal sheet is located below the conductive plate and is in contact with the conductive plate, each of the lower terminals has a main body portion and a conductive portion integrally connected to the main body portion, the conductive portion is downward exposed to the insulating body and is configured to abut or be soldered to the second mating component, the main body portion is located below the base portion and is in contact with the base portion, the conductive plate has a plurality of upper bonding holes, the metal sheet has a plurality of lower bonding holes, the upper bonding holes and the lower bonding holes align vertically, the insulating body, the metal sheet and the lower terminals are insert-molded, the insulating body is filled in the upper bonding holes and the lower bonding holes, the lower terminals comprise a plurality of lower signal terminals and a plurality of lower ground terminals, and the metal sheet is integrally connected to the lower ground terminals and is separated from the lower signal terminals.

14. The electrical connector according to claim 10, wherein each of the terminals comprises a conductive portion having elasticity, the conductive portion and the elastic arm are both formed by extending forward from a front end of the base portion, the conductive portion bends downward to be elastically in contact with the second mating component, a gap is formed between the elastic arm and the conductive portion of each of the terminals, a separation slot is formed between the conductive portion of each of the terminals and the conductive plate, and viewing downward from a top thereof, the elastic arm and the conductive portion are provided side by side, and the gap is located in front of the portion of the cutting slot being exposed in the corresponding one of the through holes.

15. The electrical connector according to claim 14, wherein two cutting slots are formed between the conductive plate and the base portion of each of the ground terminals by cutting the base portion of each of the ground terminals, the metal plate is provided with a first bridging portion, a second bridging portion and a third bridging portion corresponding to each of the ground terminals, the ground terminals include two adjacent ground terminals in a front-rear direction, the two adjacent ground terminals include a front ground terminal and a rear ground terminal, the first bridging portion corresponding to the front ground terminal is connected to the front ground terminal and is located between the separation slot corresponding to the front ground terminal and one of the two cutting slots corresponding to the front ground terminal, the second bridging portion corresponding to the front ground terminal is connected to a rear end of the base portion of the front ground terminal and is formed between the one of the two cutting slots corresponding to the front ground terminal and the separation slot corresponding to the rear ground terminal, the third bridging portion corresponding to the front ground terminal is connected to the rear end of the base portion of the front ground terminal and is formed between the other one of the two cutting slots corresponding to the front ground terminal and the through slot corresponding to the rear ground terminal, the connecting portion corresponding to the front ground terminal is formed between the other one of the two cutting slots corresponding to the front ground terminal and the through slot corresponding to the front ground terminal, and for a same one of the ground terminals, the connecting portion and the third bridging portion are exposed in different ones of the through holes, and the first bridging portion and the second bridging portion are exposed in different ones of the through holes.

16. The electrical connector according to claim 15, wherein the ground terminals include two adjacent ground terminals in a front-rear direction, the two adjacent ground terminals include a front ground terminal and a rear ground terminal, the connecting portion and the first bridging portion corresponding to the rear ground terminal and the second bridging portion and the third bridging portion corresponding to the front ground terminal are exposed in a same one of the through holes.

17. The electrical connector according to claim 15, wherein each of the two cutting slots corresponding to the front ground terminal passes backward beyond a front end of the adjacent through slot corresponding to the rear ground terminal.

18. The electrical connector according to claim 10, wherein the insulating body is provided with an accommodating slot running downward through the insulating body, the base portion is flat plate shaped, the base portion has a conductive portion located right above a corresponding one of the accommodating slots, the conductive portion is soldered to the second mating component through a solder, the solder is accommodated in the accommodating slot, the conductive portion is provided with a hole, the hole runs through an upper surface and a lower surface of the conductive portion, and when soldering, the solder reaches the upper surface of the conductive portion from the lower surface of the conductive portion through the hole.

19. The electrical connector according to claim 10, wherein the terminals include two adjacent terminals in a front-rear direction, the two adjacent terminals include a front terminal and a rear terminal, the rear end of the base portion of the front terminal and the elastic arm of the rear terminal are exposed in a same one of the through holes.

20. The electrical connector according to claim 19, wherein the base portion is used as a soldering portion to be soldered and electrically connected with the second mating component through a solder.

21. The electrical connector according to claim 19, further comprising a plurality of lower terminals, wherein the lower terminals are arranged one-to-one corresponding to the terminals and located below the terminals, each of the lower terminals includes a main body portion and a conductive portion integrally connected to the main body portion, the main body portion of each of the lower terminals and the base portion of a corresponding one of the terminals are fixed and electrically connected with each other, the conductive portion of each of the lower terminals is exposed downward in one of the through holes to be electrically connected with the second mating component.

22. The electrical connector according to claim 21, further comprising a metal sheet, wherein the metal sheet and the main body portion of each of the lower terminals are flat plate shaped and coplanar with each other, and the terminals and the corresponding lower terminals are arranged symmetrically in a vertical direction.

23. The electrical connector according to claim 21, wherein the base portion of each of the terminals is provided with an upper fixing hole running therethrough in the vertical direction, the main body portion of each of the lower terminals is provided with a lower fixing hole running therethrough in the vertical direction, the upper fixing hole of each of the terminals is aligned with the lower fixing hole of a corresponding one of the lower terminals, and the upper fixing hole of each of the terminals and the lower fixing hole of each of the lower terminals are filled by the insulating body.

24. The electrical connector according to claim 21, wherein the main body portion of each of the lower terminals and the base portion of the corresponding one of the terminals are fixed together by laser soldering, solder welding, or a conductive adhesive.

* * * * *